(12) United States Patent
Nakagawa et al.

(10) Patent No.: US 8,318,599 B2
(45) Date of Patent: Nov. 27, 2012

(54) RESIN LAYER FORMATION METHOD AND SEMICONDUCTOR DEVICE FABRICATION METHOD

(75) Inventors: Kanae Nakagawa, Kawasaki (JP); Motoaki Tani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 145 days.

(21) Appl. No.: 11/442,405

(22) Filed: May 30, 2006

(65) Prior Publication Data

US 2007/0194412 A1 Aug. 23, 2007

(30) Foreign Application Priority Data

Feb. 21, 2006 (JP) .................................. 2006-044128

(51) Int. Cl.
*H01L 23/538* (2006.01)
*H01L 33/52* (2010.01)

(52) U.S. Cl. ........ 438/631; 438/626; 438/127; 438/633; 257/788; 257/E21.576; 257/E21.577

(58) Field of Classification Search .................... 438/15, 438/26, 51, 55, 64, 106, 124–127, 629, 630, 438/637–640, 668, 672, 675, 598–599, 622, 438/626, 631, 633, 645, 760; 257/678–733, 257/787–796, E23.001–E23.194, 621, 774, 257/E23.169–E23.178, E21.575–E21.597, 257/E21.627, E21.641, E21.576, E21.577
See application file for complete search history.

(56) References Cited

U.S. PATENT DOCUMENTS

| 6,428,393 | B1 * | 8/2002 | Yukawa et al. ............... 451/41 |
| 7,049,229 | B2 | 5/2006 | Omote et al. |
| 7,863,524 | B2 * | 1/2011 | Shioga et al. ............... 174/260 |
| 2002/0000658 | A1 * | 1/2002 | Kuwabara et al. ........... 257/737 |
| 2002/0038912 | A1 * | 4/2002 | Miyagawa ................... 257/782 |
| 2004/0099937 | A1 * | 5/2004 | Ohuchi et al. ............... 257/684 |
| 2004/0266139 | A1 * | 12/2004 | Shibata ....................... 438/465 |
| 2005/0006765 | A1 * | 1/2005 | Kurosawa .................... 257/735 |

(Continued)

FOREIGN PATENT DOCUMENTS

JP 2003-78006 A 3/2003

(Continued)

OTHER PUBLICATIONS

Japanese Notification of Reasons for Refusal, Partial English-language translation, mailed Jan. 11, 2011 for corresponding Japanese Application No. 2006-044128.

*Primary Examiner* — Matthew Landau
*Assistant Examiner* — Maliheh Malek
(74) *Attorney, Agent, or Firm* — Fujitsu Patent Center

(57) ABSTRACT

The resin layer formation method comprises the step of forming on a substrate 10 a resin layer 34 for containing a substance for decreasing the thermal expansion coefficient to thereby forming a resin layer 34 having said substance localized in the side thereof nearer to the substrate 10; and the step of cutting the surface of the resin layer 34 with a cutting tool 40 to planarize the surface of the resin layer 34. The resin layer 34 as said substance for decreasing the thermal expansion coefficient localized in the side thereof nearer to the substrate 10, and the surface of the resin layer 34 is cut to planarize the surface of the resin layer 34, whereby the extreme abrasion and breakage of the cutting tool 40 by said substance for decreasing the thermal expansion coefficient can be prevented.

16 Claims, 44 Drawing Sheets

U.S. PATENT DOCUMENTS

| | | | |
|---|---|---|---|
| 2006/0046436 A1* | 3/2006 | Ohuchi et al. | 438/460 |
| 2006/0051900 A1* | 3/2006 | Shizuno | 438/124 |
| 2006/0197184 A1* | 9/2006 | Oi et al. | 257/532 |
| 2006/0231942 A1* | 10/2006 | Nagasaki | 257/690 |
| 2007/0090546 A1* | 4/2007 | Shioga et al. | 257/790 |
| 2008/0169542 A1* | 7/2008 | Suzuki et al. | 257/684 |
| 2011/0056068 A1* | 3/2011 | Shioga et al. | 29/592.1 |

FOREIGN PATENT DOCUMENTS

| | | |
|---|---|---|
| JP | 2005-12098 | 1/2005 |
| JP | 2005-64451 A | 3/2005 |
| JP | 2005-093963 A | 4/2005 |

* cited by examiner

RESIN LAYER FORMATION METHOD AND SEMICONDUCTOR DEVICE FABRICATION METHOD

CROSS-REFERENCE TO RELATED APPLICATION

This application is based upon and claims priority of Japanese Patent Application No. 2006-44128, filed on Feb. 21, 2006, the contents being incorporated herein by reference.

BACKGROUND OF THE INVENTION

The present invention relates to a resin layer formation method, a semiconductor device and semiconductor device fabrication method.

For the large integration and large density of semiconductor devices, etc., it is advantageous to form multilayer interconnections.

However, when a multilayer interconnection structure is formed by simply laying interconnections and insulation layers (inter-layer insulation films), large steps, i.e., large concavities and convexities are formed in the surfaces of the insulation layers.

It is difficult to micronized interconnections at a small pitch on insulation layer having large steps. Accordingly, it is very important to planarize the surfaces of the insulation layers.

As a technique for planarizing the surface of an insulation layer, CMP (Chemical Mechanical Polishing) is widely known.

However, the planarization by CMP causes relatively large costs. When a thickness to be polished is as relatively large as several micrometers, the planarization takes long time.

As a technique for planarizing the surface of an insulation layer, grinding with a grinding wheel is also known.

However, in grinding with a grinding wheel, when the material of an insulation layer is a resin, the resin stays on the surface of the grinding wheel and clogs. The grinding with a grinding wheel is thus unsuitable to planarize a resin layer. In grinding with a grinding wheel roughness of the micron order is caused in the surface of a ground insulation layer. When electrodes and an insulation layer are ground with a grinding wheel, fins are often formed on the surface of the ground electrodes, or the insulating material often stay on the surface of the electrodes.

On the other hand, a technique for forming a resin layer on a substrate and cutting the surface of the resin layer with a cutting tool is proposed (see Patent Reference 1). In the cutting with a cutting tool, a resin layer of a several micrometers-thickness can be cut once, and even when a relatively large thickness is cut, the planarization can be done in a relatively short period of time.

Following references disclose the background art of the present invention.

[Patent Reference 1]
Specification of Japanese Patent Application Unexamined Publication No. 2005-12098

However, when a resin layer containing a filler (substance) of an inorganic material, such as silica or others, is cut with a cutting tool of diamond or others, the filler contained in the resin layer rapidly abrades or breaks the tip of the cutting tool. When a resin layer and electrodes are cut with a cutting tool having the tip abraded or broken, fins are formed in the cut electrodes, the resin stays on the surfaces of the electrodes, or the surface of the resin layer and the surfaces of the electrodes are damaged.

SUMMARY OF THE INVENTION

An object of the present invention is to provide a resin layer formation method which can suppress abrasion and breakage of a cutting tool, a semiconductor device using the resin layer formation method, and semiconductor device fabrication method.

According to one aspect of the present invention, there is provided a resin layer formation method comprising the step of: forming over a substrate a resin layer containing a substance for decreasing the thermal expansion coefficient, the resin layer having said substance localized in the side thereof nearer to the substrate; and cutting the surface of the resin layer with a cutting tool to planarize the surface of the resin layer.

According to another aspect of the present invention, there is provided a semiconductor device comprising: a resin layer formed over a substrate and containing a substance for decreasing the thermal expansion coefficient, said substance being localized in the side thereof nearer to the substrate, and the surface of the resin layer being planarized.

According to further another aspect of the present invention, there is provided a semiconductor device fabrication method comprising the steps of: forming over a substrate a resin layer containing a substance for decreasing the thermal expansion coefficient, the resin layer having said substance localized in the side thereof nearer to the substrate, and cutting the surface of the resin layer with a cutting tool to planarize the surface of the resin layer.

According to the present invention, a resin layer having a substance for decreasing the thermal expansion coefficient localized in the side thereof nearer to the substrate, and the surface of the resin layer is cut to be planarized, whereby the cutting tool is prevented from being abraded or broken by said substance for decreasing the thermal expansion coefficient. Thus, according to the present invention, the resin layer can be planarized while the abrasion and breakage of the cutting tool are suppressed, and consequently, semiconductor devices, etc. can be fabricated at small costs.

DETAILED DESCRIPTION OF THE INVENTION

A First Embodiment

Figure 1:
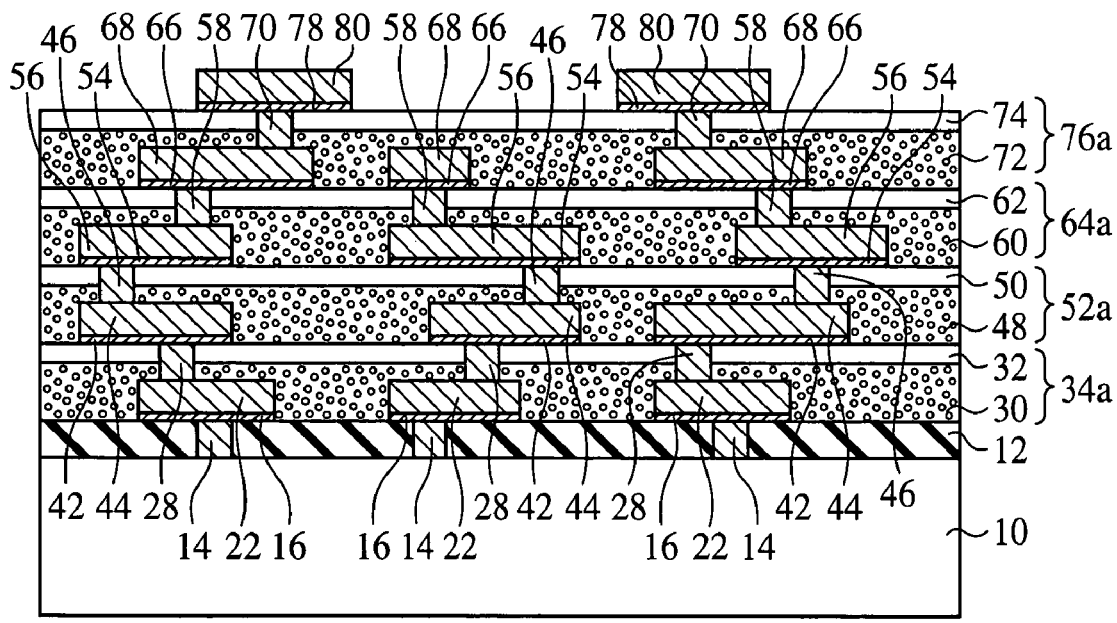
FIG. 1 is a sectional view of the semiconductor device according to a first embodiment of the present invention.

The resin layer formation method according to a first embodiment of the present invention, the semiconductor device using the resin layer formation method, and the semiconductor device fabrication method will be explained with reference to FIGS. 1 to 14B. FIG. 1 is a sectional view of the semiconductor device according to the present embodiment.

(The Semiconductor Device)

First, the semiconductor device according to the present embodiment will be explained with reference to FIG. 1.

The semiconductor substrate 10 is, e.g., a silicon wafer. A logic circuit including active elements (not illustrated), such as transistors, etc. and/or passive elements (not illustrated), such as capacitor elements, etc., and/or a memory circuit, etc. (not illustrated) are formed on the semiconductor substrate 10. On such semiconductor substrate 10, inter-layer insulation films 12 of, e.g., silicon oxide film are formed. The inter-layer insulation films 12 are formed by, e.g., CVD. A plurality of layers of the inter-layer insulation films 12 are formed on the semiconductor substrate 10, but in FIG. 1, one of the plurality of layers is illustrated. Conductor plugs 14 are buried in the inter-layer insulation film 12. The conductor plugs 14 are electrically connected to the logic circuit, memory elements, etc. described above.

On the inter-layer insulation film 12, a plurality of interconnections 22 of, e.g., Cu are formed. Under the interconnections 22, a seed layer 16 used in forming the interconnections 22, etc. by electroplating is present. The seed layer 16 is formed of, e.g., a 80 nm-thickness Cr film and, e.g. and a 300 nm-thickness Cu film sequentially laid on each other. The interconnections 22 are electrically connected to the conductor plugs 14.

Conductor plugs 28 of, e.g., Cu are formed on the interconnections 22.

On the inter-layer insulation film 12, a resin layer (inter-layer insulation film) 34a is formed, burying the interconnections 22 and the conductor plugs 28. The resin layer 34a is formed of a first layer 30 containing a filler (substance) for decreasing the thermal expansion coefficient, and a second layer 32 formed on the first layer 30 and containing no such filler. In other words, the resin layer 34a containing the filler for decreasing the thermal expansion coefficient localized in the side nearer to the semiconductor substrate 10 is formed. The filler for decreasing the thermal expansion coefficient is, e.g., an inorganic material, e.g., silica (oxidized silicon) or others. The average particle diameter of the filler is, e.g., about 1 μm. The content ratio of the filler in the first layer 30 is, e.g., about 60 wt %. The base of the first layer 30 is, e.g., epoxy resin. The second layer 32 is, e.g., epoxy resin.

The first layer 30 of the resin layer 34a contains a filler so as to make the difference in the thermal expansion coefficient between the resin layer 34 and the semiconductor substrate 10 small. That is, the thermal expansion coefficient of the silicon used as the material of the semiconductor substrate 10 is 2-3 ppm/° C. In contrast to this, the thermal expansion coefficient of epoxy resin is 45-65 ppm. Accordingly, when a resin layer is formed simply on the semiconductor substrate 10, the thermal processing, etc. for curing the resin layer applies excessive stresses to the semiconductor substrate 10, etc. due to the difference in the thermal expansion coefficient between the semiconductor substrate 10 and the resin layer. On the other hand, the thermal expansion coefficient of the filler of an inorganic material, such as silica or others, is 0.4-0.55 ppm/° C. In the present embodiment, because of the filler of a relatively small thermal expansion coefficient contained in the first layer 30, the difference in the thermal expansion coefficient between the first layer 30 and the semiconductor substrate 10 can be made small. Consequently, in the thermal processing, etc. for the cure, etc. of the resin layer 34 formed of a resin film 33, the stresses exerted on the semiconductor substrate 10, etc. due to the difference in the thermal expansion coefficient between the semiconductor substrate 10 and the resin layer 34 can be made small.

The surface of the resin layer 34a and the surfaces of the conductor plugs 28 are cut with a cutting tool 40 (see FIGS. 5A and 5B) of diamond or others, as will be described later. The surfaces of the conductor plug 28 and the surface of the resin layer 34a cut with the cutting tool 40 of diamond or others are flat.

On the planarized resin layer 34a, a plurality of interconnections 44 of, e.g., Cu are formed. On the undersides of the interconnections 44, a seed layer 42 used in forming the interconnections 44, etc. by electroplating is present. The seed layer 42 is formed of, a Cr film and a Cu film sequentially laid one on another. The interconnections 44 are electrically connected to conductor plugs 28.

On the interconnections 44, conductor plugs 46 of, e.g., Cu are formed.

On the resin layer 34a, a resin layer (inter-layer insulation film) 52a is formed, burying the interconnections 44 and the conductor plugs 46. The resin layer 52a is formed of a first layer 48 containing a filler of an inorganic material, and a second layer 50 formed on the first layer 48 and containing no filler of an inorganic material. The material of the filler is, e.g., silica. The average particle diameter of the filler is, e.g., about 1 μm. The content ratio of the filler in the first layer 48 is, e.g., about 60 wt %. The base of the first layer 48 is, e.g., epoxy resin. The material of the second layer 50 is, e.g., epoxy resin.

The surface of the resin layer 52a and the surfaces of the conductor plugs 46 are cut with a cutting tool 40 (see FIGS. 8A and 8B) of diamond or others, as will be described later. The surfaces of the conductor plugs 46 and the surface of the resin layer 52a cut with the cutting tool 40 are flat.

On the planarized resin layer 52a, a plurality of interconnections 56 of, e.g., Cu are formed. On the undersides of the interconnections 56, a seed layer 54 used in forming the interconnections 56, etc. by electroplating is present. The seed layer 54 is formed of, a Cr film and a Cu film sequentially laid one on another. The interconnections 56 are electrically connected to conductor plugs 46.

On the interconnections 56, conductor plugs 58 of, e.g., Cu are formed.

On the resin layer 52a, a resin layer 64a is formed, burying the interconnections 56 and the conductor plugs 58. The resin layer 64a is formed of a first layer 60 containing a filler of an inorganic material, and a second layer 62 formed on the first layer 60 and containing no filler of an inorganic material. The material of the filler is, e.g., silica. The average particle diameter of the filler is, e.g., about 1 µm. The content ratio of the filler in the first layer 60 is, e.g., about 60 wt %. The base of the first layer 60 is, e.g., epoxy resin. The material of the second layer 62 is, e.g., epoxy resin.

The surface of the resin layer 64a and the surfaces of the conductor plugs 58 are cut with a cutting tool 40 (see FIG. 11A) of diamond or others, as will be described alter. The surfaces of the conductor plug 58 and the surface of the resin layer 64a cut with the cutting tool 40 of diamond or others are flat.

On the planarized resin layer 64a, a plurality of interconnections 68 of, e.g., Cu are formed. On the undersides of the interconnections 68, a seed layer 66 used in forming the interconnections 68, etc. by electroplating is present. The seed layer 66 is formed of, a Cr film and a Cu film sequentially laid one on another. The interconnections 68 are electrically connected to conductor plugs 58.

On the interconnections 68, conductor plugs 70 of, e.g., Cu are formed.

On the resin layer 64a, a resin layer (inter-layer insulation film) 76a is formed, burying the interconnections 68 and the conductor plugs 70. The resin layer 76a is formed of a first layer 72 containing a filler of an inorganic material, and a second layer 74 formed on the first layer 72 and containing no filler of an inorganic material. The material of the filler is, e.g., silica. The average particle diameter of the filler is, e.g., about 1 µm. The content ratio of the filler in the resin layer 72 is, e.g., about 60 wt %. The base of the resin layer 72 is, e.g., epoxy resin. The material of the resin layer 74 is, e.g., epoxy resin.

The surface of the resin layer 76a and the surfaces of the conductor plugs 70 are cut with a cutting tool 40 (see FIG. 13B) of diamond or others, as will be described alter. The surfaces of the conductor plug 70 and the surface of the resin layer 76a cut with the cutting tool 40 of diamond or others are flat.

On the planarized resin layer 76a, a plurality of electrodes 80 of, e.g., Al, Au or others are formed. The electrodes 80 can function as, e.g., bonding pads. On the undersides of the electrodes 80, a seed layer 78 used in forming the interconnections 80 by electroplating. The seed layer 78 is formed of, a Cr film and a Cu film sequentially laid one on another. The interconnections 80 are electrically connected to the conductor plugs 70.

Thus, the semiconductor device having the multilayer interconnection structure of a plurality of resin layers 34a, 52a, 64a, 76a and a plurality of interconnection layers 22, 44, 56, 68 is fabricated.

The semiconductor device according to the present embodiment is characterized mainly in that the resin layer of the first layer containing the filler of an inorganic material and the second layer containing no such filler is formed, and the surface of the resin layer is cut with a cutting tool, whereby the surface of the resin layer is planarized.

According to the present embodiment, the first layer containing a filler of an inorganic material is not cut, but the second layer containing no filler of an inorganic material is cut so as to planarize the surface of the resin layer, whereby the cutting tool is prevented from being extremely abraded or broken by the filler of an inorganic material. Consequently, according to the present embodiment, the abrasion and breakage of the cutting tool are suppressed while the resin layer can be planarized, and consequently, the semiconductor device, etc. can be fabricated at low costs.

(The Resin Layer Formation Method and the Semiconductor Device Fabrication Method)

Next, the resin layer formation method according to the present embodiment and the semiconductor device fabrication method using the resin layer formation method will be explained with reference to FIGS. 2A to 14B. FIGS. 2A to 14B are views of the semiconductor device in the steps of the resin layer formation method and the semiconductor device fabrication method. FIGS. 2A to 4C, FIGS. 5B to 7B and FIGS. 8B to 14B are sectional views. FIGS. 5A and 8A are perspective views.

Figure 2A:
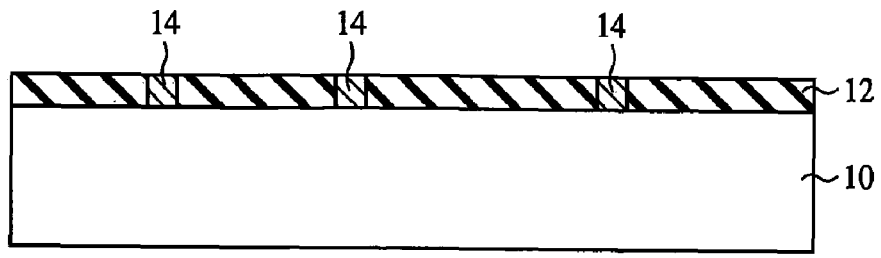
FIGS. 2A to 2D are views of the semiconductor device in the steps of the resin layer formation method and semiconductor device fabrication method according to the first embodiment of the present invention (Part 1).

First, as illustrated in FIG. 2A, the semiconductor substrate 10 is prepared. The semiconductor substrate 10 is, e.g., a silicon wafer. A logic circuit including active elements (not illustrated), such as transistors, etc. and/or passive elements (not illustrated), such as capacitor devices, etc., and/or a memory circuit, etc. (not illustrated) are formed on the semiconductor substrate 10. On such semiconductor substrate 10, inter-layer insulation films 12 of, e.g., silicon oxide film are formed. The inter-layer insulation films 12 are formed by, e.g., CVD. A plurality of layers of the inter-layer insulation films 12 are formed on the semiconductor substrate 10, but in FIG. 2A, one of the plurality of layers is illustrated. Conductor plugs 14 are buried in the inter-layer insulation film 12. The conductor plugs 14 are electrically connected to the logic circuit, memory elements, etc. described above.

Figure 2B:
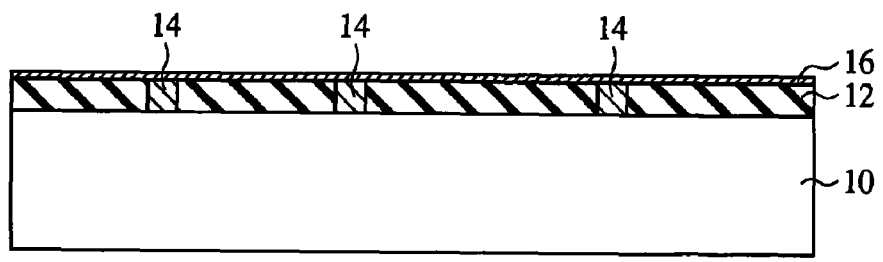

Next, as illustrated in FIG. 2B, a 80 nm-thickness Cr film and, e.g., a 300 nm-thickness Cu film are sequentially formed on the entire surface by, e.g., sputtering one on another. Thus, the seed layer 16 is formed of the Cr film and the Cu film.

Figure 2C:
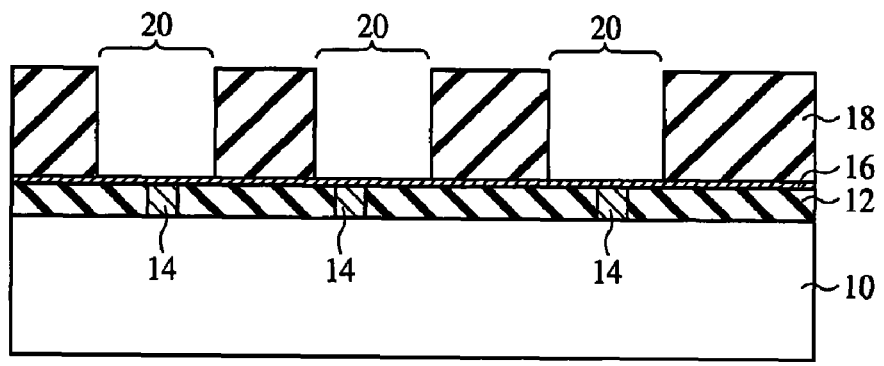

Next, as illustrated in FIG. 2C, a photoresist film 18 is formed on the entire surface by spin coating.

Next, openings 20 are formed in the photoresist film 18 down to the seed layer 16 by photolithography. The openings 20 are for forming the interconnections (see FIG. 2D).

Figure 2D:
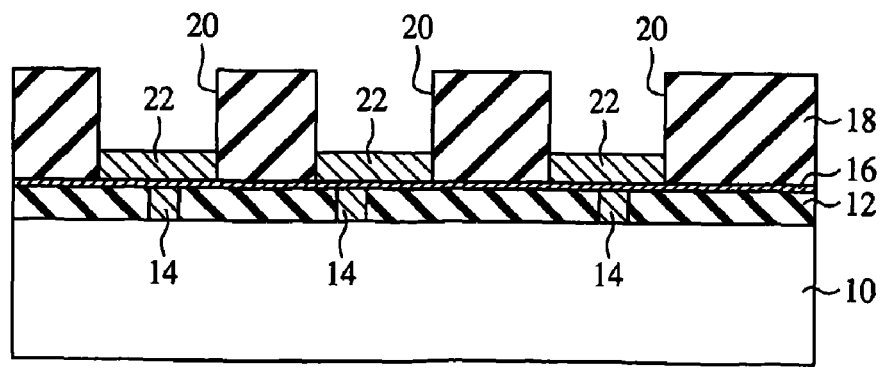

Next, as illustrated in FIG. 2D, the interconnections 22 of Cu are formed in the openings 20 by electroplating. The height of the interconnections 22 (the height from the surface of the inter-layer insulation film 12) is, e.g., about 5 µm. Then, the photoresist film 18 is released (see FIG. 3A).

Figure 3A:
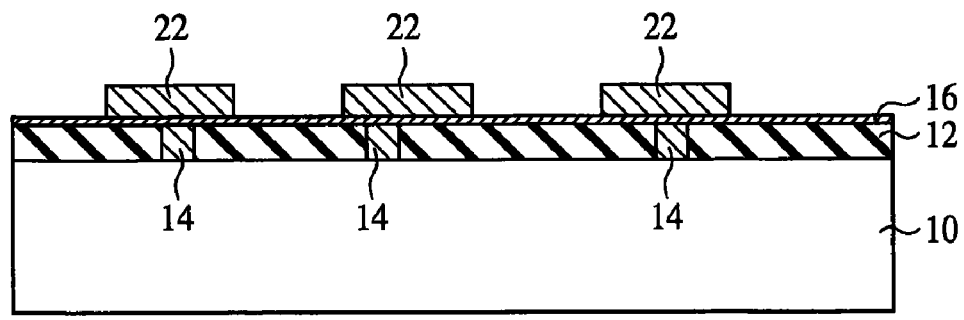
FIGS. 3A to 3C are views of the semiconductor device in the steps of the resin layer formation method and semiconductor device fabrication method according to the first embodiment of the present invention (Part 2).
Figure 3B:
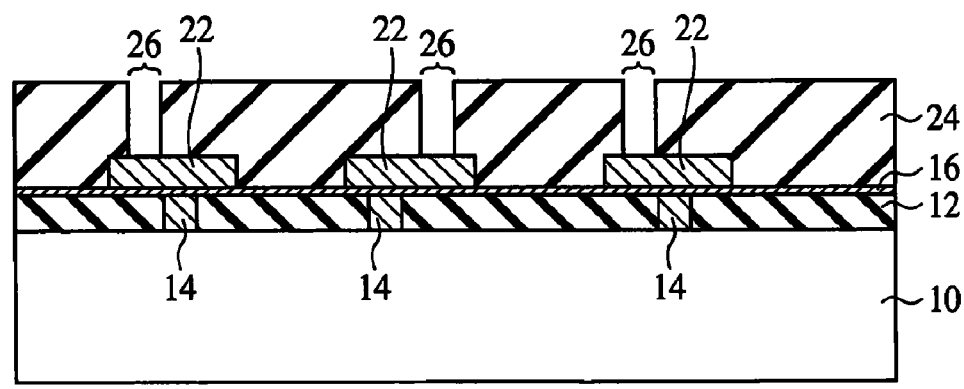

Next, as illustrated in FIG. 3B, a photoresist film 24 is formed on the entire surface by spin coating.

Then, openings 26 are formed in the photoresist film 24 down to the interconnections 22 by photolithography. The openings 26 are for forming the conductor plugs 28 (see FIG. 3C).

Figure 3C:
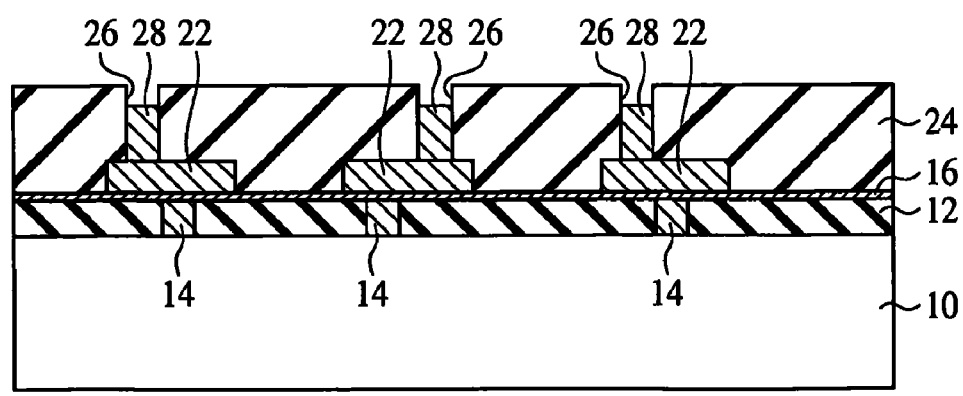

Next, as illustrated in FIG. 3C, the conductor plugs 28 of Cu are formed in the openings 26 by electroplating. The height of the conductor plugs 28 (the height from the upper surfaces of the interconnections 22) is, e.g., about 10 µm. Then, the photoresist film 24 is released.

Figure 4A:
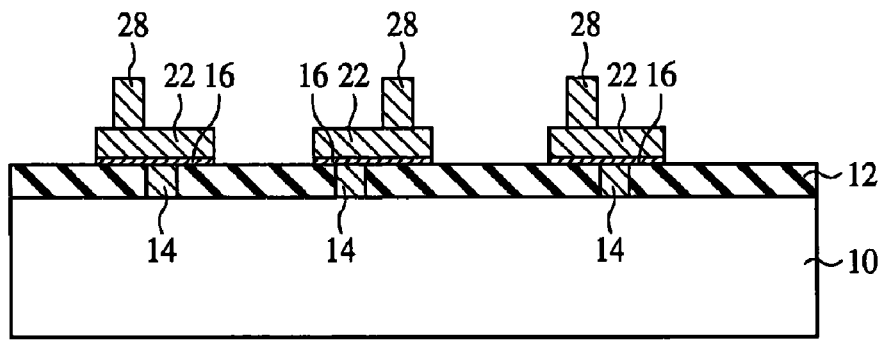
FIGS. 4A to 4C are views of the semiconductor device in the steps of the resin layer formation method and semiconductor device fabrication method according to the first embodiment of the present invention (Part 3).
Figure 4B:
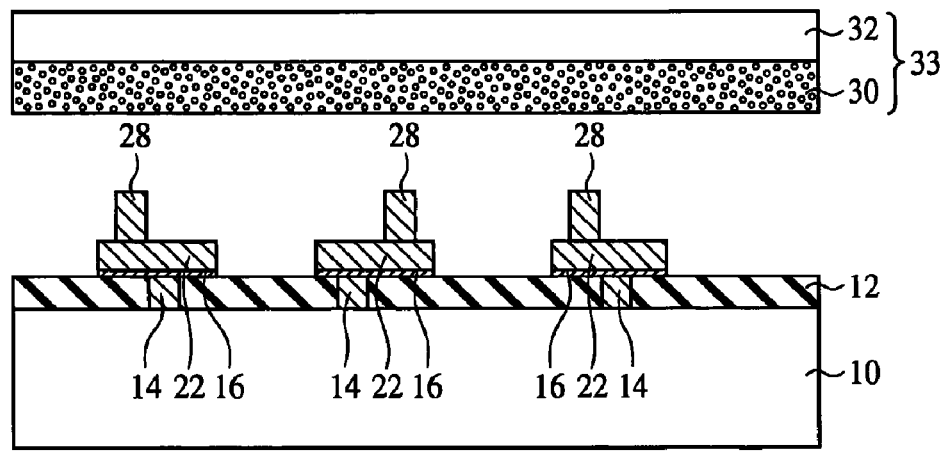
Figure 4C:
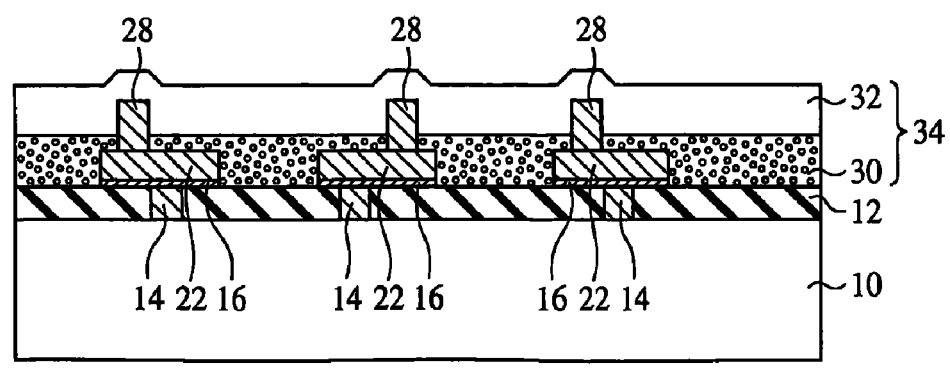
Figure 5A:
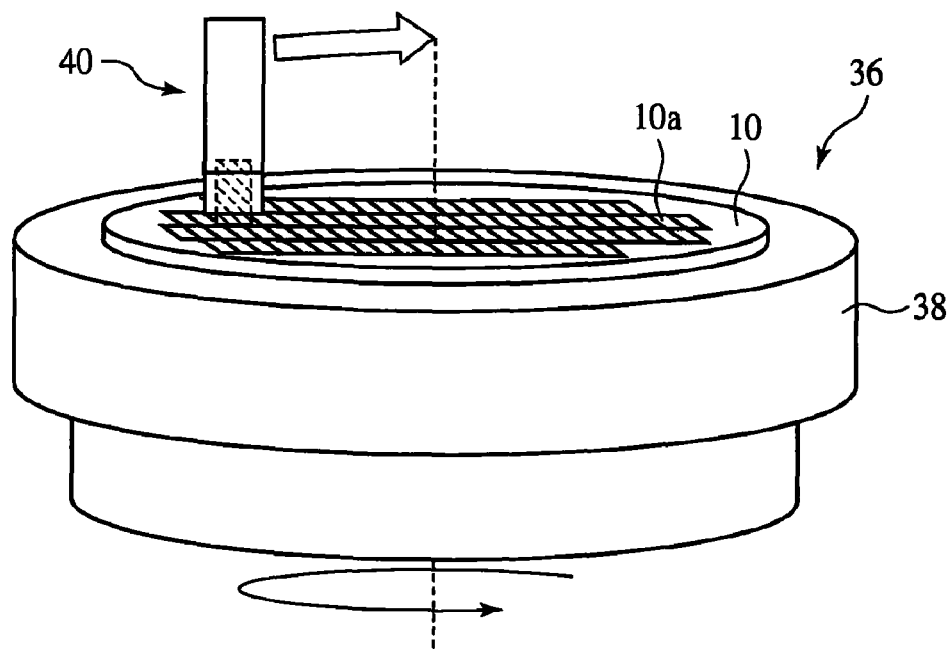
FIGS. 5A and 5B are views of the semiconductor device in the steps of the resin layer formation method and semiconductor device fabrication method according to the first embodiment of the present invention (Part 4).

Then, as illustrated in FIG. 4A, the seed layer 16 exposed around the interconnections 22 is removed by wet etching. The etchant is, e.g., 1-10% ammonium persulfate aqueous solution. The etching period of time is, e.g., about 2 minutes. In etching off the seed layer 16, the surfaces of the interconnections 22 and the conductor plugs 28 are a little etched. However, the thickness of the seed layer 16 is sufficiently smaller than the sizes of the interconnections 22 and the conduction plugs 28, which permits the seed layer 16 to be etched in a short period of time. Accordingly, when the seed layer 16 is etched, the interconnections 22 and the conductor plugs 28 are never excessively etched.

Then, a resin film (resin sheet) 33 is mounted on the semiconductor substrate 10. The resin film 33 includes a first layer 30 containing a filler for decreasing the thermal expansion coefficient, and a second layer 32 containing no such filler laid the latter on the former. In other words, the resin layer 33 containing the filler for decreasing the thermal expansion coefficient localized in the side nearer to the semiconductor substrate 10 is used. The filler for decreasing the thermal expansion coefficient is, e.g., an inorganic material, e.g., silica (oxidized silicon) or others. The average particle diameter of the filler is, e.g., about 1 μm. The content ratio of the filler in the first layer 30 is, e.g., about 60 wt %. The base of the first layer 30 is, e.g., epoxy resin. The material of the second layer 32 is, e.g., epoxy resin. The thickness of the first layer 30 is, e.g., 10 μm. The thickness of the second layer 32 is, e.g., 10 μm.

The filler is contained in the first layer 30 of the resin film 33 so as to make the difference in the thermal expansion coefficient between the resin layer 34 of the resin film 33 and the semiconductor substrate 10 small. That is, the thermal expansion coefficient of the silicon used as the material of the semiconductor substrate 10 is about 2-3 ppm/° C. In contrast to this, the thermal expansion coefficient of epoxy resin is about 45-65 ppm/° C. Accordingly, when a resin layer is formed simply on the semiconductor substrate 10, the thermal processing, etc. for curing the resin layer applies excessive stresses to the semiconductor substrate 10, etc. due to the difference in the thermal expansion coefficient between the semiconductor substrate 10 and the resin layer. On the other hand, the thermal expansion coefficient of the filler of silica is 0.4-0.55 ppm/° C. In the present embodiment, because of the filler of a relatively small thermal expansion coefficient contained in the first layer 30, the difference in the thermal expansion coefficient between the first layer 30 and the semiconductor substrate 10 can be made small. Consequently, in the thermal processing, etc. for the cure, etc. of the resin layer 34 formed of the resin film 33, the stresses exerted on the semiconductor substrate 10, etc. due to the difference in the thermal expansion coefficient between the semiconductor substrate 10 and the resin layer 34 can be made small.

The second layer 32 of the resin film 33 does not contain the filler so that the cutting tool 40 is prevented from being much abraded by the filler.

When a resin layer containing relatively much filler of an inorganic material, such as silica or others is cut with the cutting tool 40 of diamond of others, the cutting tool 40 is extremely abraded, and the distance the cutting tool 40 can cut is about 1 km at most. The cut of 1 km corresponds to the cut 3-4 times for a 6-inch wafer and to the cut about once for an 8-inch wafer.

When a resin layer containing no filler of an inorganic material, such as silica or others is cut with the cutting tool 40 of diamond or others, the cutting edge of the cutting tool 40 is not substantially abraded even when the cut of, e.g., 10 km or above is made. Thus, according to the present embodiment, the resin layer 34 can be planarized while the abrasion and breakage of the cutting tool 40 can be surely prevented.

The content ratio of the filler in the first layer 30 is about 60 wt % here. However, the content ratio of the filler in the first layer 30 is not essentially limited to about 60 wt %. For example, the content ratio of the filler in the first layer 30 may be set suitably in the range of 10-90 wt %. However, with the content ratio of the filler in the first layer 30 set small, the difference in the thermal expansion coefficient between the semiconductor substrate 10 and the resin layer 34 becomes relatively large. On the other hand with the content ratio of the filler in the first layer 30 set large, the hardness of the first layer 30 is increased, which makes it difficult to adhere the resin film 33 to the semiconductor substrate 10 by vacuum press. Accordingly, the content ratio of the filler in the first layer 30 is set preferably in the range of 20-70 wt %.

The thickness of the first layer 30 is 10 μm, and the thickness of the second layer 32 is 10 μm here. However, the thickness of the first layer 30 and the second layer 32 is not essentially limited to the above. As will be described later, the surface of the resin layer 34 is planarized by cutting with cutting tool 40 upper parts of the conductor plugs 28 and the surface of the second layer 32. To prevent the cutting tool from being much abraded in cutting the surface of the resin layer 34 with the cutting tool 40, it is preferable that as described above, the second layer 32 alone containing no filler of an inorganic material is cut, but the first layer 30 containing the filler of an inorganic material is not cut. Accordingly, it is preferable to set the height of the interconnections 22, the height of the conductor plugs 28 and the thickness of the first layer 30 so that the upper surface of the first layer 30 is lower than the upper surfaces of the conductor plugs 28, and the upper surface of the first layer 30 is higher than the upper surfaces of the interconnections 22.

Next, the resin film 33 is adhered to the semiconductor substrate 10 with the inter-layer insulation film 12, etc. formed on with a vacuum press. The conditions for the vacuum press are as follows. The vacuum period of time is, e.g., about 60 seconds. The temperature for the vacuum press is, e.g., about 120° C. The pressure for the vacuum press is, e.g., about 1 MPa. The period of time of the vacuum press forming is, e.g., 60 seconds. Thus, the resin layer 34 of the resin film 33 is formed on the semiconductor substrate 10 (see FIG. 4C).

Next, the resin layer 34 is cured by thermal processing. The conditions for the thermal processing are, e.g., 190° C. and 1 hour. Because of the filler of a relatively small thermal expansion coefficient contained in the first layer 30 of the resin layer 34, the difference in the thermal expansion coefficient between the semiconductor substrate 10 and the resin layer 34 is relatively small. Thus, according to the present embodiment, stresses exerted on the semiconductor substrate 10, etc. due to the difference in the thermal expansion coefficient between the semiconductor substrate 10 and the resin layer 34 can be made relatively small.

Next, the semiconductor substrate 10 is fixed to the chuck table 38 of a superprecision lathe 36 by vacuum adsorption (see FIG. 5A). The chuck table 38 is a table for fixing a waver, etc. when the wafer, etc. are machined. When the semiconductor substrate 10 is fixed to the chuck table 38, the underside of the semiconductor substrate 10, i.e., the surface on the side where the resin layer 34 is not formed is fixed to the chuck table 38. To fix the semiconductor substrate 10 to the chuck table 38, it is preferable to use a pin chuck.

Figure 5B:
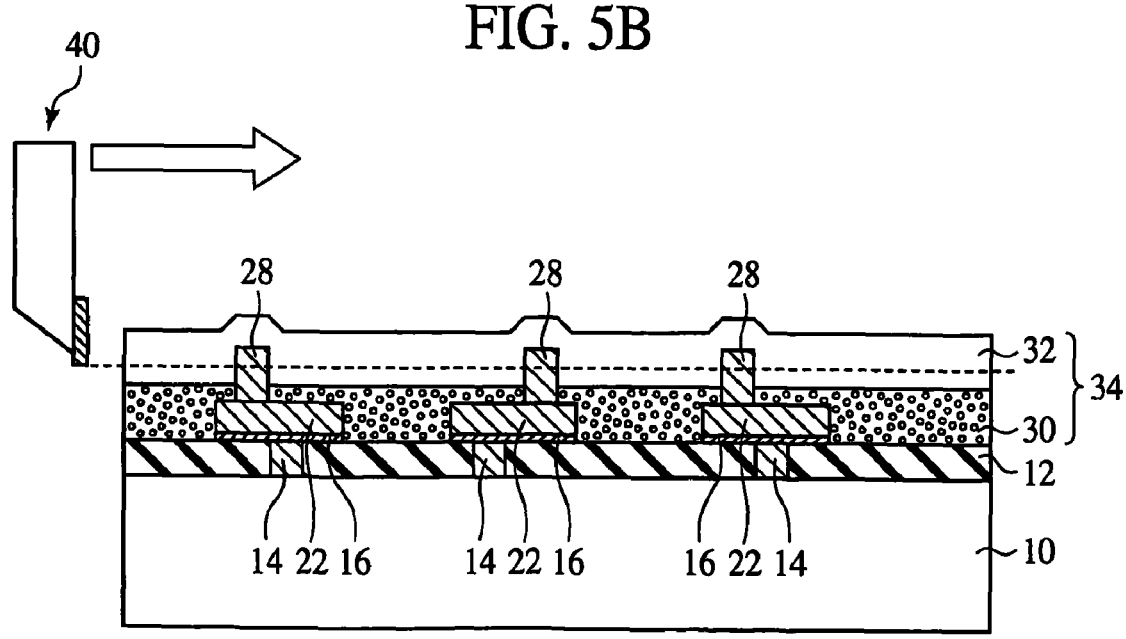

Next, with the semiconductor substrate 10 set on rotation, the surface of the resin layer 34 and the upper parts of the conductor plugs 28 are cut with the cutting tool 40 of diamond until the thickness of the resin layer 34 becomes, e.g., about 13 μm (see FIG. 5B).

The conditions for cutting the surface of the resin layer 34, etc. are exemplified below.

The rake angle of the cutting tool 40 is 0 degree. The rake angle is an angle formed between the surface perpendicular to a cut surface of an object-to-be-cut and the edge (rake face) of the cutting tool 40 in the advancing direction. Generally, as the rake angle is larger, the cut becomes better, but the edge is more damaged, and the life tends to be shorter. The rake angle of 0-30 degrees is applicable. In the present embodiment, the object to be cut is a relatively soft resinous material, and the rake angle is set as above.

The rotation number of the chuck table is, e.g., about 1000 rpm. With the rotation number thus set, the cutting rate becomes about 5 m/sec when the rotation radius is about 5 cm.

When the surface of the resin layer 34 is cut, the cut is made, e.g., twice to cut the resin layer 34 to a required thickness. The cut amount of the cutting tool in the first cut is, e.g., about 4 μm. The cut amount of the cutting tool 40 in the second cut is, e.g., about 3 μm. The cut amount is a cut depth of the cutting tool 40 in the cut.

The feed of the cutting tool 40 is, e.g., 20 μm/second. The feed is a speed at which the cutting tool is advanced radially of the chuck table in the cut, i.e., in the direction from one point on the outer periphery of the chuck table to the rotation center.

When the surface of the resin layer 34 is cut under these conditions, suitable concavities and convexities (not illustrated) are formed in the surface of the resin layer 34a after cut, and the ten-point height of irregularities of the surface of the resin layer 34a after cut is, e.g., 1-2 μm. The ten-point height of irregularities Rz of the surfaces of the conductor plugs 28 becomes, e.g., 5-15 nm. In the specification of the present application, the resin layer after cut is called the resin layer 34a to be discriminated from the resin layer 34 before cut.

The ten-point height of irregularities Rz is given by extracting a roughness curve by a reference length in the direction of its average line, summing an average value of the absolute values of altitudes of the highest peak to the fifth peak and an average value of the absolute values of altitudes of the lowest valley to the fifth valley measured in the direction of the depth ratio from the average line of the extracted part, and expressing the sum in micrometer (μm) (refer to JIS B 0601-1994). That is, the ten-point height of irregularities Rz is the difference between the average of the five highest peaks from to the mean line and the average depth to the five deepest valleys from the mean line.

In the present embodiment, the first layer 30 containing a filler of an inorganic material is not cut, but the second layer 32 containing no filler of an inorganic material is cut to thereby planarize the surface of the resin layer 34, whereby the cutting tool 40 is prevented from being much abraded or broken by the filler of an inorganic material.

Figure 6A:
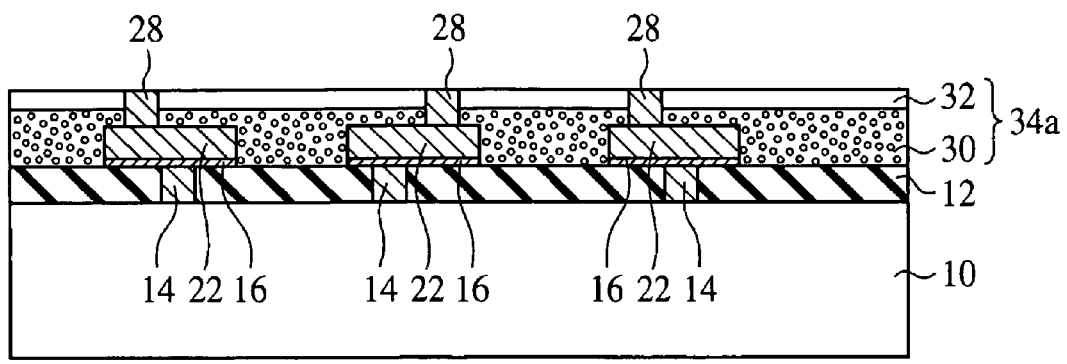
FIGS. 6A and 6B are views of the semiconductor device in the steps of the resin layer formation method and semiconductor device fabrication method according to the first embodiment of the present invention (Part 5).
Figure 6B:
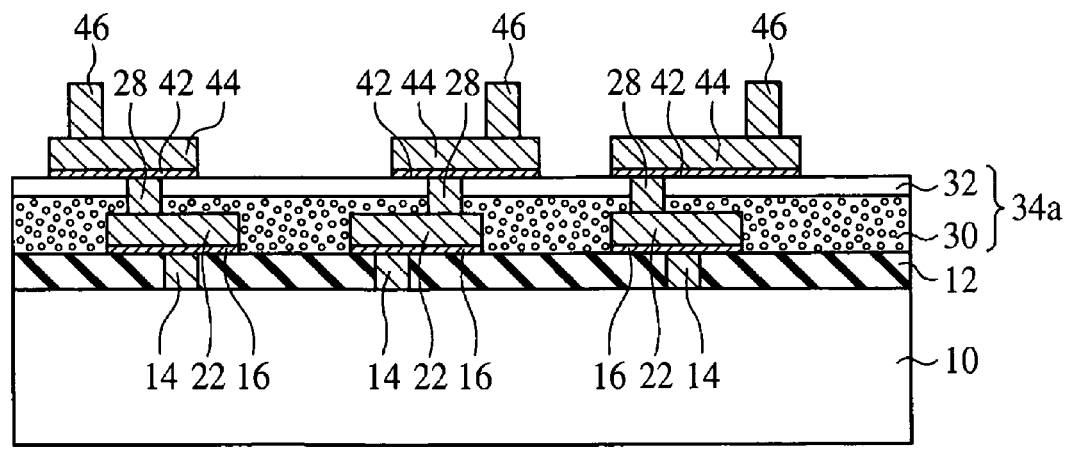

Thus, the surface of the resin layer 34a is planarized as illustrated in FIG. 6A.

To make the fabrication cost low, it is assumed here that the cut is made without the semiconductor substrate 10 is not diced in discrete semiconductor devices (semiconductor chips) 10a. However, the cut may be made on the discrete semiconductor devices 10a into which the semiconductor substrate 10 has been diced and separate.

Next, a seed layer 42 of, e.g., a 80 nm-thickness Cr film and a 300 nm-thickness Cu film sequentially formed the latter on the former is formed on the resin layer 34a by, e.g., sputtering or electroplating.

The seed layer 42 is formed on the resin layer 34a with suitable concavities and convexities (not illustrated) formed in the surface has the parts formed in the concavities (not illustrated) secured in the concavities. Such phenomena is called an anchor effect. Thus, the adhesion between the seed layer 42 and the resin layer 34a is sufficiently ensured.

Then, a photoresist film (not illustrated) is formed on the entire surface by spin coating.

Then, openings (not illustrated) are formed in the photoresist film down to the seed layer 42 by photolithography. The openings are for forming the interconnections 44 (see FIG. 6B). Excessively deep concavities and convexities are formed in the surface of the resin layer 34a, and when the photoresist film is patterned, micronized, good patterns can be formed.

Next, the interconnections 44 of, e.g., Cu are formed on the seed layer 42 in the openings in the photoresist film by electroplating. The height of the interconnections 44 (the height from the upper surface of the resin layer 34a) is, e.g., about 5 μm. Because of the sufficient adhesion between the seed layer 42 and the resin layer 34a, the interconnections 44 are ensured to the resin layer 34a via the seed layer 42.

Then, the photoresist film is released.

Next, a photoresist film (not illustrated) is formed on the entire surface of the resin layer 34a with the interconnections 44 formed in by spin coating.

Next, openings (not illustrated) are formed in the photoresist film down to the interconnections 44 by photolithography. The openings are for forming the conductor plugs 46 (see FIG. 6B).

Next, the conductor plugs 46 of Cu are formed in the openings by electroplating. The height of the conductor plugs 46 (the height from the upper surface of the interconnections 44) is, e.g., about 10 μm.

Then, the photoresist film is released.

Next, the seed layer 42 exposed around the interconnections 44 is removed by wet etching. The etchant is, e.g., 1-10% ammonium persulfate aqueous solution. The etching period of time is, e.g., about 2 minutes. In etching off the seed layer 42, the surfaces of the interconnections 44 and the conductor plugs 46 are a little etched. However, the thickness of the seed layer 42 is sufficiently smaller than the sizes of the interconnections 44 and the conduction plugs 46, which permits the seed layer 42 to be etched in a short period of time. Accordingly, when the seed layer 42 is etched, the interconnections 44 and the conductor plugs 46 are never excessively etched.

Figure 7A:
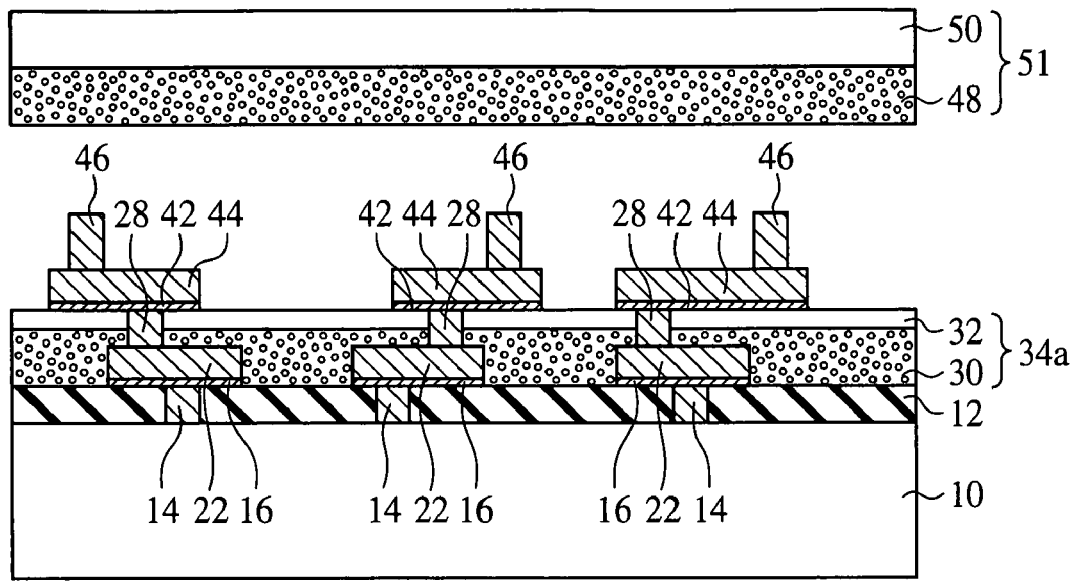
FIGS. 7A and 7B are views of the semiconductor device in the steps of the resin layer formation method and semiconductor device fabrication method according to the first embodiment of the present invention (Part 6).
Figure 8A:
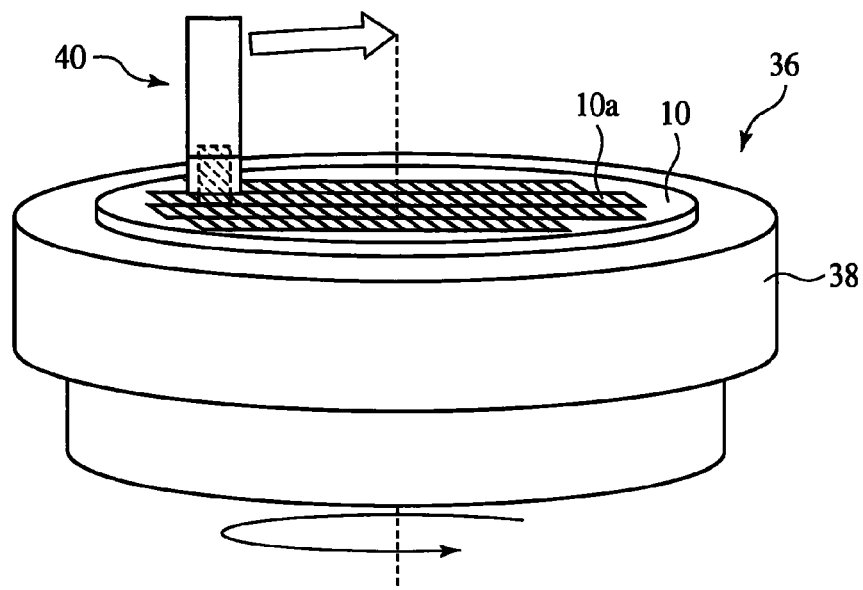
FIGS. 8A and 8B are views of the semiconductor device in the steps of the resin layer formation method and semiconductor device fabrication method according to the first embodiment of the present invention (Part 7).

Then, as illustrated in FIG. 7A, a resin film 51 is mounted on the semiconductor substrate 10. The resin film 51 is the same resin film as, e.g., the resin film 33 described above. That is, the resin film 51 is the two-layer structure of a first layer 48 containing a filler of an inorganic material, and a second layer 50 containing no filler of an inorganic material.

Figure 7B:
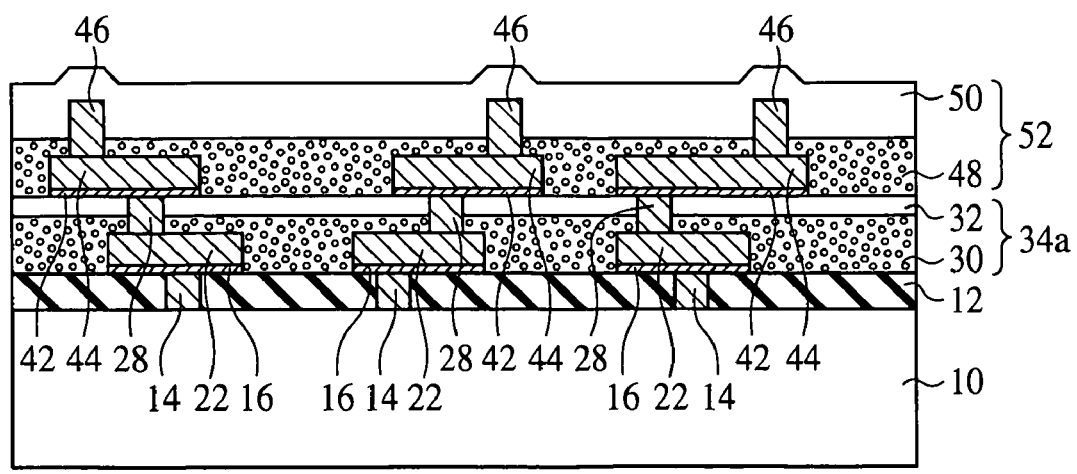

Next, the resin film 51 is adhere to the resin layer 34a by a vacuum press apparatus (see FIG. 7B). The conditions for the vacuum press are as the same as those for vacuum pressing the resin film 33 and are as exemplified below. The vacuum period of time is, e.g., about 60 seconds. The temperature for the vacuum press is, e.g., about 120° C. The pressure for the vacuum press is, e.g., about 1 MPa. The period of time of the vacuum press forming is, e.g., 60 seconds. Thus, the resin layer 52 of the resin film 51 is formed on the resin layer 34a with the interconnections 44, the conductor plugs 46, etc. formed in (see FIG. 7B).

Next, the resin layer 52 is cured by thermal processing. The conditions for the thermal processing are the same as those for curing the resin layer 34 described above and are, e.g., 190° C. and 1 hour. Because of the filler of a relatively small thermal expansion coefficient contained in the first layer 48 of the resin layer 52, the difference in the thermal expansion coefficient between the semiconductor substrate 10 and the resin layer 52 is relatively small. Thus, according to the present embodiment, stresses exerted on the semiconductor substrate 10, etc. due to the difference in the thermal expansion coefficient between the semiconductor substrate 10 and the resin layer 52 can be made relatively small.

Then, the semiconductor substrate 10 is secured to the chuck table 38 of the superprecision lathe 36 by vacuum adsorption (see FIG. 8A).

Figure 8B:
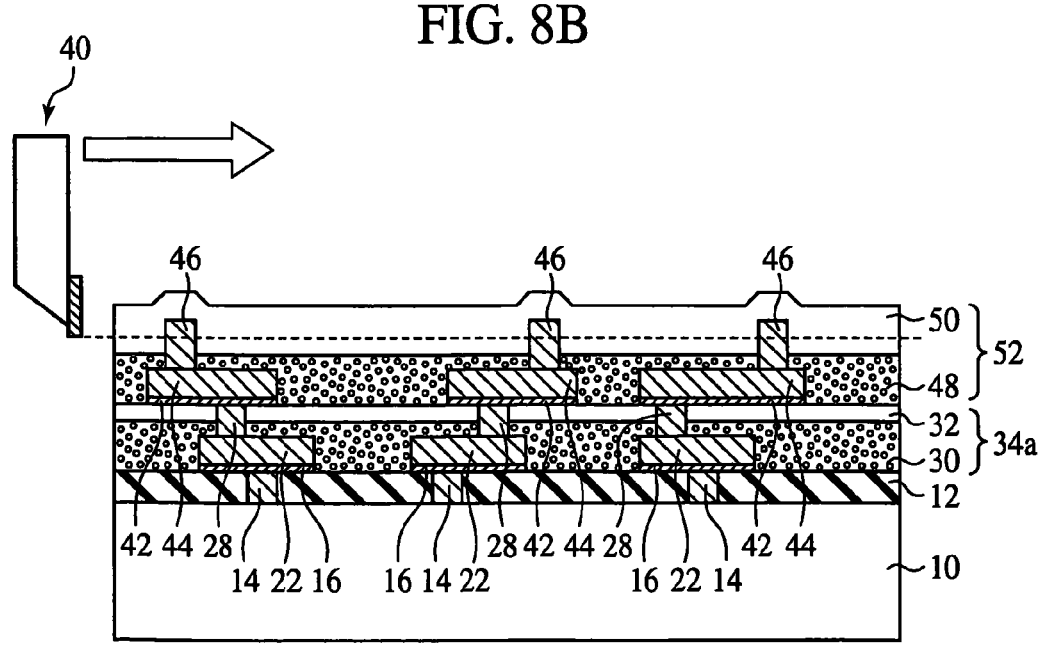

Next, with the semiconductor device 10 set on rotation, the surface of the resin layer 52 and the upper parts of the conductor plugs 46 are cut with the cutting tool 40 of diamond until the thickness of the resin layer 52 becomes, e.g., about 13 μm (see FIG. 8B). The conditions for cutting the surface of the resin layer 52 are the same as, e.g., those for cutting the surface of the resin layer 34.

In the present embodiment, the first layer 48 containing a filler of an inorganic material is not cut, but the second layer 50 containing no filler of an inorganic material is cut to thereby planarize the surface of the resin layer 52, whereby the cutting tool 40 is prevented from being much abraded or broken by the filler of an inorganic material.

Figure 9A:
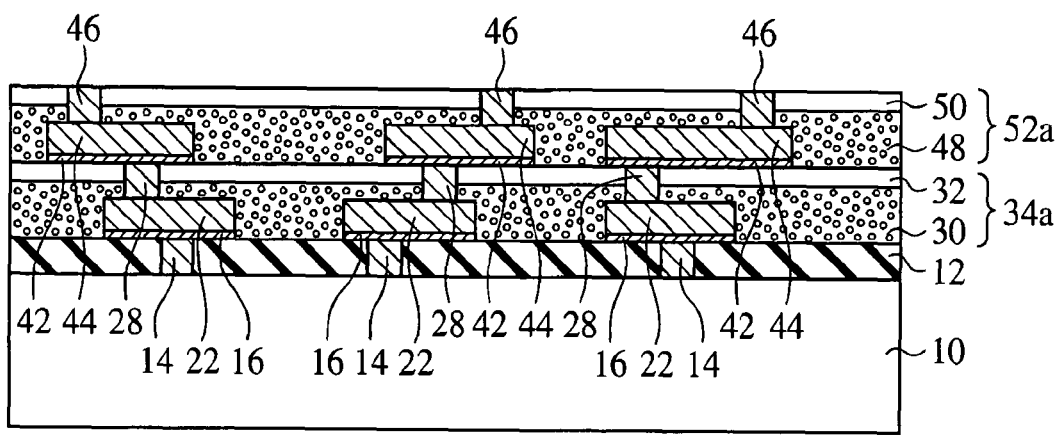
FIGS. 9A and 9B are views of the semiconductor device in the steps of the resin layer formation method and semiconductor device fabrication method according to the first embodiment of the present invention (Part 8).
Figure 9B:
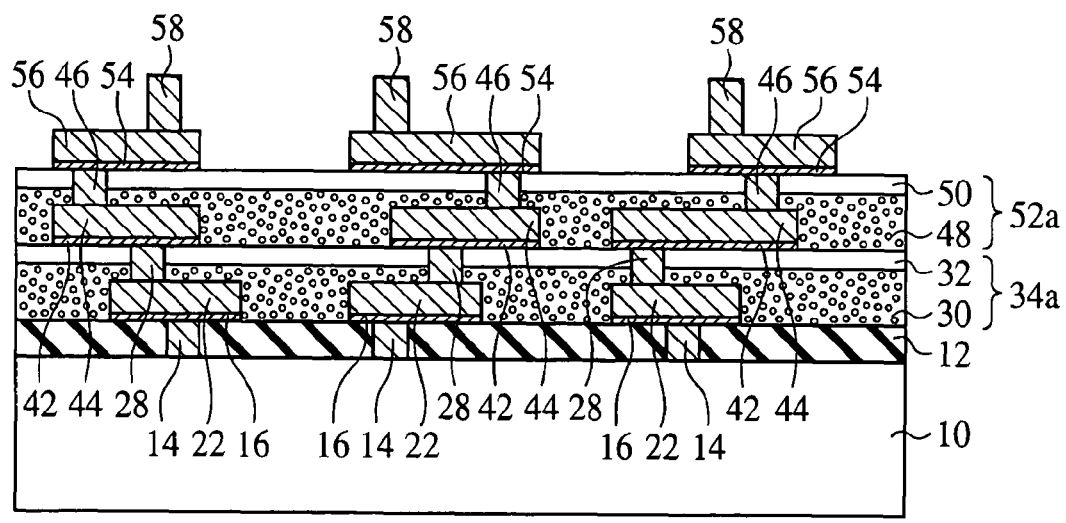

Thus, the surface of the resin layer 52a is planarized as illustrated in FIG. 9A. In the specification of the present application, the resin layer after cut is called the resin layer 52a to be discriminated from the resin layer 52 before cut.

Then, a seed layer 54 is formed on the resin layer 52a and the conductor plugs 46 by sputtering or electroplating.

Next, a photoresist film (not illustrated) is formed on the entire surface by spin coating.

Next, openings (not illustrated) are formed in the photoresist film down to the seed layer by photolithography.

Then, interconnections 56 of Cu are formed in the openings in the photoresist film by electroplating. The height of the interconnection 56 (the height from the upper surface of the resin layer 52a) is, e.g., about 5 μm.

Then, the photoresist film is released.

Next, a photoresist film (not illustrated) is formed by spin coating on the entire surface of the resin layer 52a with the interconnections 56 formed in.

Next, openings (not illustrated) are formed in the photoresist film down to the interconnections 56 by photolithography. The openings are for forming conductor plugs 58 (see FIG. 9B).

Next, the conductor plugs 58 of Cu are formed in the openings by electroplating. The height of the conductor plugs 58 (the height from the upper surface of the interconnections 56) is, e.g., about 10 μm.

Then, the photoresist film is released.

Next, the seed layer 54 exposed around the interconnections 56 is removed by wet etching.

Figure 10A:
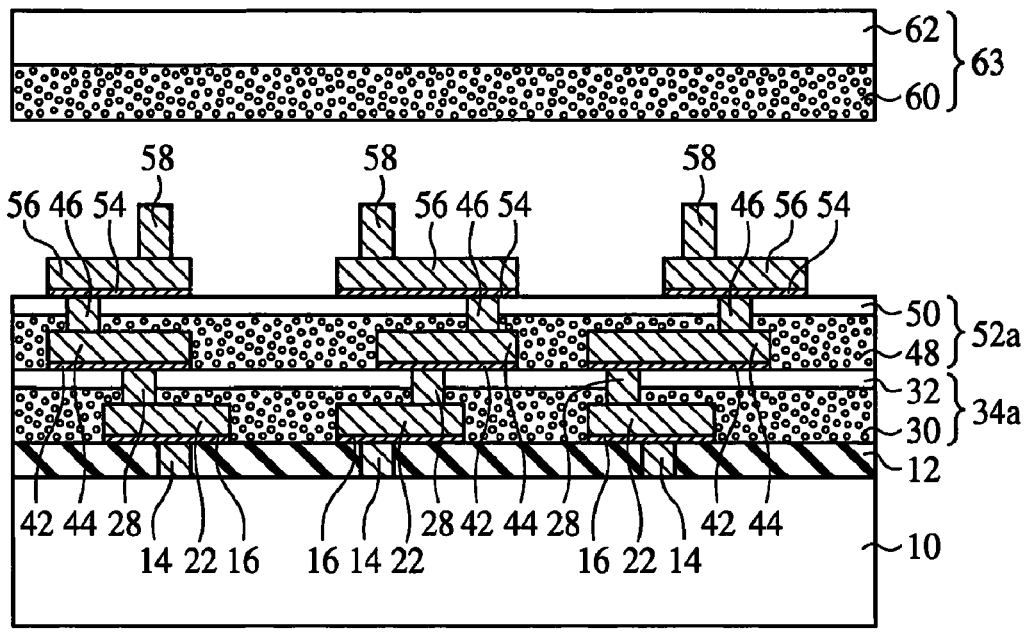
FIGS. 10A and 10B are views of the semiconductor device in the steps of the resin layer formation method and semiconductor device fabrication method according to the first embodiment of the present invention (Part 9).

Next, as illustrated in FIG. 10A, a resin film 63 is mounted on the semiconductor substrate 10. The resin film 63 is the same as, e.g., the resin film 33 described above. That is, the resin film 63 has the two-layer structure of a first layer 60 containing a filler of an inorganic material, and a second layer 62 containing no filler of an inorganic material.

Figure 10B:
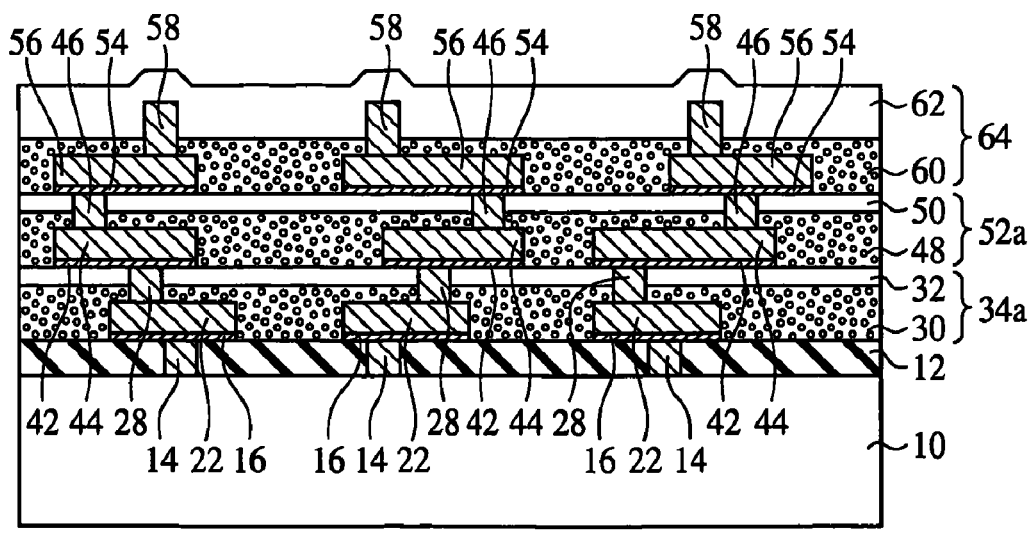

Then, a resin film 63 is adhered to the resin layer 52a by a vacuum press apparatus (see FIG. 10B). The conditions for the vacuum press are the same as those for vacuum pressing the resin film 33 and are as exemplified below. The vacuum period of time is, e.g., about 60 seconds. The temperature for the vacuum press is, e.g., about 120° C. The pressure for the vacuum press is, e.g., about 1 MPa. The period of time of the vacuum press forming is, e.g., 60 seconds. Thus, the resin layer 64 of the resin film 63 is formed on the resin layer 52a with the interconnections 56, the conductor plugs 58, etc. formed in (see FIG. 10B).

Next, the resin layer 64 is cured by thermal processing. The conditions for the thermal processing are the same as those for curing the resin layer 34 described above and are, e.g., 190° C. and 1 hour. Because of the filler of a relatively small thermal expansion coefficient contained in the first layer 60 of the resin layer 64, the difference in the thermal expansion coefficient between the semiconductor substrate 10 and the resin layer 64 is relatively small. Thus, according to the present embodiment, stresses exerted on the semiconductor substrate 10, etc. due to the difference in the thermal expansion coefficient between the semiconductor substrate 10 and the resin layer 64 can be made relatively small.

Then, the semiconductor substrate 10 is secured to the chuck table 38 of the superprecision lathe 36 by vacuum adsorption (see FIG. 8A).

Figure 11A:
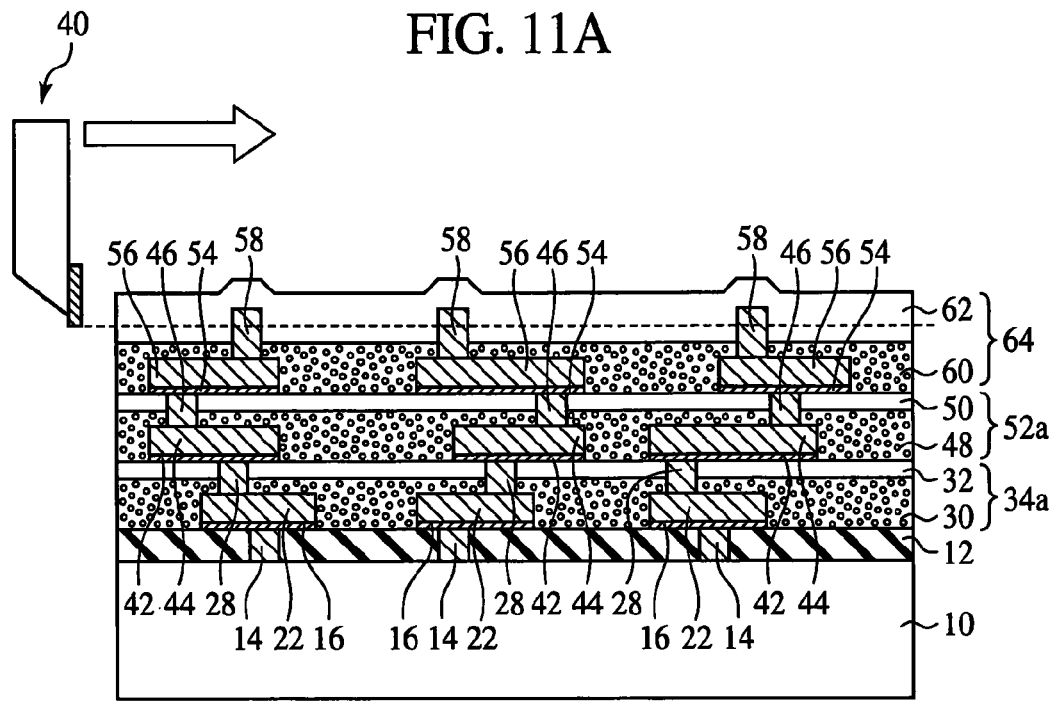
FIGS. 11A and 11B are views of the semiconductor device in the steps of the resin layer formation method and semiconductor device fabrication method according to the first embodiment of the present invention (Part 10).
Figure 11B:
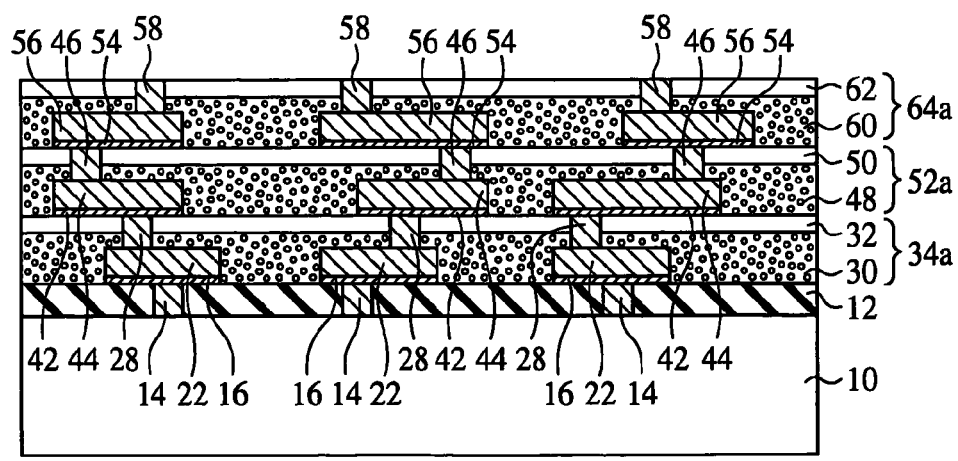

Next, with the semiconductor device 10 set on rotation, the surface of the resin layer 64 and the upper parts of the conductor plugs 58 are cut with the cutting tool 40 of diamond until the thickness of the resin layer 64 becomes, e.g., about 13 μm (see FIG. 11A). The conditions for cutting the surface of the resin layer 64 are the same as, e.g., those for cutting the surface of the resin layer 34.

In the present embodiment, the first layer 60 containing a filler of an inorganic material is not cut, but the second layer 62 containing no filler of an inorganic material is cut to thereby planarize the surface of the resin layer 64, whereby the cutting tool 40 is prevented from being much abraded or broken by the filler of an inorganic material.

Thus, the surface of the resin layer 64a is planarized as illustrated in FIG. 11A. In the specification of the present application, the resin layer after cut is called the resin layer 64a to be discriminated from the resin layer 64 before cut.

Then, a seed layer 66 is formed on the resin layer 64a and the conductor plugs 58 by sputtering or electroplating.

Next, a photoresist film (not illustrated) is formed on the entire surface by spin coating.

Next, openings (not illustrated) are formed in the photoresist film down to the seed layer by photolithography.

Then, interconnections 68 (see FIG. 12A) of Cu are formed in the openings in the photoresist film by electroplating. The height of the interconnection 68 (the height from the upper surface of the resin layer 64a) is, e.g., about 5 μm.

Then, the photoresist film is released.

Next, a photoresist film (not illustrated) is formed by spin coating on the entire surface of the resin layer 64a with the interconnections 68 formed in.

Next, openings (not illustrated) are formed in the photoresist film down to the interconnections 68 by photolithography. The openings are for forming conductor plugs 70.

Next, the conductor plugs 70 of Cu are formed in the openings by electroplating. The height of the conductor plugs 70 (the height from the upper surface of the interconnections 68) is, e.g., about 10 μm.

Then, the photoresist film is released.

Next, the seed layer 66 exposed around the interconnections 68 is removed by wet etching.

Figure 12A:
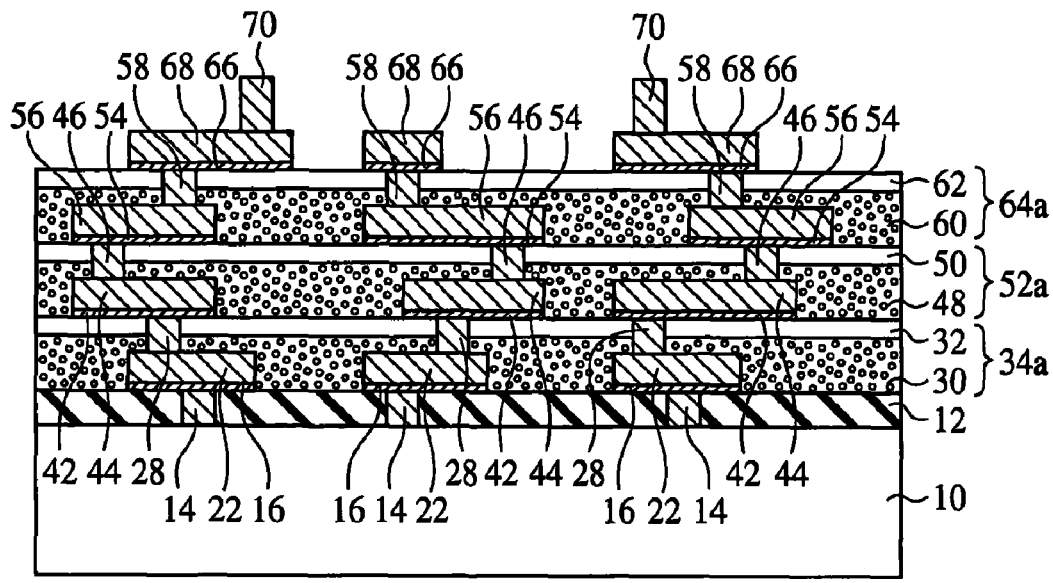
FIGS. 12A and 12B are views of the semiconductor device in the steps of the resin layer formation method and semiconductor device fabrication method according to the first embodiment of the present invention (Part 11).
Figure 12B:
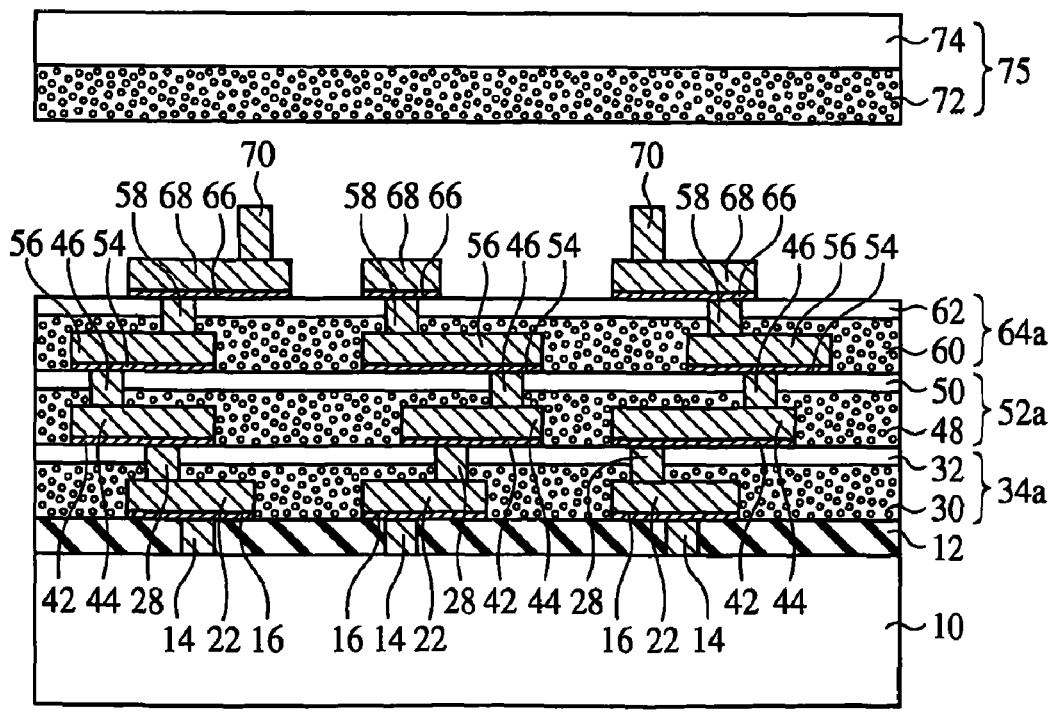

Next, as illustrated in FIG. 12B, a resin film 75 is mounted on the semiconductor substrate 10. The resin film 75 is the same as, e.g., the resin film 33 described above. That is, the resin film 75 has the two-layer structure of a first layer 72 containing a filler of an inorganic material, and a second layer 74 containing no filler of an inorganic material.

Figure 13A:
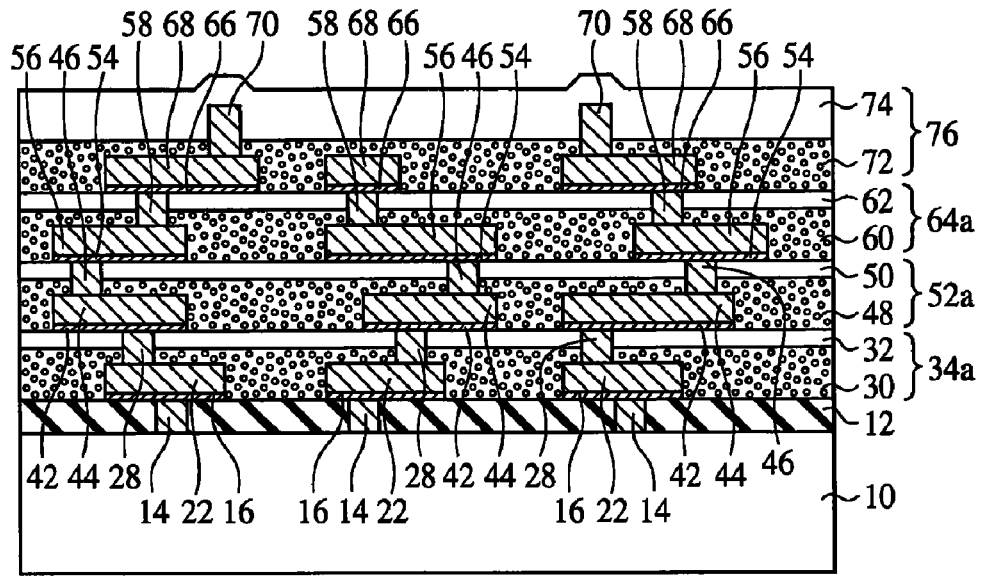
FIGS. 13A and 13B are views of the semiconductor device in the steps of the resin layer formation method and semiconductor device fabrication method according to the first embodiment of the present invention (Part 12).

Then, a resin film 75 is adhered to the resin layer 64a with a vacuum press (see FIG. 13A). The conditions for the vacuum press are the same as those for vacuum pressing the resin film 33 and are as exemplified below. The vacuum period of time is, e.g., about 60 seconds. The temperature for the vacuum press is, e.g., about 120° C. The pressure for the vacuum press is, e.g., about 1 MPa. The period of time of the vacuum press forming is, e.g., 60 seconds. Thus, the resin layer 76 of the resin film 75 is formed on the resin layer 64a with the interconnections 68, the conductor plugs 70, etc. formed in (see FIG. 13A).

Next, the resin layer 76 is cured by thermal processing. The conditions for the thermal processing are the same as those for curing the resin layer 34 described above and are, e.g., 190° C. and 1 hour. Because of the filler of a relatively small thermal expansion coefficient contained in the first layer 72 of the resin layer 76, the difference in the thermal expansion coefficient between the semiconductor substrate 10 and the resin layer 76 is relatively small. Thus, according to the present embodiment, stresses exerted on the semiconductor substrate 10, etc. due to the difference in the thermal expansion coefficient between the semiconductor substrate 10 and the resin layer 76 can be made relatively small.

Then, the semiconductor substrate 10 is secured to the chuck table 38 of the superprecision lathe 36 by vacuum adsorption (see FIG. 8A).

Figure 13B:
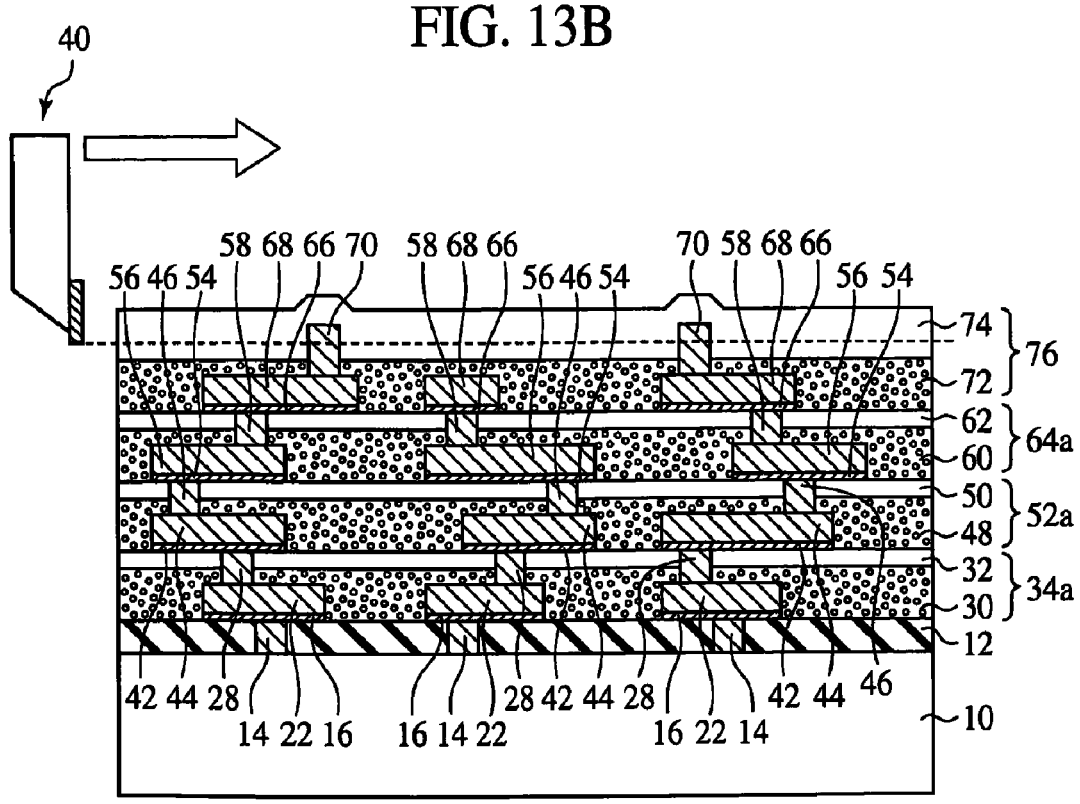

Next, with the semiconductor device 10 set on rotation, the surface of the resin layer 76 and the upper parts of the conductor plugs 70 are cut with the cutting tool 40 of diamond until the thickness of the resin layer 76 becomes, e.g., about 13 µm (see FIG. 13B). The conditions for cutting the surface of the resin layer 76 are the same as, e.g., those for cutting the surface of the resin layer 34.

In the present embodiment, the first layer 72 containing a filler of an inorganic material is not cut, but the second layer 74 containing no filler of an inorganic material is cut to thereby planarize the surface of the resin layer 76, whereby the cutting tool 40 is prevented from being much abraded or broken by the filler of an inorganic material.

Figure 14A:
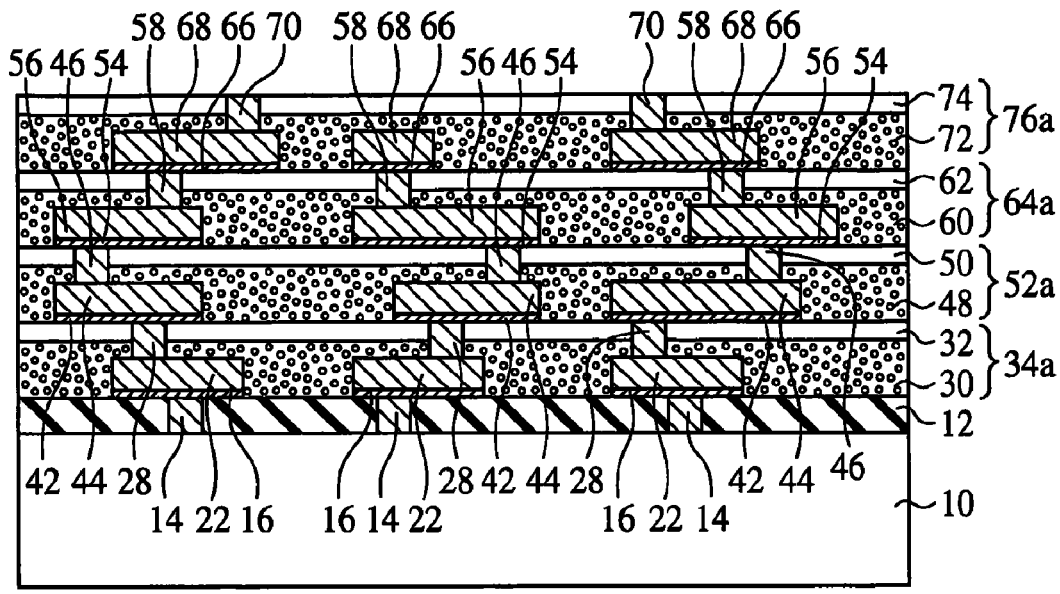
FIGS. 14A and 14B are views of the semiconductor device in the steps of the resin layer formation method and semiconductor device fabrication method according to the first embodiment of the present invention (Part 13).

Thus, the surface of the resin layer 76a is planarized as illustrated in FIG. 14A. In the specification of the present application, the resin layer after cut is called the resin layer 76a to be discriminated from the resin layer 76 before cut.

Then, a seed layer 78 is formed on the resin layer 76a and the conductor plugs 70 by sputtering or electroplating.

Next, a photoresist film (not illustrated) is formed on the entire surface by spin coating.

Next, openings (not illustrated) are formed in the photoresist film down to the seed layer by photolithography. The openings are for forming electrodes 80.

Figure 14B:
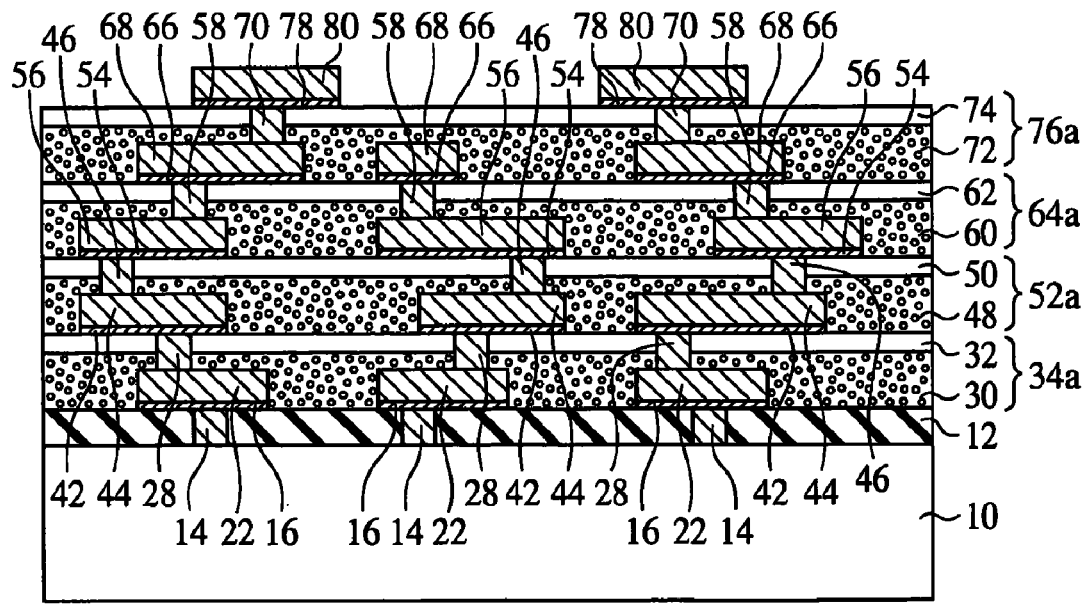

Then, electrodes 80 of Cu are formed in the openings in the photoresist film by electroplating (see FIG. 14B).

Then, the photoresist film is released.

The seed layer 78 exposed around the electrodes 80 is removed by wet etching.

Thus, the semiconductor device according to the present embodiment is fabricated by the resin layer formation method according to the present embodiment.

The plating method of the present embodiment and the semiconductor device fabrication method according to the present embodiment is characterized mainly in that a resin layer including a first layer containing a filler of an inorganic material, and a second layer containing no such filler is formed, and the surface of the resin layer is cut with a cutting tool to planarize the surface of the resin layer.

According to the present embodiment, the first layer containing a filler of an inorganic material is not cut, but the second layer containing no filler of an inorganic material is cut so as to planarize the surface of the resin layer, whereby the cutting tool is prevented from being abraded or broken by the filler of an inorganic material. Thus, according to the present embodiment, the resin layer can be planarized while the abrasion and breakage of the cutting tool is suppressed, and consequently, the semiconductor device, etc. can be fabricated at low costs.

A Second Embodiment

Figure 15:
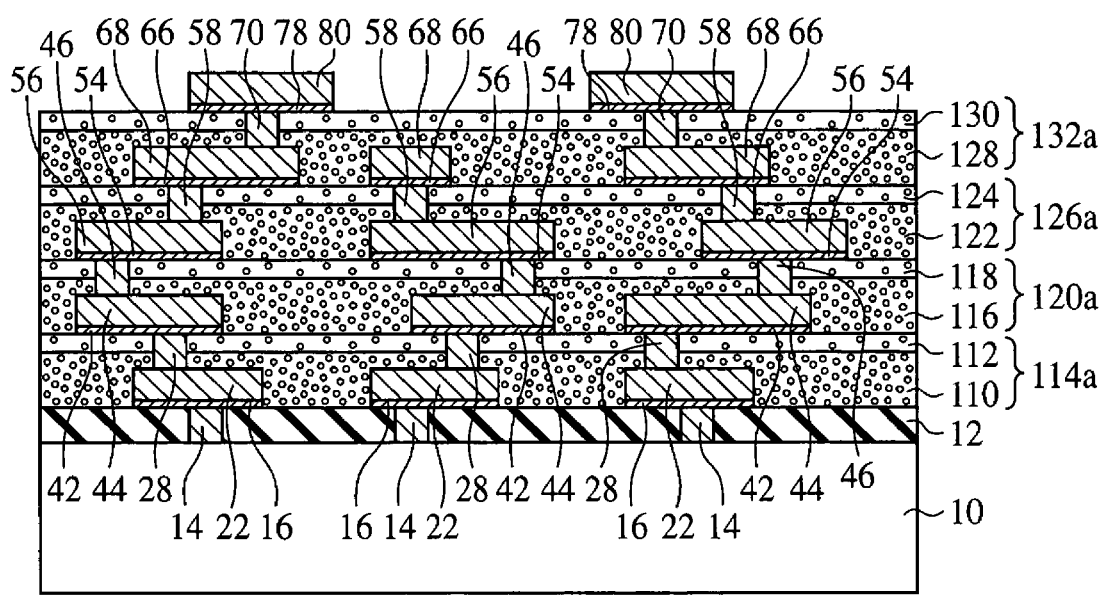
FIG. 15 is sectional views of the semiconductor device according to a second embodiment of the present invention.

The resin layer formation method according to a second embodiment of the present invention, the semiconductor device using the resin layer formation method and the semiconductor device fabrication method will be explained with reference to FIGS. 15 to 25B. FIG. 15 is a sectional view of the semiconductor device according to the present embodiment. The same members of the present embodiment as those of the resin layer formation method, the semiconductor device and the semiconductor device fabrication method according to the first embodiment illustrated in FIGS. 1 to 14B are represented by the same reference numbers not to repeat or to simplify their explanation.

(The Semiconductor Device)

The semiconductor device according to the present embodiment is characterized mainly in that first layers 110, 116, 122, 128 of resin layers 114a, 120a, 126a, 132a contain a filler of an inorganic material by a first content ratio, and second layers 112, 118, 124, 130 of the resin layers 114a, 120a, 126a, 132a contain the filler of an inorganic material by a second content ratio which is smaller than the first content ratio.

As illustrated in FIG. 15, the resin layer (inter-layer insulation film) 114a is formed on an inter-layer insulation film 12, burying interconnections 22 and conductor plugs 28. The resin layer 114a is formed of the first layer 110 containing a filler by a first content ratio, for decreasing the thermal expansion coefficient, and the second layer 112 formed on the first layer 110 and containing the filler by a second content ratio which is smaller than the first content ratio. In other words, the resin layer 114a having the filler for decreasing the thermal expansion coefficient localized in the side nearer to the semiconductor substrate 10 is formed.

The base of the first layer 110 is, e.g., epoxy resin. The filler contained in the first layer 110 is, e.g., an inorganic material, e.g., silica or others. The average particle diameter of the filler is, e.g., about 1 µm. The content ratio of the filler of the first layer 110 is, e.g., about 60 wt %.

The base of the second layer 112 is, e.g., epoxy resin. The filler contained in the second layer 112 is an inorganic material, e.g., silica or others. The content ratio of the filler of the second layer 112 is, e.g., about 20 wt %. The content ratio of the filler of the second layer 112 is set relatively small in the present embodiment so as to prevent the extreme abrasion, etc. of a cutting tool 40 by the filler in cutting the surface of the resin layer 114 (see FIG. 17A) formed of a resin film 113 (see FIG. 16B).

The surface of the resin layer 114a and the surfaces of the conductor plugs 28 are cut with the cutting tool 40 (see FIG. 17A) of diamond or others, as will be described later. The surfaces of the conductor plugs 28 and the surface of the resin layer 114a which have been cut with the cutting tool 40 of diamond or others are flat.

On the resin layer 114a, the resin layer (inter-layer insulation film) 120a is formed, burying interconnections 44 and conductor plugs 46. The resin layer 120a is formed of the first layer 116 containing the filler of an inorganic material by the first content ratio, and the second layer 118 formed on the first layer 116 and containing the filler of an inorganic material by the second content ratio which is smaller than the first content ratio.

The base of the first layer 116 is, e.g., epoxy resin. The material of the filler contained in the first layer 116 is, e.g., silica. The average particle diameter of the filler is, e.g., about 1 µm. The content ratio of the filler of the first layer 116 is, e.g., about 60 wt %.

The base of the second layer 118 is, e.g., epoxy resin. The material of the filler contained in the second layer 118 is, e.g., silica. The average particle diameter is, e.g., about 1 µm. The content ratio of the filler of the second layer 118 is, e.g. about 20 wt %. The content ratio of the filler of the second layer 118 is set relatively small in the present embodiment so as to prevent the extreme abrasion, etc. of a cutting tool 40 by the filler in cutting the surface of the resin layer 120 (see FIG. 19B) formed of a resin film 119 (see FIG. 18B).

The surface of the resin layer 120a and the surfaces of the conductor plugs 46 are cut with the cutting tool 40 of diamond or others, as will be described later (see FIG. 19B). The surfaces of the conductor plugs 46 and the surface of the resin layer 120a which have been cut with the cutting tool 40 of diamond or others, are flat.

On the resin layer 120a, the resin layer 126a is formed, burying interconnections 56 and conductor plugs 58. The resin layer 126a is formed of the first layer 122 containing the filler of an inorganic material by the first content ratio, and the second layer 124 formed on the first layer 122 and containing the filler of an inorganic material by a second content ratio which is smaller than the first content ratio.

The base of the first layer 122 is, e.g., epoxy resin. The filler contained in the first layer 122 is, e.g. epoxy. The average particle diameter is, e.g., about 1 µm. The content ratio of the filler of the first layer 122 is, e.g., about 60 wt %.

The base of the second layer 124 is, e.g., epoxy resin. The filler contained in the second layer 124 is, e.g., silica. The average particle diameter is, e.g., about 1 µm. The content ratio of the filler of the second layer 124 is, e.g., about 2.0 wt %. The content ratio of the filler of the second layer 124 is set relatively small in the present embodiment so as to prevent the extreme abrasion, etc. of the cutting tool 40 by the filler in cutting the surface of the resin layer 126 (see FIG. 22A) of the resin film 125 (see FIG. 21A).

The surface of the resin layer 126a and the surfaces of the conductor plugs 58 are cut with the cutting tool 40 of diamond or others, as will be described alter (see FIG. 22A). The surfaces of the conductor plugs 58 and the surface of the resin layer 126a which have been cut with the cutting tool of diamond or others, are flat.

On the resin layer 126a, the resin layer (inter-layer insulation film) 132a is formed, burying interconnections 68 and conductor plugs 70. The resin layer 132a is formed of the first layer 128 containing the filler of an inorganic material by the first content ratio, and the second layer 130 formed on the first layer 128 and containing the filler of an inorganic material by the second content ratio smaller than the first content ratio.

The base of the first layer 128 is, e.g., epoxy resin. The filler contained in the first layer 128 is, e.g., silica. The average particle diameter of the filler is, e.g., about 1 µm. The content ratio of the filler of the first layer 128 is, e.g., about 60 wt %.

The base of the second layer 130 is, e.g., epoxy resin. The material of the filler contained in the second layer 130 is, e.g., silica. The average particle diameter of the filler is, e.g., about 1 µm. The content ratio of the filler of the second layer 130 is, e.g., about 20 wt %. In the present embodiment, the content ratio of the filler of the second layer 130 is set relatively smaller so as to prevent the extreme abrasion, etc. of the cutting tool 40 by the filler in cutting the surface of the resin layer 132 (FIG. 24B) of a resin film 131 (see FIG. 21A).

Figure 24A:
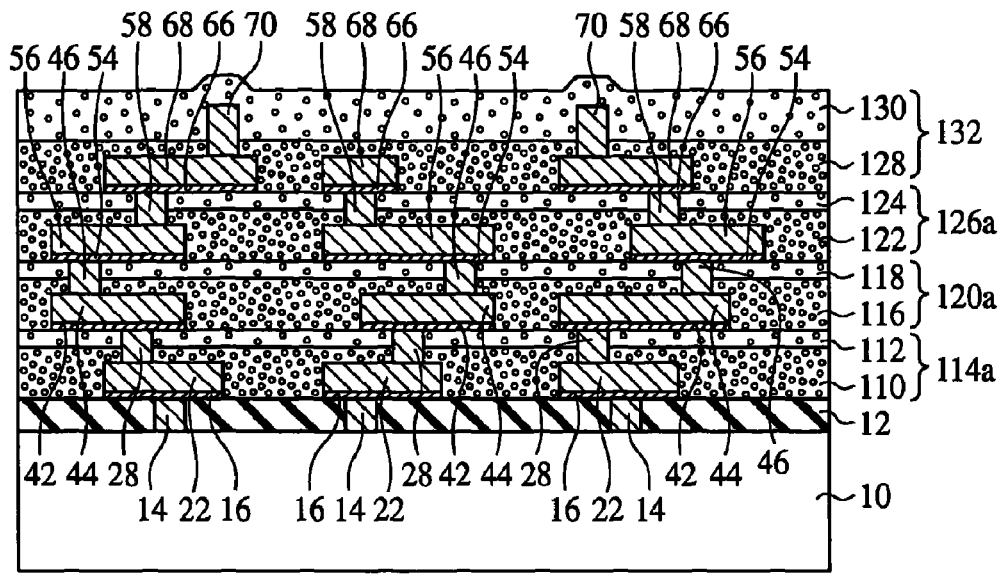
FIGS. 24A and 24B are sectional views of the semiconductor device in the steps of the resin layer formation method and semiconductor device fabrication method according to the second embodiment of the present invention (Part 9).
Figure 24B:
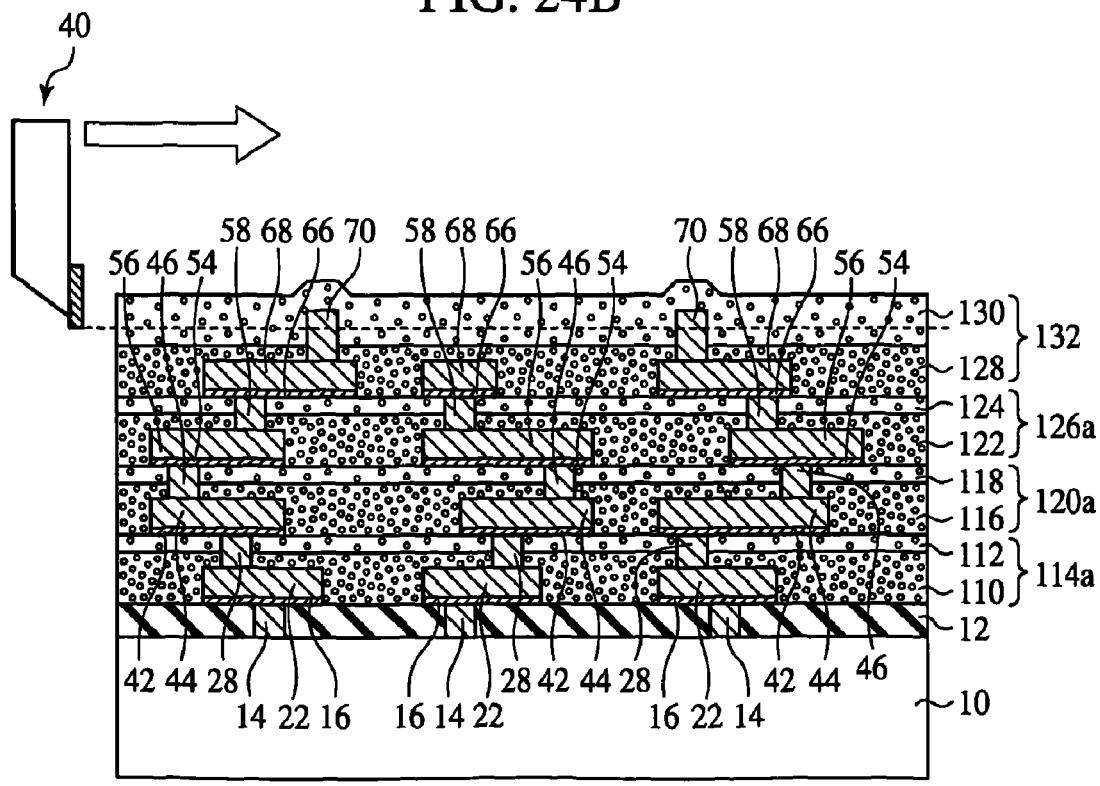

The surface of the resin layer 132a and the surfaces of the conductor plugs 70 are cut with the cutting tool of diamond or others, as will be described later (FIG. 24B). The surfaces of the conductor plugs 70 and the surface of the resin layer 132a, which have been cut with the cutting tool 40 of diamond or others, are flat.

On the planarized resin layer 132a, a plurality of electrodes 80 are formed. The electrodes 80 can function as, e.g., bonding pads. On the underside of the electrodes 80, the seed layer 78 used in forming the interconnections 80 by electroplating is present.

Thus, the semiconductor device of the multi-layer interconnection structure including a plurality of resin layers 114a, 120a, 126a, 132a and a plurality of interconnection layers 22, 44, 56, 68 is formed.

The semiconductor device according to the present embodiment is characterized mainly in that, as described above, the first layers 110, 116, 122, 128 of the resin layers 114a, 120a, 126a, 132a contain the filler of an inorganic material by the first content ratio, and the second layers 112, 118, 124, 130 of the resin layers 114a, 120a, 126a, 132a contain the filler of an inorganic material by the second content ratio smaller than the first content ratio.

In the present embodiment, the filler of an inorganic material is contained not only in the first layers 110, 116, 122, 128 but also in the second layers 112, 118, 124, 130, whereby the difference in the thermal expansion coefficient between the resin layers 114a, 120a, 126a, 132a and the semiconductor substrate 10 can be small.

Furthermore, according to the present embodiment, the content ratio of the filler contained in the second layers 112, 118, 123, 130 is set relatively small, whereby the extreme abrasion, etc. of the cutting tool 40 by the filler can be suppressed.

(The Resin Layer Formation Method and the Semiconductor Device Fabrication Method)

Next, the resin layer formation method according to the present embodiment and the semiconductor device fabrication method using the resin layer formation method will be explained with reference to FIGS. 16A to 25B. FIGS. 16A to 25B are sectional views of the semiconductor device in the steps of the resin layer formation method and the semiconductor device fabrication method, which illustrate the methods.

Figure 16A:
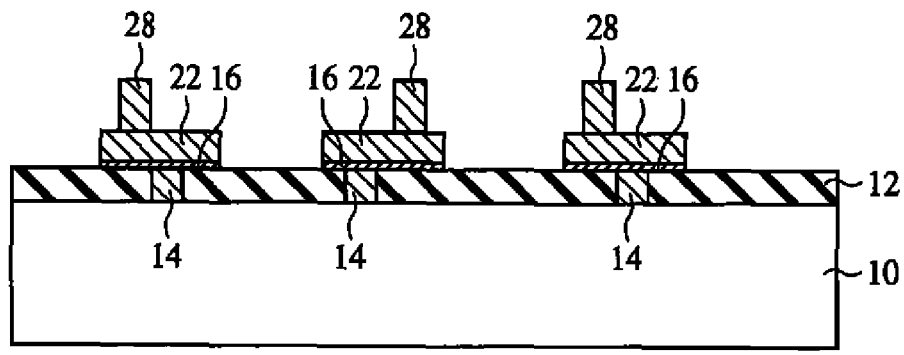
FIGS. 16A to 16C are sectional views of the semiconductor device in the steps of the resin layer formation method and semiconductor device fabrication method according to the second embodiment of the present invention (Part 1).

The step of preparing the semiconductor substrate 10 to the step of forming the conductor plugs 28 including the conductor plugs 28 forming step are the same as those of the semiconductor device fabrication method according to the first embodiment illustrated in FIGS. 2A to 4A, and their explanation will not be repeated (see FIG. 16A).

Figure 16B:
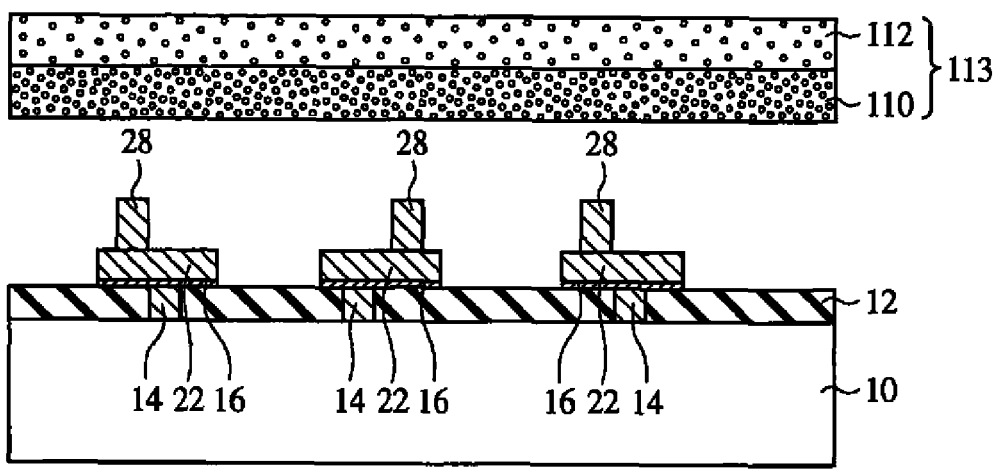
Figure 16C:
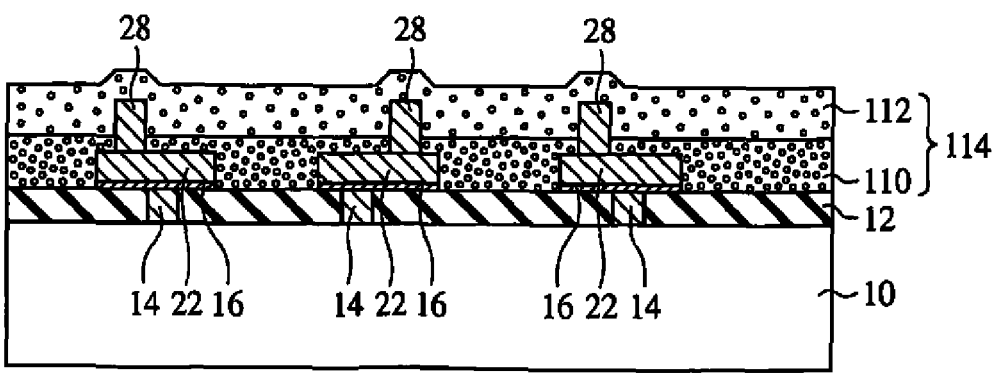

Then, as illustrated in FIG. 16B, the resin film 113 is mounted on the semiconductor substrate 10. The resin film 113 has the two-layer structure of the first layer 110 containing the filler for decreasing the thermal expansion coefficient by the first content ratio and the second layer 112 contain the filler by the second content ratio smaller than the first content ratio which are laid the latter on the former. In other words, the resin film 113 having the filler for decreasing the thermal expansion coefficient localized in the side nearer to the substrate is used.

The base of the first layer 110 is, e.g., epoxy resin. The filler contained in the first layer 110 is, e.g., an inorganic material, e.g., silica or others. The average particle diameter of the filler is, e.g., about 1 µm. The content ratio of the filler of the first layer 110 is, e.g., 60 wt %. The thickness of the first layer 30 is, e.g., 10 µm. The first layer 110 of the resin film 113 contains the filler so as to make the difference in the thermal expansion coefficient between the resin layer 114 (see FIG. 16C) of the resin film 113 and the semiconductor substrate 10.

The base of the second layer 112 is, e.g., epoxy resin. The thickness of the second layer 32 is, e.g., 10 µm. The filler contained in the second layer 112 is, e.g., an inorganic material, e.g., silica or others. The average particle diameter of the filler is, e.g., about 1 µm. The content ratio of the filler of the first layer 112 is, e.g., about 20 wt %. The content ratio of the filler of the second layer 112 is set relatively small so as to prevent the extreme abrasion, etc. of the cutting tool 40 in cutting the surface of the resin layer 114 (see FIG. 16C) of the resin film 113.

The content ratio of the second layer 112 is about 20 wt % here. However, the content ratio of the filler of the second layer 112 is not essentially about 20 wt %. When the content ratio of the filler of the second layer 112 is set relatively large, however, the abrasion, etc. of the cutting tool 40 easily take place in cutting the resin layer 114. To prevent the extreme abrasion, etc. of the cutting tool 40 it is preferable to set the content ratio of the filler of the second layer 112 at 30 wt % or below.

Next, the resin film 113 is adhered, by a vacuum press apparatus, to the semiconductor substrate 10 with the inter-layer insulation film 12, etc. formed on. The conditions for the vacuum press are as exemplified below. The vacuum period time is, e.g., about 60 seconds. The temperature at which the vacuum press is made is, e.g., about 130° C. The pressure for the vacuum press is, e.g., about 1 Mpa. The forming period of time with the vacuum press is, e.g., 60 seconds. Thus, the resin layer 114 of the resin film 113 is formed on the semiconductor substrate 10 (see FIG. 16C)

Then, thermal processing is made to cure the resin layer 114. The thermal processing conditions are, e.g., 190° C. and 1 hour. In the present embodiment, the first layer 110 contains the filler, but the second layer 112 also contains the filler of a relatively smaller thermal expansion coefficient, whereby the difference in the thermal expansion coefficient between the semiconductor substrate 10 and the resin layer 114 can be smaller. Thus, according to the present embodiment, the stress to be exerted on the semiconductor substrate 10, etc. due to the difference in the thermal expansion coefficient between the semiconductor substrate 10 and the resin layer 114 can be made smaller.

Next, the semiconductor substrate 10 is fixed to the chuck table 38 of a superprecision lathe 36 (see FIG. 5A) by vacuum adsorption.

Figure 17A:
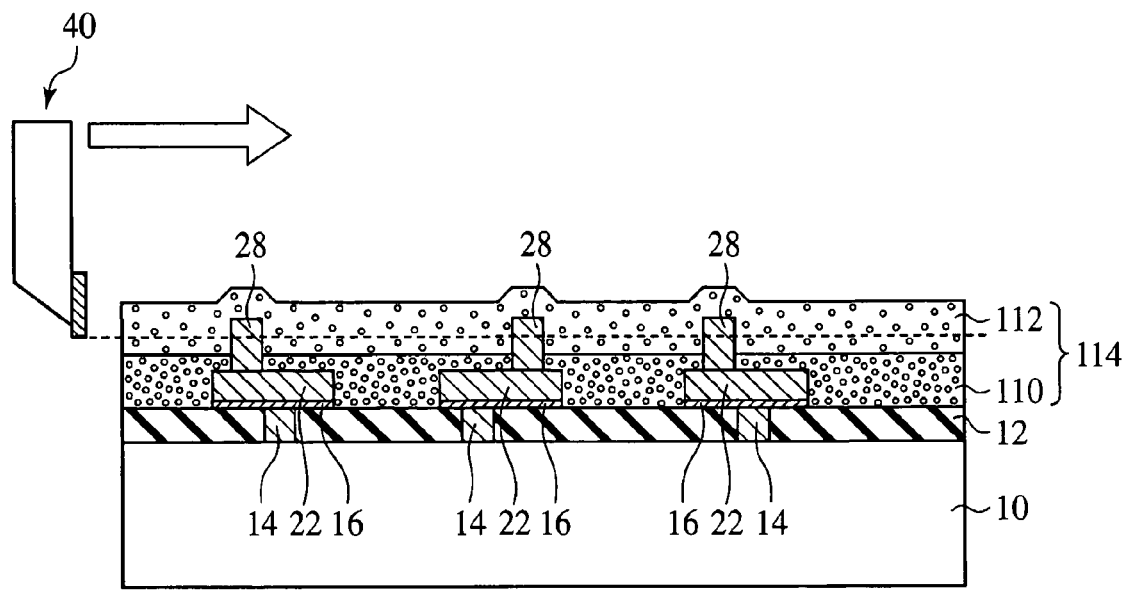
FIGS. 17A and 17B are sectional views of the semiconductor device in the steps of the resin layer formation method and semiconductor device fabrication method according to the second embodiment of the present invention (Part 2).

Next, with the semiconductor substrate 10 set on rotation, the surface of the resin layer 114 and upper parts of the conductor plugs 28 are cut with the cutting tool 40 of diamond until the thickness of the resin layer 114 becomes, e.g., about 13 μm (see FIG. 17A).

The conditions for cutting the surface of the resin layer 114 are the same as those for cutting, e.g., the surface of the resin layer 34. That is, the rake angle of the cutting tool 40 is 0 degree. The rotation number of the chuck table is, e.g., about 1000 rpm. When the surface of the resin layer 114 is cut, the cut is made, e.g., twice to cut the resin layer 114 to a required thickness. In the first cut, the cut amount of the cutting tool 40 is, e.g., about 4 μm. The cut amount of the cutting tool 40 in the second cut is about, e.g., 3 μm. The feed of the cutting tool 40 is, e.g., 20 μm/second.

In the present embodiment, although the second layer 112 containing the filler of an inorganic material is cut with the cutting tool 40, the content ratio of the filler of the second layer 112 is set relatively small, and the extreme abrasion, etc. of the cutting tool 40 never take place.

Figure 17B:
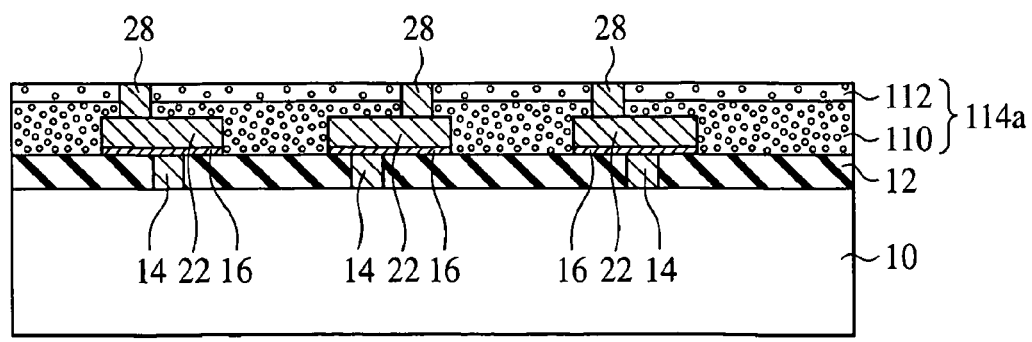

Thus, as illustrated in FIG. 17B, the surface of the resin layer 114a is planarized. In this specification, the resin layer after cut is called the resin layer 114a to be discriminated from the resin layer 114 before cut.

Figure 18A:
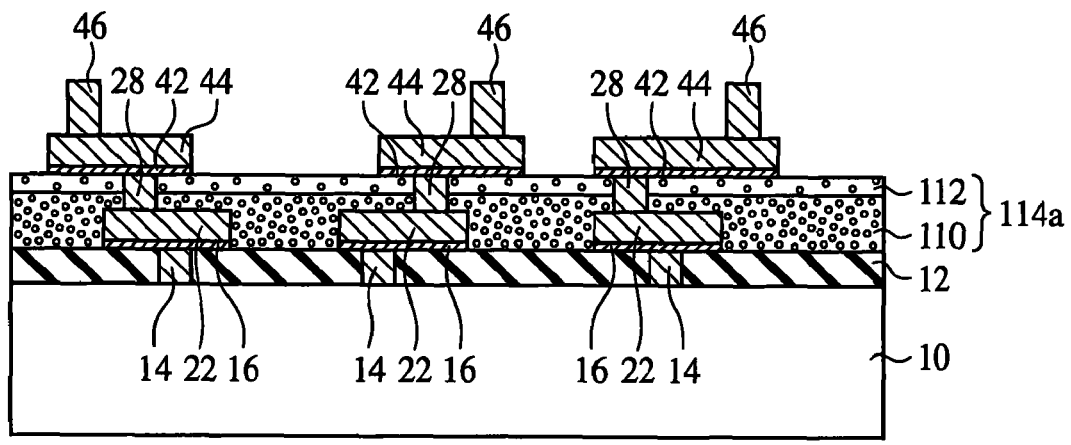
FIGS. 18A and 18B are sectional views of the semiconductor device in the steps of the resin layer formation method and semiconductor device fabrication method according to the second embodiment of the present invention (Part 3).

Then, the interconnections 44 and the conductor plugs 46 are formed in the same way as in the semiconductor device fabrication method according to the first embodiment described above with reference to FIG. 6B (see FIG. 18A).

Figure 18B:
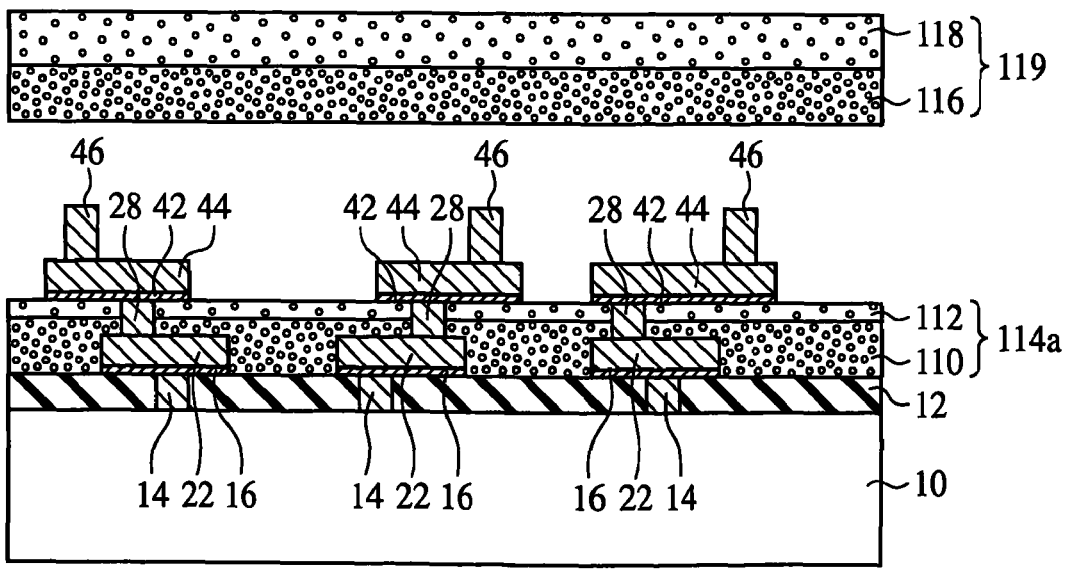

Next, as illustrated in FIG. 18B, the resin film 119 is mounted on the semiconductor substrate 10. The resin film 119 is the same resin film as, e.g., the resin film 113 described above. That is, the resin film 119 has the two-layer structure of the first layer 116 containing the filler of an inorganic material by the first content ratio and the second layer 118 containing the filler of an inorganic material by the second content ratio smaller than the first content ratio.

Next, the resin film 119 is adhered to the resin layer 114a by a vacuum press apparatus. The vacuum press conditions are the same as those for vacuum pressing the resin film 113 and are as exemplified below. The vacuum period of time is, e.g., about 60 seconds. The temperature for the vacuum press is, e.g., about 130° C. The pressure for the vacuum press is, e.g., about 1 MPa. The period of time of the vacuum press forming is, e.g., 60 seconds. Thus, on the resin layer 114a with the interconnections 44, the conductor plugs 46, etc. formed on, the resin layer 120 of the resin film 119 is formed (see FIG. 19A).

Next, the thermal processing is made to cure the resin layer 120. The thermal processing conditions are the same as those for curing the resin layer 114 described above, e.g., 190° C. and 1 hour. The first layer 116 contains the filler, but the second layer 118 also contains the filler of a relatively smaller than expansion coefficient, which can make the difference in the thermal expansion coefficient between the semiconductor substrate 10 and the resin layer 120 small. Thus, according to the present embodiment, the stresses exerted on the semiconductor substrate 10, etc. due the difference in the thermal expansion coefficient between the semiconductor substrate 10 and the resin layer 120 can be made smaller.

Next, the semiconductor substrate 10 is fixed to the chuck table 38 of the superprecision lathe 36 (see FIG. 8A) by vacuum absorption.

Figure 19A:
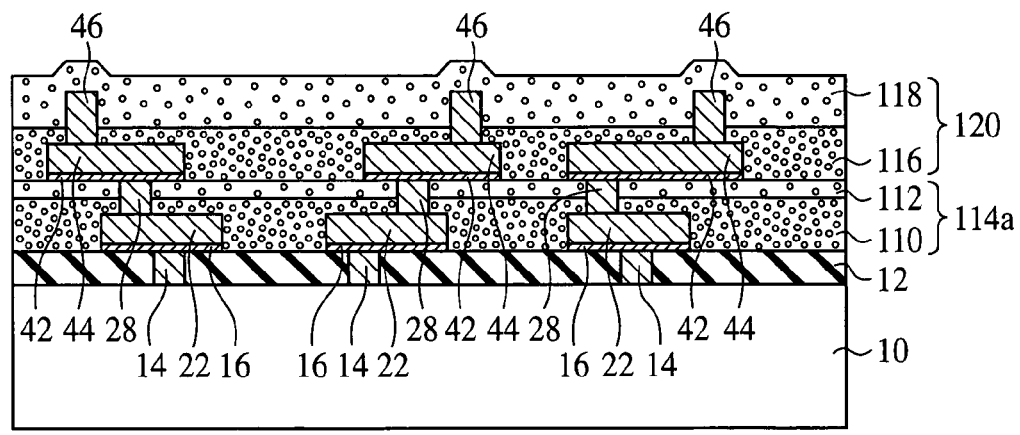
FIGS. 19A and 19B are sectional views of the semiconductor device in the steps of the resin layer formation method and semiconductor device fabrication method according to the second embodiment of the present invention (Part 4).
Figure 19B:
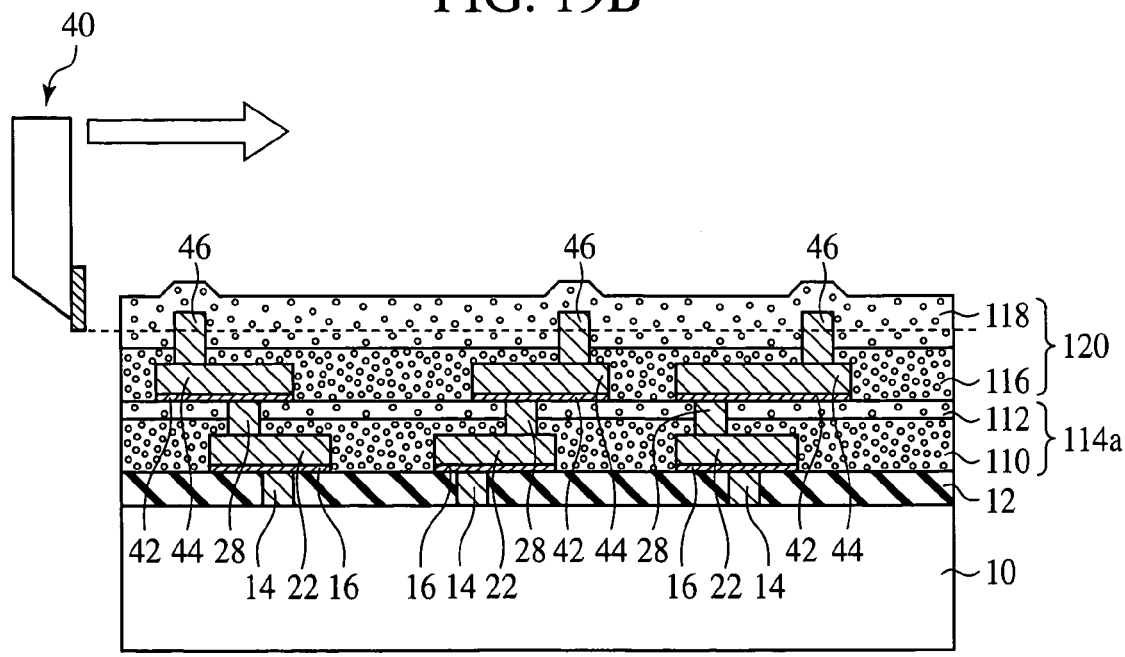

Then, with the semiconductor substrate 10 set on rotation, the surface of the resin layer 120 and upper parts of the conductor plugs 46 are cut with the cutting tool 40 of diamond until the thickness of the resin layer 120 becomes, e.g., about 13 μm (see FIG. 19B). The conditions for cutting the surface of the resin layer 120 are the same as those for cutting, e.g., the surface of the resin layer 114.

In the present embodiment, although the second layer 118 containing the filler of an inorganic material is cut with the cutting tool 40, the content ratio of the filler of the second layer 118 is set relatively small, and the extreme abrasion, etc. of the cutting tool by the filler never take place.

Figure 20A:
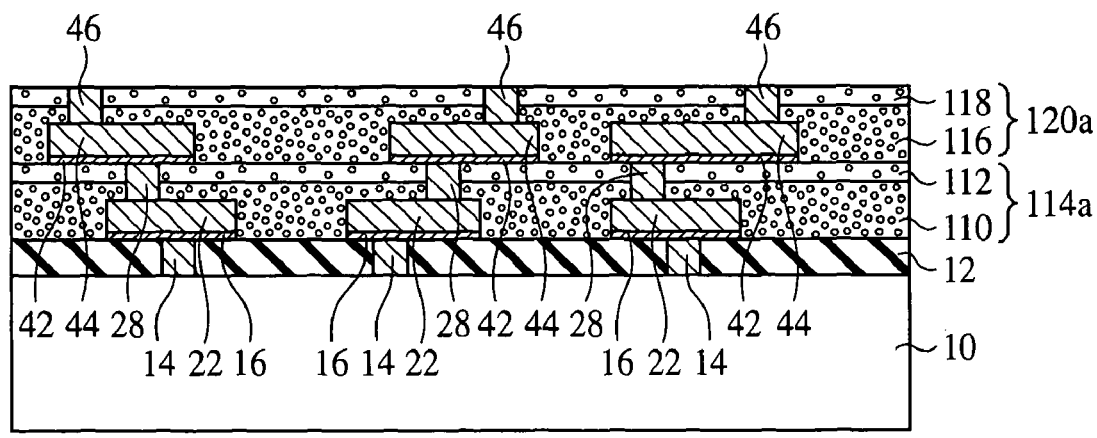
FIGS. 20A and 20B are sectional views of the semiconductor device in the steps of the resin layer formation method and semiconductor device fabrication method according to the second embodiment of the present invention (Part 5).

Thus, as illustrated in FIG. 20A, the surface of the resin layer 120a is planarized. In the specification, the resin layer after cut is called the resin layer 120a to be discriminated from the resin layer 120 before cut.

Figure 20B:
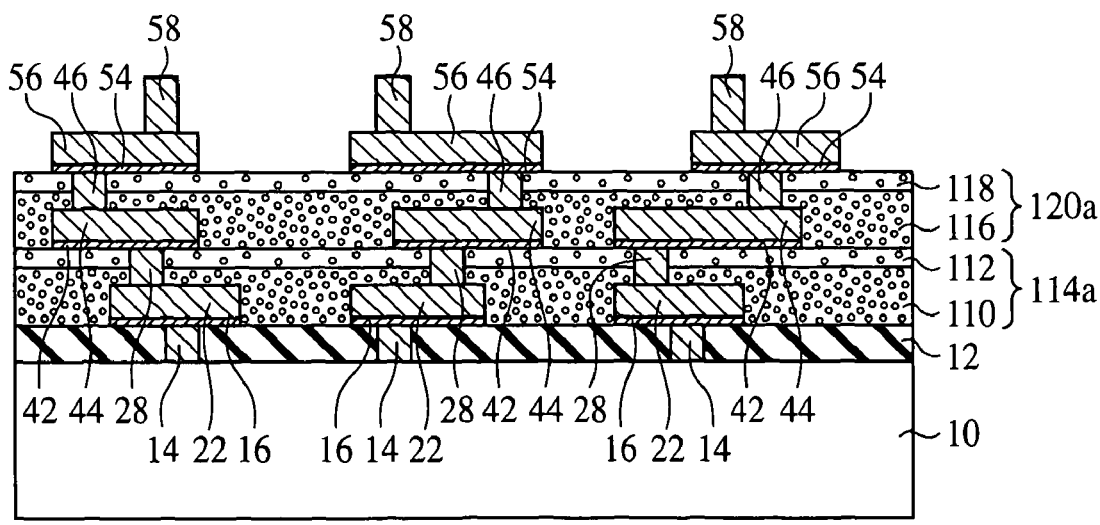

Then, in the same as the semiconductor device fabrication method according to the first embodiment described above with reference to FIG. 9B, the interconnections 56 and the conductor plugs 58 are formed (see FIG. 20B).

Figure 21A:
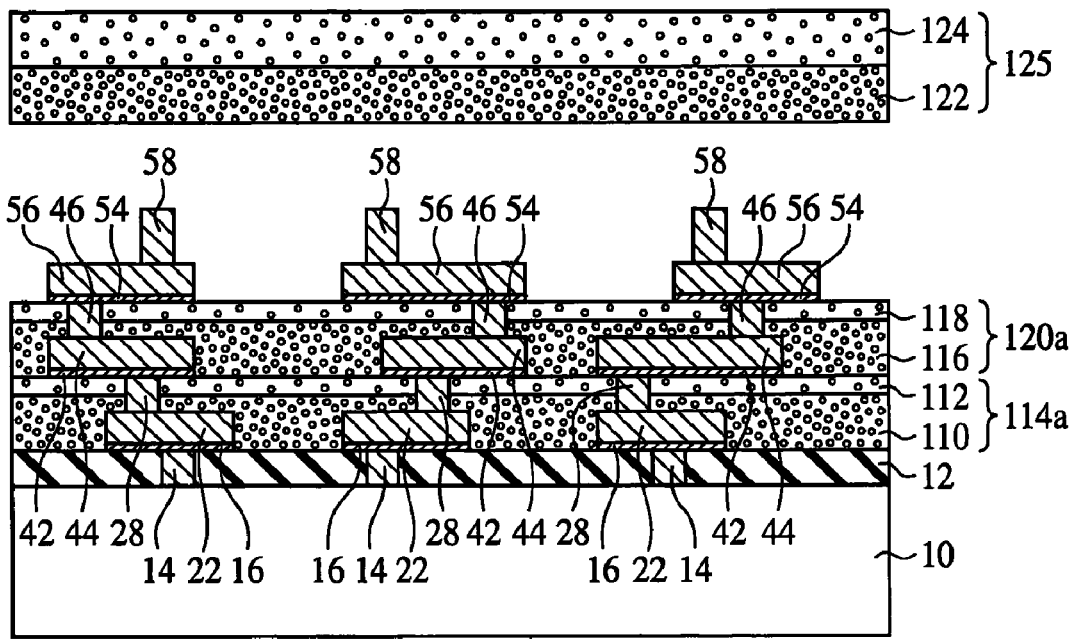
FIGS. 21A and 21B are sectional views of the semiconductor device in the steps of the resin layer formation method and semiconductor device fabrication method according to the second embodiment of the present invention (Part 6).
Figure 21B:
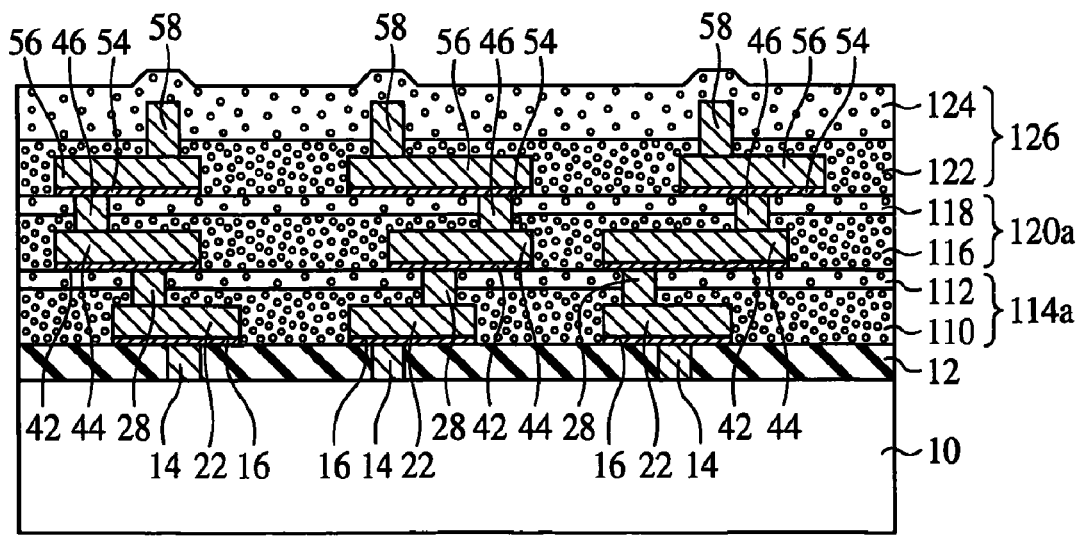

Then, as illustrated in FIG. 21A, the resin film 125 is mounted on the semiconductor substrate 10. The resin film 125 is the same as, e.g., the resin film 113 described above. That is, the resin film 125 has the two-layer structure of the first layer 122 containing the filler of an inorganic material by the first content ratio and the second layer 124 containing the filler of an inorganic material by the second content ratio smaller than the first content ratio.

Next, the resin film 125 is adhered to the resin layer 120a with a vacuum press apparatus. The conditions for the vacuum press are the same as those for vacuum pressing the resin layer 113 and are as exemplified below. The vacuum period of time is, e.g., about 60 seconds. The temperature for the vacuum press is, e.g., about 130° C. The pressure for the vacuum press is, e.g., about 1 MPa. The period of time of the vacuum press forming is, e.g., 60 seconds. Thus, on the resin layer 120a with the interconnections 56, the conductor plugs 58, etc. formed on, the resin layer 126 of the resin film 125 is formed (see FIG. 21B).

Then, thermal processing is made to cure the resin layer 126. The thermal processing conditions are the same as those for curing the resin layer 114 described above, e.g., 190° C. and 1 hour. In the present embodiment, the first layer 122 contains the filler, but the second layer 124 also contains the filler of a relatively smaller than expansion coefficient, which can make the difference in the thermal expansion coefficient between the semiconductor substrate 10 and the resin layer 126 small. Thus, according to the present embodiment, the stresses exerted on the semiconductor substrate 10, etc. due to the difference in the thermal expansion coefficient between the semiconductor substrate 10 and the resin layer 126 can be made smaller.

Next, the semiconductor substrate 10 is fixed to the chuck table 38 of the superprecision lathe 36 (see FIG. 8A) by vacuum absorption.

Figure 22A:
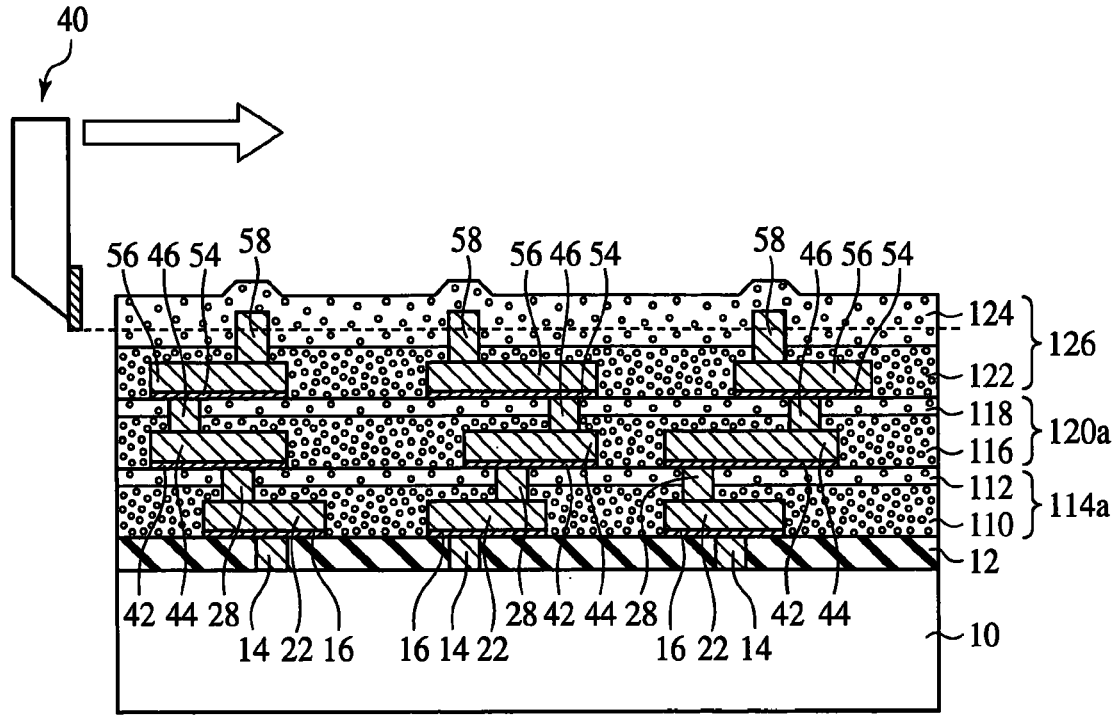
FIGS. 22A and 22B are sectional views of the semiconductor device in the steps of the resin layer formation method and semiconductor device fabrication method according to the second embodiment of the present invention (Part 7).

Then, with the semiconductor substrate 10 set on rotation, the surface of the resin layer 126 and upper parts of the conductor plugs 58 are cut with the cutting tool 40 of diamond until the thickness of the resin layer 126 becomes, e.g., about 13 μm (see FIG. 22A).

The conditions for cutting the surface of the resin layer 126 are the same as those for cutting, e.g., the surface of the resin layer 114.

In the present embodiment, although the second layer 124 containing the filler of an inorganic material is cut with the cutting tool 40, the content ratio of the filler of the second layer 124 is set relatively small, and the extreme abrasion, etc. of the cutting tool 40 by the filler never take place.

Figure 22B:
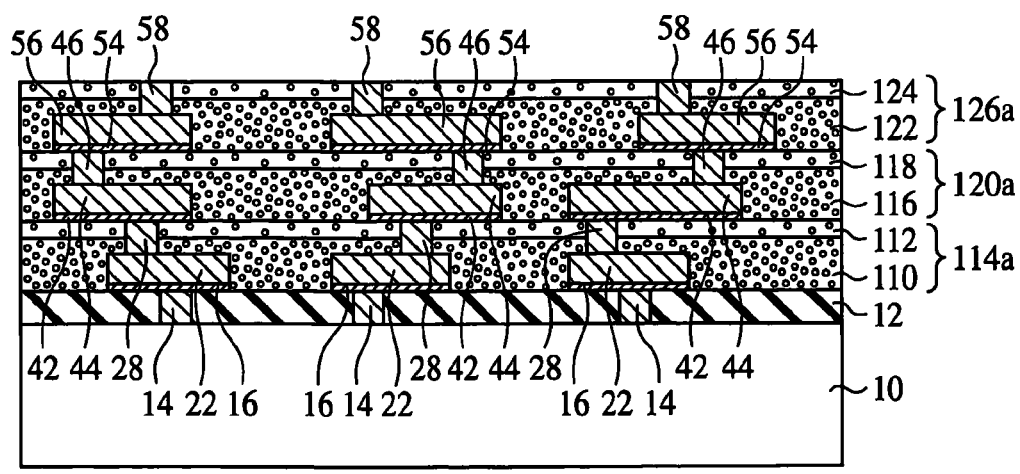

Thus, as illustrated in FIG. 22B, the surface of the resin layer 126a is planarized. In the specification, the resin layer after cut is called the resin layer 126a to be discriminated from the resin layer 126 before cut.

Figure 23A:
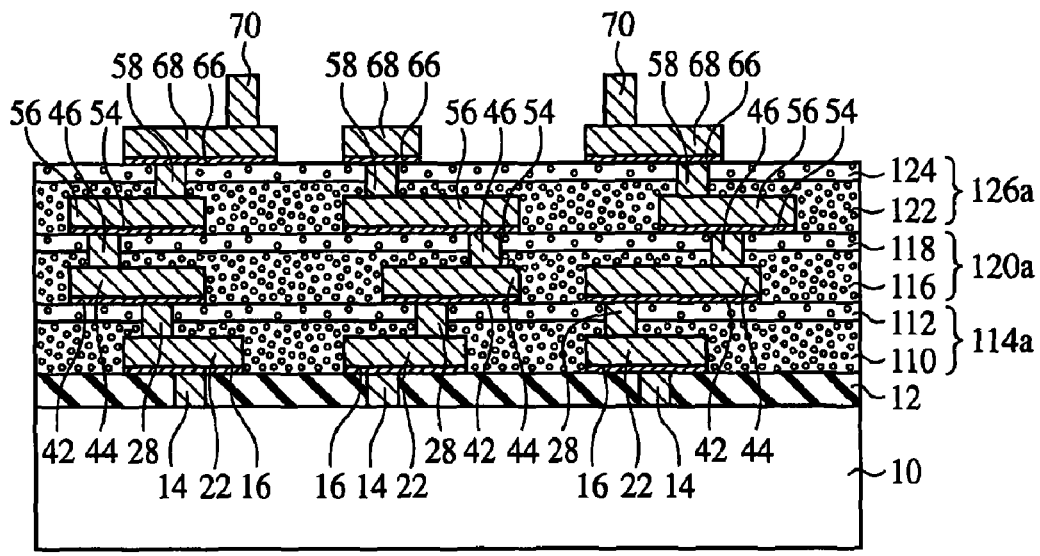
FIGS. 23A and 23B are sectional views of the semiconductor device in the steps of the resin layer formation method and semiconductor device fabrication method according to the second embodiment of the present invention (Part 8).

Then, in the same as the semiconductor device fabrication method according to the first embodiment described above with reference to FIG. 12A, the interconnections 68 and the conductor plugs 70 are formed (see FIG. 23A).

Figure 23B:
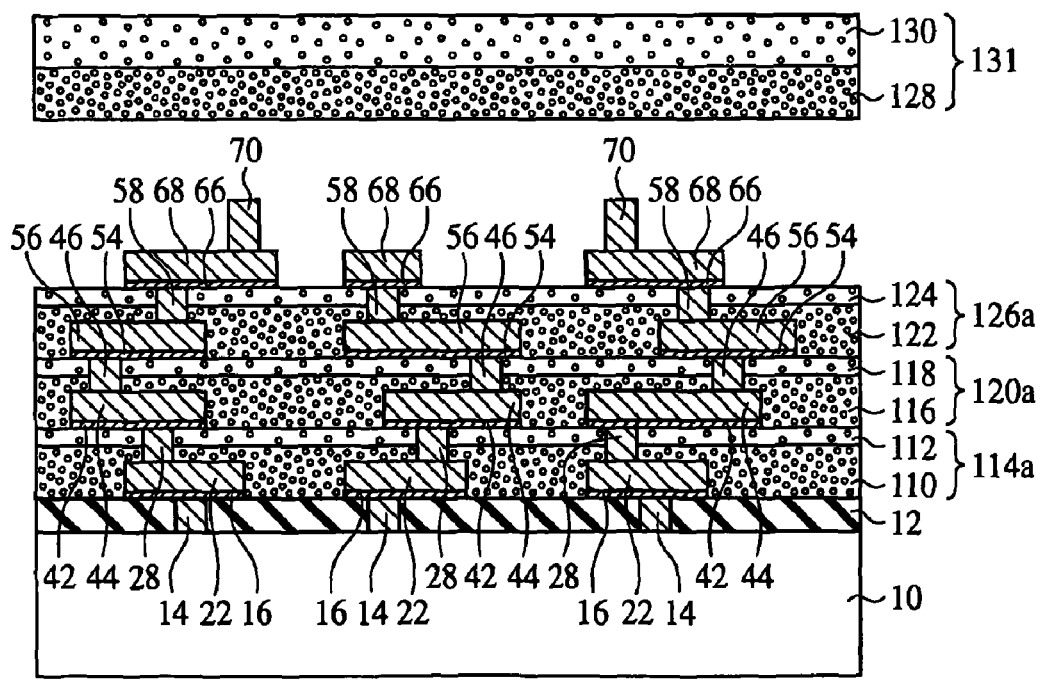

Then, as illustrated in FIG. 23B, the resin film 131 is mounted on the semiconductor substrate 10. The resin film 131 is the same as, e.g., the resin film 113 described above. That is, the resin film 131 has the two-layer structure of the first layer 128 containing the filler of an inorganic material by the first content ratio and the second layer 130 containing the filler of an inorganic material by the second content ratio smaller than the first content ratio.

Next, the resin film 131 is adhered to the resin layer 126a with a vacuum press (FIG. 24A). The conditions for the vacuum press are the same as those for vacuum pressing the resin layer 113 and are as exemplified below. The vacuum period of time is, e.g., about 60 seconds. The temperature for the vacuum press is, e.g., about 130° C. The pressure for the vacuum press is, e.g., about 1 MPa. The period of time of the vacuum press forming is, e.g., 60 seconds. Thus, on the resin layer 126a with the interconnections 68, the conductor plugs 70, etc. formed on, the resin layer 132 of the resin film 131 is formed (see FIG. 24A).

Then, thermal processing is made to cure the resin layer 132. The thermal processing conditions are the same as those for curing the resin layer 114 described above, e.g., 190° C. and 1 hour. In the present embodiment, the first layer 128 contains the filler, but the second layer 130 also contains the filler of a relatively smaller than expansion coefficient, which can make the difference in the thermal expansion coefficient between the semiconductor substrate 10 and the resin layer 132 small. Thus, according to the present embodiment, the stresses exerted on the semiconductor substrate 10, etc. due the difference in the thermal expansion coefficient between the semiconductor substrate 10 and the resin layer 132 can be made smaller.

Next, the semiconductor substrate 10 is fixed to the chuck table 38 of the superprecision lathe 36 (see FIG. 8A) by vacuum absorption.

Then, with the semiconductor substrate 10 set on rotation, the surface of the resin layer 130 and upper parts of the conductor plugs 70 are cut with the cutting tool 40 of diamond until the thickness of the resin layer 132 becomes, e.g., about 13 μm (see FIG. 24B). The conditions for cutting the surface of the resin layer 132 are the same as those for cutting, e.g., the surface of the resin layer 114.

In the present embodiment, although the second layer 130 containing the filler of an inorganic material is cut with the cutting tool 40, the content ratio of the filler of the second layer 130 is set relatively small, and the extreme abrasion, etc. of the cutting tool 40 by the filler never take place.

Figure 25A:
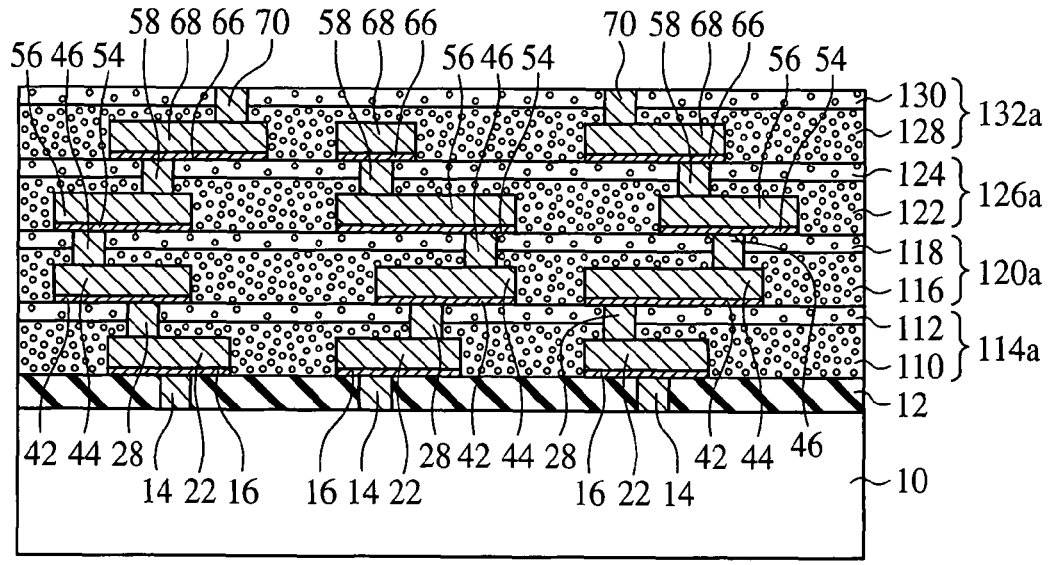
FIGS. 25A and 25B are sectional views of the semiconductor device in the steps of the resin layer formation method and semiconductor device fabrication method according to the second embodiment of the present invention (Part 10).
Figure 25B:
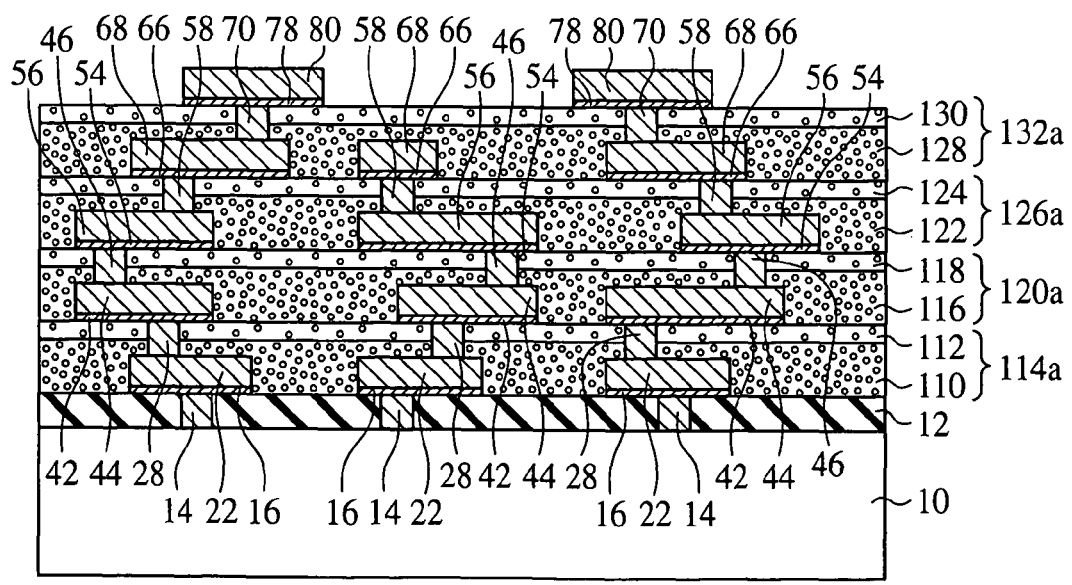

Thus, as illustrated in FIG. 25A, the surface of the resin layer 132a is planarized. In the specification, the resin layer after cut is called the resin layer 132a to be discriminated from the resin layer 132 before cut.

Next, in the same way as in the semiconductor device fabrication method according to the first embodiment described above with reference to FIG. 14B, the electrodes 80 are formed.

Thus, the semiconductor device according to the present embodiment is fabricated by the resin layer formation method according to the present embodiment.

According to the present embodiment, not only the first layers 110, 116, 122, 128, but also the second layers 112, 118, 124, 130 contain the filler of an inorganic material, whereby the difference in the thermal expansion coefficient between the resin layers 114a, 120a, 126a, 132a and the semiconductor substrate 10 can be made smaller. Thus, according to the present embodiment, the stresses exerted on the semiconductor substrate 10 due to the difference in the thermal expansion coefficient between the resin layers 114a, 120a, 126a, 132a and the semiconductor substrate 10 can be decreased.

Furthermore, according to the present embodiment, the content ratio of the filler contained in the second layers 112, 118, 124, 130 is set relatively small, whereby the extreme abrasion, etc. of the cutting tool 40 by the filler can be suppressed.

A Third Embodiment

Figure 26:
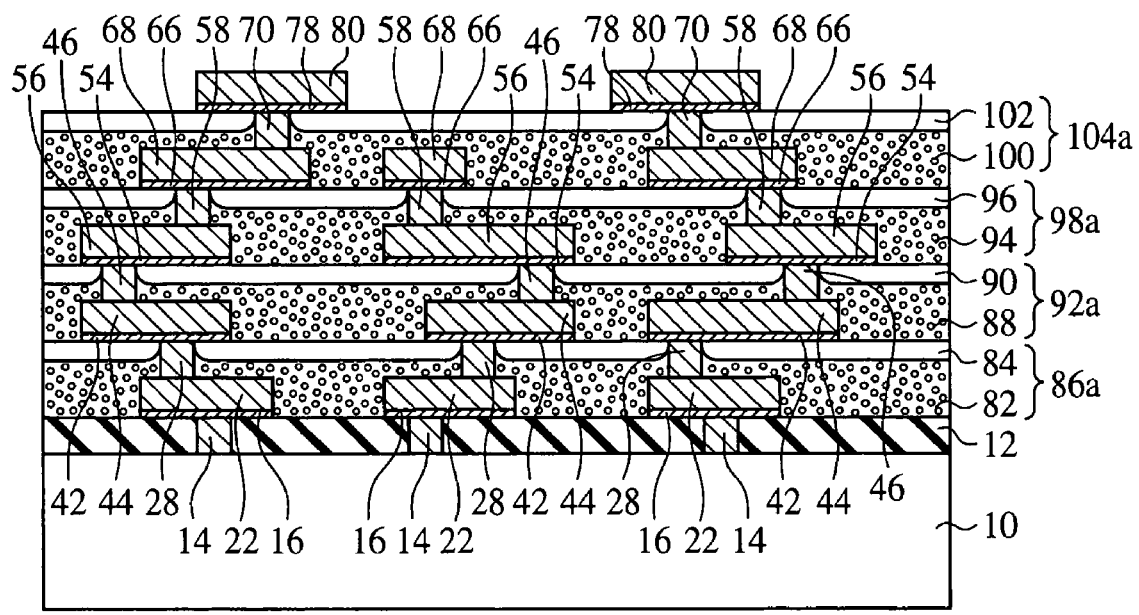
FIG. 26 is sectional views of the semiconductor device according to a third embodiment of the present invention.

The resin layer formation method according to a third embodiment of the present invention, the semiconductor device using the resin layer formation method and the semiconductor device fabrication method will be explained with reference to FIGS. 26 to 35. FIG. 26 is a sectional view of the semiconductor device according to the present embodiment. The same members of the present embodiment as those of the resin layer formation method according to the first or the second embodiment, the semiconductor device using the resin layer formation method and the semiconductor device fabrication method are represented by the same reference numbers not to repeat or to simplify their explanation.

(The Semiconductor Device)

The semiconductor device according to the present embodiment is characterized mainly in that first layers 82, 88, 94, 100 and second layers 84, 90, 96, 102 forming resin layers 96a, 92a, 98a, 104a are formed by spin coating.

As illustrated in FIG. 26, the resin layer (inter-layer insulation film) 86a is formed on an inter-layer insulation film 12, burying interconnections 22 and conductor plugs 28. The resin layer 86a is formed of the first layer 82 containing a filler for decreasing the thermal expansion coefficient and the second layer 84 formed on the first layer 82 and containing no such filler for decreasing the thermal expansion coefficient. In other words, the resin layer 86*a* having the filler for decreasing the thermal expansion coefficient localized in the side nearer to the semiconductor substrate 10 is formed. The first layer 82 and the second layer 84 are both formed by spin coating. The base of the first layer 82 is, e.g., epoxy resin. The filler contained in the first layer 82 is, e.g., an inorganic material of, e.g., silica or others. The average particle diameter of the filler is, e.g., about 1 µm. The content ratio of the filler of the first layer 82 is, e.g., about 60 wt %. The second layer 84 is formed of, e.g., epoxy resin.

The surface of the resin layer 86*a* and the surfaces of the conductor plugs 28 are cut with a cutting tool 40 (see FIGS. 28A and 28B) of diamond or others, as will be described later. The surfaces of the conductor plugs 28 and the surface of the resin layer 86*a*, which have been cut with the cutting tool 40 of diamond or others, are flat.

On the resin layer 86*a*, the resin layer (inter-layer insulation film) 92*a* is formed, burying interconnections 44 and conductor plugs 46. The resin layer 92*a* is formed of the first layer 88 containing a filler of inorganic material and the second layer 90 formed on the first layer 88 and containing no filler of inorganic material. The first layer 88 and the second layer 90 are formed by spin coating. The base of the first layer 88 is, e.g., epoxy resin. The filler contained in the first layer 88 is, e.g., silica. The average particle diameter of the filler is, e.g., about 1 µm. The content ratio of the filler of the first layer 88 is, e.g., about 60 wt %. The base of the second layer 90 is, epoxy resin.

The surface of the resin layer 92*a* and the surfaces of the conductor plugs 46 are cut with a cutting tool 40 of diamond (see FIG. 30A), as will be described later. The surfaces of the conductor plugs 46 and the surface of the resin layer 92*a*, which have been cut with the cutting tool 40 of diamond or others, are flat.

On the resin layer 92*a*, the resin layer (inter-layer insulation film) 98*a* is formed, burying interconnections 56 and conductor plugs 58. The resin layer 98*a* is formed of the first layer 94 containing a filler of an inorganic material and the second layer 96 formed on the first layer 94 and containing no filler of an inorganic material. The first layer 94 and the second layer 96 are formed by spin coating. The base of the first layer 94 is, e.g., epoxy resin. The filler contained in the first layer 94 is, e.g., silica. The average particle diameter of the filler is, e.g., about 1 µm. The content ratio of the filler of the first layer 94 is, e.g., about 60 wt %. The base of the second layer 96 is, epoxy resin.

The surface of the resin layer 98*a* and the surfaces of the conductor plugs 58 are cut with a cutting tool 40 of diamond (see FIG. 32A), as will be described later. The surfaces of the conductor plugs 58 and the surface of the resin layer 98*a*, which have been cut with the cutting tool 40 of diamond or others, are flat.

On the resin layer 98*a*, the resin layer (inter-layer insulation film) 104*a* is formed, burying interconnections 68 and conductor plugs 70. The resin layer 104*a* is formed of the first layer 100 containing a filler of an inorganic material and the second layer 102 formed on the first layer 100 and containing no filler of an inorganic material. The first layer 100 and the second layer 102 are formed by spin coating. The base of the first layer 100 is, e.g., epoxy resin. The filler contained in the first layer 100 is, e.g., silica. The average particle diameter of the filler is, e.g., about 1 µm. The content ratio of the filler of the first layer 100 is, e.g., about 60 wt %. The base of the second layer 102 is, epoxy resin.

The surface of the resin layer 104*a* and the surfaces of the conductor plugs 70 are cut with a cutting tool 40 of diamond (see FIG. 34A), as will be described later. The surfaces of the conductor plugs 70 and the surface of the resin layer 104*a*, which have been cut with the cutting tool 40 of diamond or others, are flat.

On the planarized resin layer 104*a*, a plurality of electrodes 80 are formed. On the underside of the electrodes 80, a seed layer 78 used in forming the electrodes 80 by electroplating is present.

Thus, the semiconductor device having the multi-layer interconnection structure formed of a plurality of resin layers 86*a*, 92*a*, 98*a*, 104*a* and a plurality of interconnection layers 22, 44, 56, 68 is fabricated.

As in the present embodiment, the first layers 82, 88, 94, 100 and the second layers 84, 90, 96, 102 forming the resin layers 86*a*, 92*a*, 98*a*, 104*a* may be formed by spin coating.

(The Resin Layer Formation Method and the Semiconductor Device Fabrication Method)

Next, the resin layer formation method according to the present embodiment, and the semiconductor device fabrication method using the resin layer formation method will be explained with reference to FIGS. 27A to 35. FIGS. 27A to 35 are views of the semiconductor device in the steps of the resin layer formation method and the semiconductor device fabrication method according to the present embodiment. FIGS. 27A to 27B and FIGS. 28B to 35 are sectional views, and FIG. 28A is a perspective view.

Figure 27A:
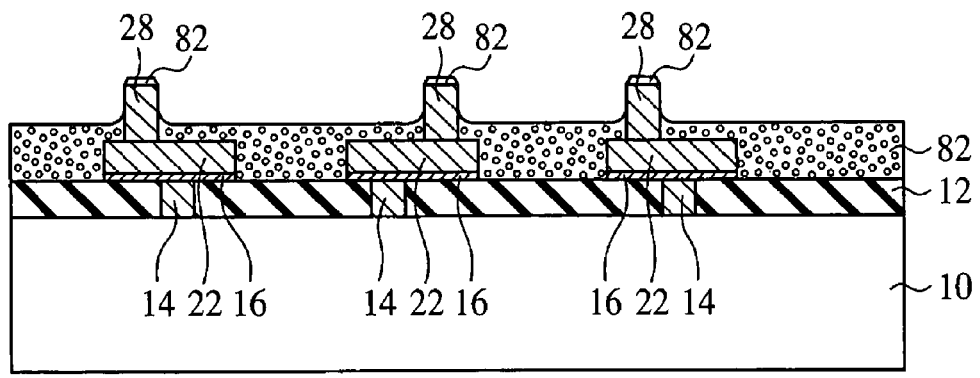
FIGS. 27A and 27B are views of the semiconductor device in the steps of the resin layer formation method and semiconductor device fabrication method according to the third embodiment of the present invention (Part 1).
Figure 28A:
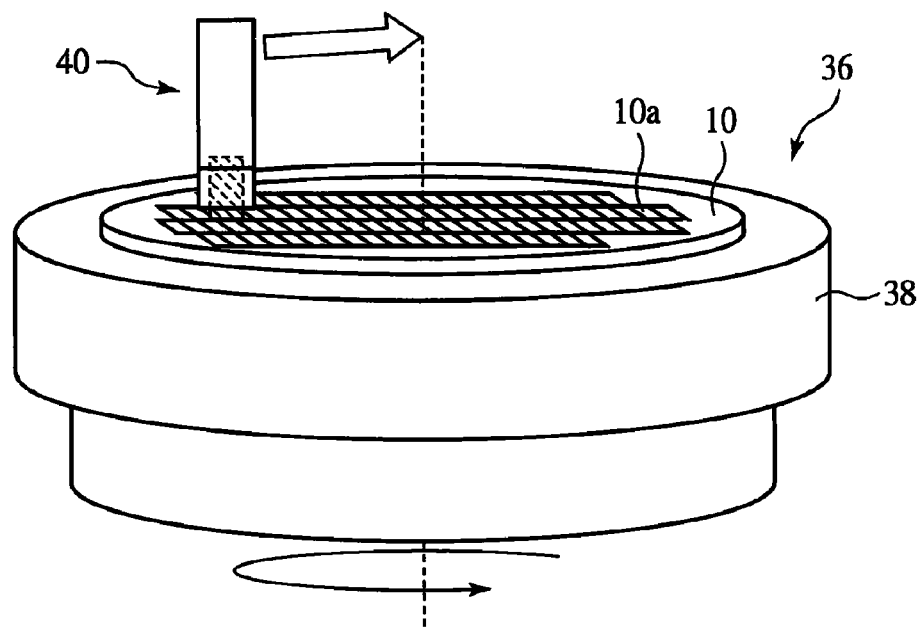
FIGS. 28A and 28B are views of the semiconductor device in the steps of the resin layer formation method and semiconductor device fabrication method according to the third embodiment of the present invention (Part 2).

The step of preparing the semiconductor substrate 10 to the step of forming the conductor plugs 28 including the conductor plugs 28 forming step are the same as those of the semiconductor device fabrication method according to the first embodiment illustrated in FIGS. 2A to 4A, and their explanation will not be repeated (see FIG. 27A).

Then, as illustrated in FIG. 27A, the first layer 82 is formed on the entire surface by, e.g., spin coating. The material of the first layer 82 is, e.g., an epoxy resin solution containing, e.g., a filler for decreasing the thermal expansion coefficient. The filler contained in the epoxy resin solution is an inorganic material, e.g., silica or others. The average particle diameter of the filler is, e.g., 1 µm.

Next, thermal processing is made to semi-cure the first layer 82. The thermal processing conditions are, e.g., 80-150° C. and 30 minutes to 1 hour. The thickness of the first layer 82 after the thermal processing becomes, e.g., about 10 µm. Thus, the first layer 82 containing the filler by the content ratio of, e.g., about 60 wt % is formed. The difference in the thermal expansion coefficient between the semiconductor substrate 10 and the first layer 82, which contains the filler of a relatively small thermal expansion coefficient, is relatively small. Thus, according to the present embodiment, the stresses exerted on the semiconductor substrate 10, etc. due to the difference in the thermal expansion coefficient between the semiconductor substrate 10 and the first layer 82 can be made relatively small.

Next, on the entire surface, the second layer 84 is formed by, e.g., spin coating. The material of the second layer 84 is, e.g., an epoxy resin solution.

Next, thermal processing is made to semi-cure the second layer 84. The thermal processing conditions are, e.g., 80-150° C. and 30 minutes to 1 hour. The thickness of the second layer 84 after the thermal processing becomes, e.g., about 10 µm after the thermal processing. The difference in the thermal processing between the semiconductor substrate 10 and the first layer 82, which contains the filler of a relatively small thermal expansion coefficient, is relatively small. The stresses exerted on the semiconductor substrate 10, etc. due to the difference in the thermal expansion coefficient between the semiconductor substrate 10 and the resin layer 86 can be made relatively small.

Figure 27B:
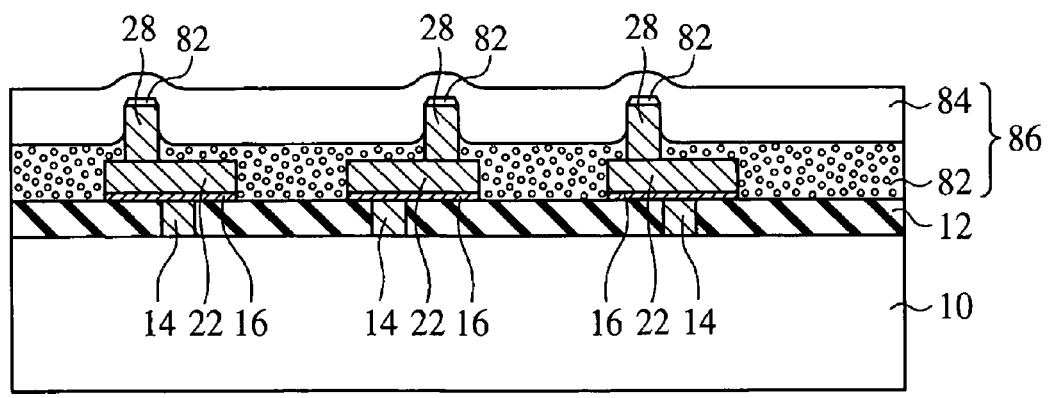

Thus, the resin layer 86 is formed of the first layer 82 containing the filler of an inorganic material and the second layer 84 containing no filler of an inorganic material, which are laid the latter on the former (see FIG. 27B).

Next, the semiconductor substrate 10 is fixed to the chuck table 38 of a superprecision lathe 36 (see FIG. 28A) by vacuum adsorption.

Figure 28B:
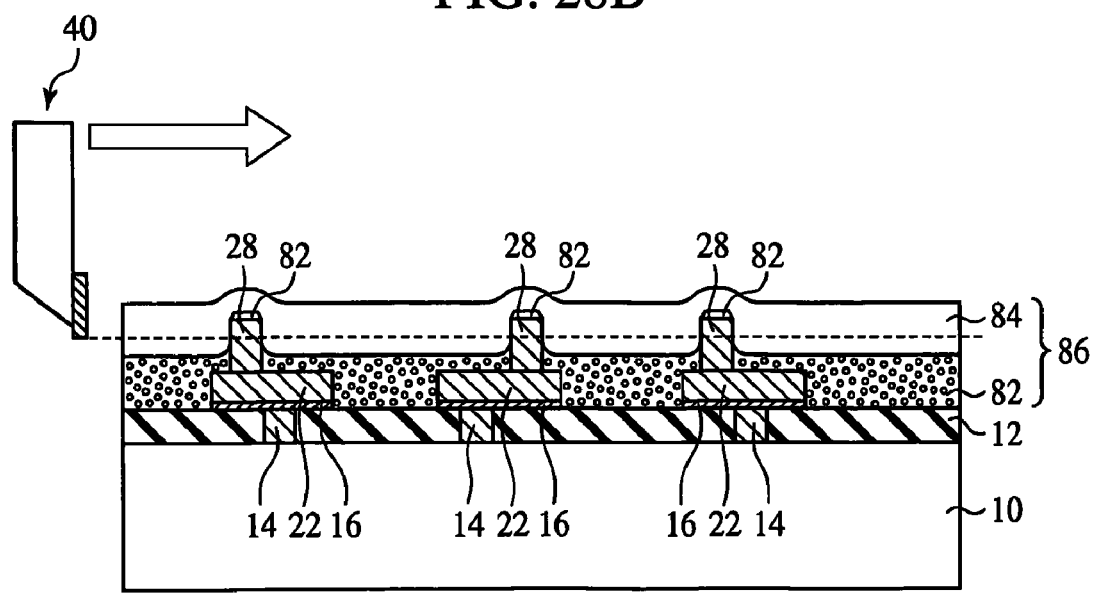

Next, with the semiconductor substrate 10 set on rotation, the surface of the resin layer 86 and upper parts of the conductor plugs 28 are cut with the cutting tool 40 of diamond until the thickness of the resin layer 86 becomes, e.g., about 13 μm (see FIG. 28B).

The conditions for cutting the surface of the resin layer 86 are the same as those for cutting, e.g., the surface of the resin layer 34. That is, the rake angle of the cutting tool 40 is 0 degree. The rotation number of the chuck table is, e.g., about 1000 rpm. When the surface of the resin layer 86 is cut, the cut is made, e.g., twice to cut the surface of the resin layer 86. In the first cut, the cut amount of the cutting tool 40 is, e.g., about 4 μm. The cut amount of the cutting tool 40 in the second cut is about, e.g., 3 μm. The feed of the cutting tool 40 is, e.g., 20 μm/second.

In the present embodiment, the first layer 82 containing the filler of an inorganic material is not cut, but the second layer 84 containing the filler of an inorganic material is cut to thereby planarize the surface of the resin layer 86, whereby the extreme abrasion, etc. of the cutting tool 40 by the filler of an inorganic material can be prevented.

Figure 29A:
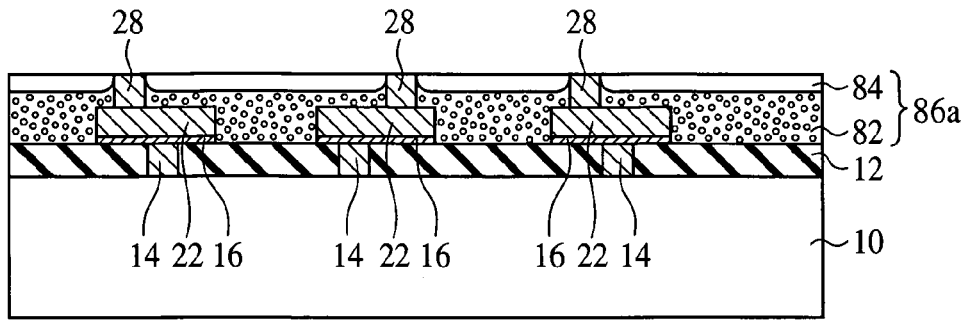
FIGS. 29A to 29C are views of the semiconductor device in the steps of the resin layer formation method and semiconductor device fabrication method according to the third embodiment of the present invention (Part 3).

Thus, the surface of the resin layer 86a is planarized as illustrated in FIG. 29A. In this specification, the resin layer after cut is called the resin layer 86a to be discriminated from the resin layer 86 before cut.

Figure 29B:
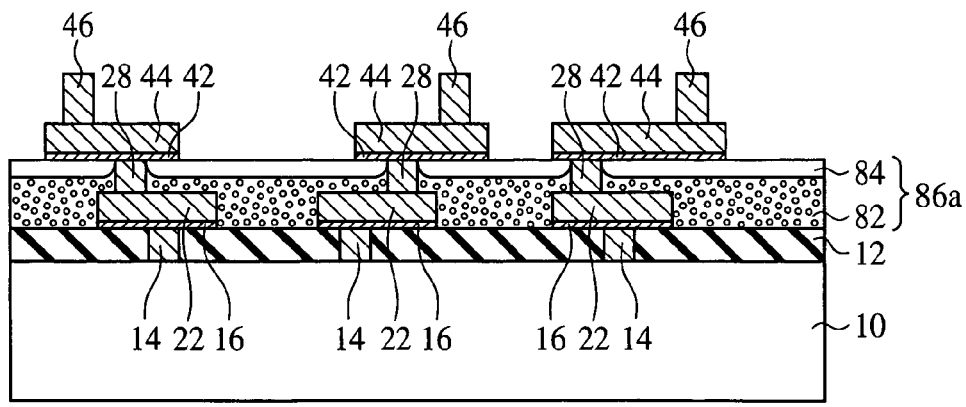

Then, in the same way as in the semiconductor device fabrication method according to the first embodiment described above with reference to FIG. 6B, the interconnections 44 and the conductor plugs 46 are formed (see FIG. 29B).

Then, on the entire surface, the first layer 88 is formed by, e.g., spin coating. The material of the first layer 88 is an epoxy resin solution containing the filler of, e.g., an inorganic material. The filler contained in the solution is, e.g., silica. The average particle diameter of the filler is, e.g., about 1 μm.

Then, thermal processing is made to semi-cure the first layer 88. The thermal processing conditions are, e.g., 80-150° C. and 30 minutes to 1 hour. The thickness of the first layer 88 after the thermal processing is, e.g., about 10 μm. Thus, the first layer 88 containing the filler by, e.g., about 60 wt % is formed. The difference in the thermal expansion coefficient between the semiconductor substrate 10 and the first layer 88, which contains the filler of a relatively small thermal expansion coefficient, is relatively small. Thus, according to the present embodiment, the stresses exerted on the semiconductor substrate 10, etc. due to the difference in the thermal expansion coefficient between the semiconductor substrate 10 and the first layer 88 can be made relatively small.

Next, the second layer 90 is formed on the entire surface by, e.g., spin coating. The material of the second layer 90 is, e.g., an epoxy resin solution.

Then, thermal processing is made to semi-cure the second layer 90. The thermal processing conditions are, e.g., 80-150° C. and 30 minutes to 1 hour. The thickness of the second layer 90 after the thermal processing is becomes, e.g., about 10 μm. The difference in the thermal expansion coefficient between the semiconductor substrate 10 and the resin layer 92 is small because the first layer 88 contains the filler of a relatively small thermal expansion coefficient. Thus, according to the present embodiment, the stresses exerted on the semiconductor substrate 10, etc. due to the difference in the thermal expansion coefficient between the semiconductor substrate 10 and the resin layer 92 can be made relatively small.

Figure 29C:
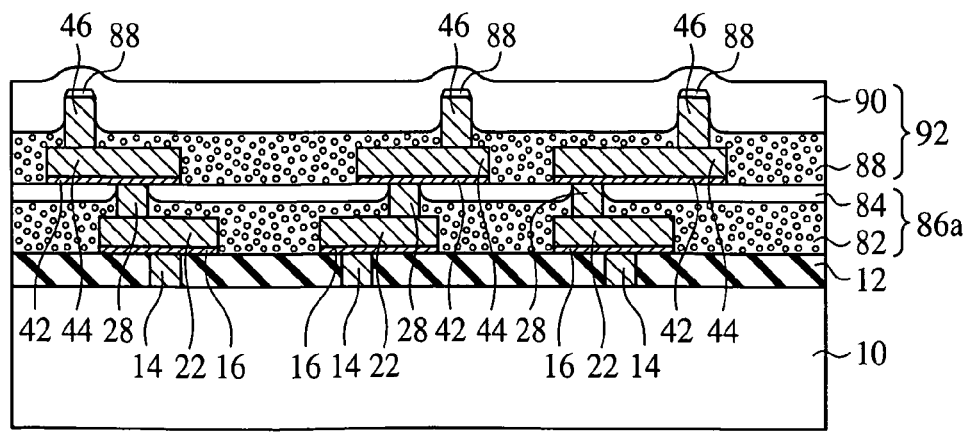

Thus, the resin layer 92 is formed of the first layer 88 containing the filler of an inorganic material and the second layer 90 containing no filler of an inorganic material laid the latter on the former (see FIG. 29C).

Next, the semiconductor substrate 10 is fixed to the chuck table 38 of the superprecision lathe 36 (see FIG. 28A) by vacuum absorption.

Figure 30A:
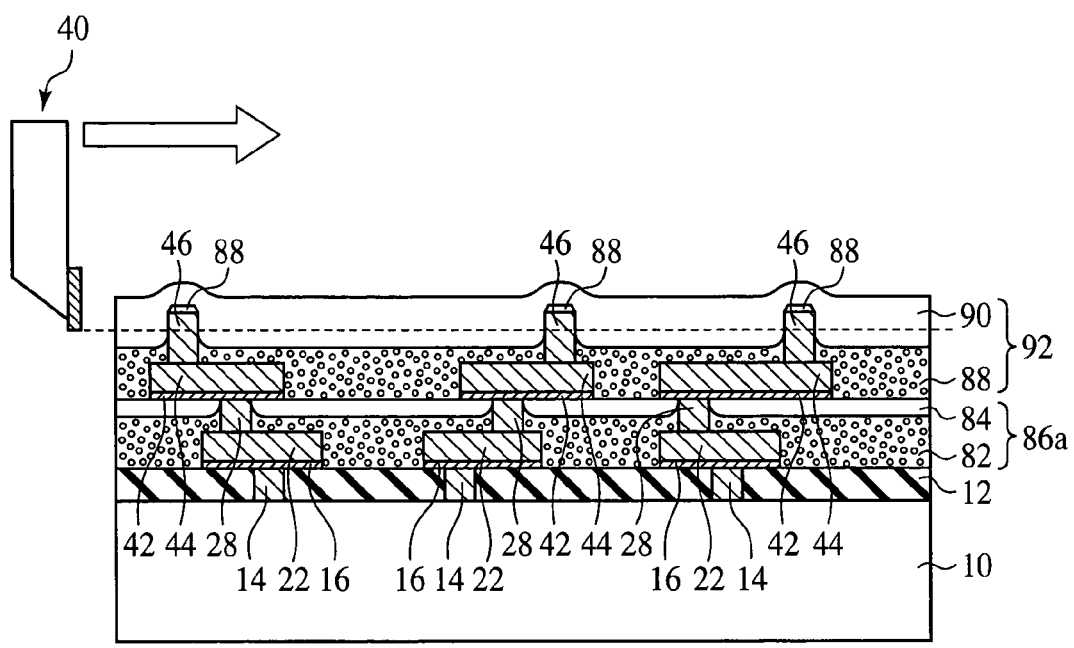
FIGS. 30A and 30B are views of the semiconductor device in the steps of the resin layer formation method and semiconductor device fabrication method according to the third embodiment of the present invention (Part 4).

Then, with the semiconductor substrate 10 set on rotation, the surface of the resin layer 92 and upper parts of the conductor plugs 46 are cut with the cutting tool 40 of diamond until the thickness of the resin layer 92 becomes, e.g., about 13 μm (see FIG. 30A).

The conditions for cutting the surface of the resin layer 92 are the same as those for cutting, e.g., the surface of the resin layer 86.

In the present embodiment, the first layer 88 containing the filler of an inorganic material is cut, but the second layer 90 containing no filler of an inorganic material is cut to thereby planarize the surface of the resin layer 92, whereby the extreme abrasion, etc. of the cutting tool 40 by the filler of an inorganic material can be prevented.

Figure 30B:
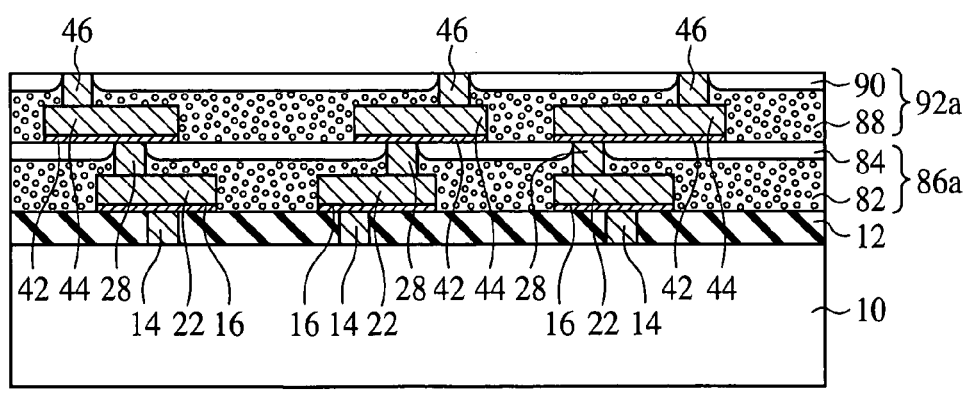

Thus, the surface of the resin layer 92a is planarized as illustrated in FIG. 30B. In this specification, the resin layer after cut is called the resin layer 92a to be discriminated from the resin layer 92 before cut.

Figure 31A:
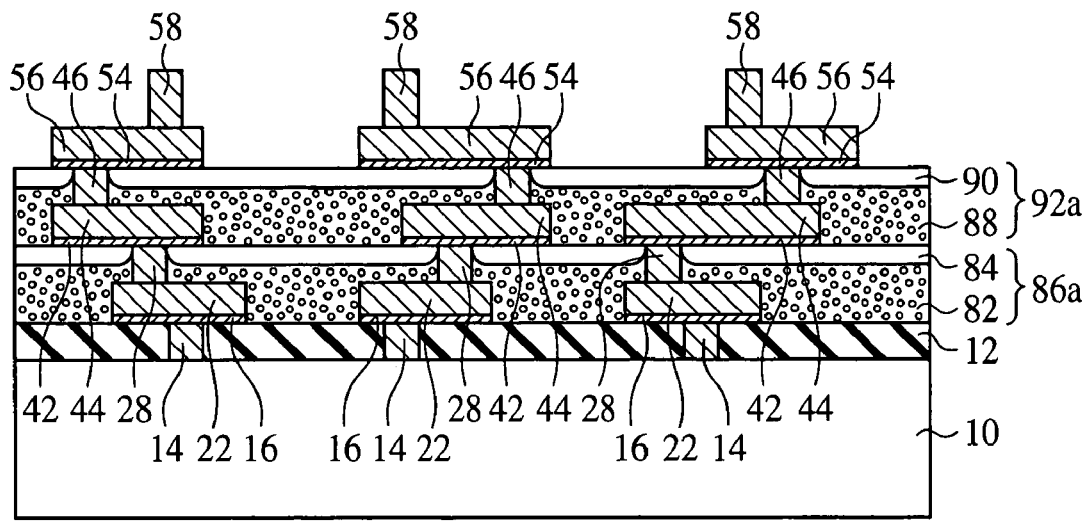
FIGS. 31A and 31B are views of the semiconductor device in the steps of the resin layer formation method and semiconductor device fabrication method according to the third embodiment of the present invention (Part 5).

Then, in the same as the semiconductor device fabrication method according to the first embodiment described above with reference to FIG. 9B, the interconnections 56 and the conductor plugs 58 are formed (see FIG. 31A).

Then, on the entire surface, the first layer 94 is formed by, e.g., spin coating. The material of the first layer 94 is an epoxy resin solution containing the filler of, e.g., an inorganic material. The filler contained in the epoxy resin solution is, e.g., silica. The average particle diameter of the filler is, e.g., about 1 μm.

Then, thermal processing is made to semi-cure the first layer 94. The thermal processing conditions are, e.g., 80-150° C. and 30 minutes to 1 hour. The thickness of the first layer 94 after the thermal processing is, e.g., about 10 μm. Thus, the first layer 94 containing the filler by the content ratio of, e.g., about 60 wt %. The difference in the thermal expansion coefficient between the semiconductor substrate 10 and the first layer 94, which contains the filler of a relatively small thermal expansion coefficient, is relatively small. Thus, according to the present embodiment, the stresses, etc. exerted on the semiconductor substrate 10, etc. due to the difference in the thermal expansion coefficient between the semiconductor substrate 10 and the first layer 94 can be made relatively small.

Then, the second layer 96 is formed on the entire surface by, e.g., spin coating. The material of the second layer 96 is, e.g., an epoxy resin solution.

Then, thermal processing is made to semi-cure the second layer 96. The thermal processing conditions are, e.g., 80-150° C. and 30 minutes to 1 hour. The thickness of the second layer 96 after the thermal processing becomes, e.g., about 10 μm. The difference in the thermal expansion coefficient between the semiconductor substrate 10 and the resin layer 98 is relatively small, because the first layer 96 of the resin layer 98 contains the filler of a relatively small thermal expansion coefficient. Thus, according to the present embodiment, the stresses exerted on the semiconductor substrate 10, etc. due to the difference in the thermal expansion coefficient between the semiconductor substrate 10 and the resin layer 98 can be made relatively small.

Figure 31B:
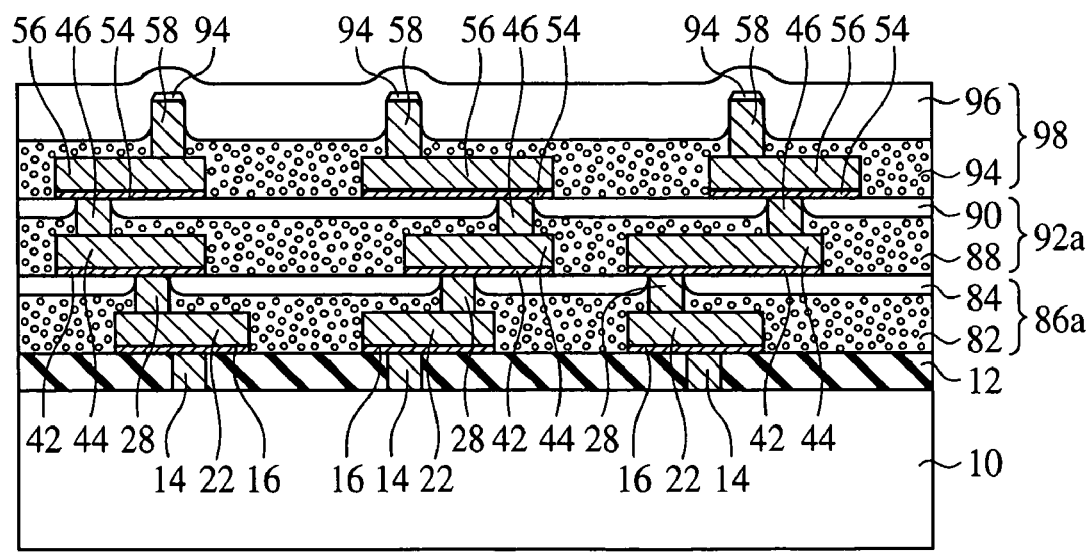

Thus, the resin layer 98 is formed of the first layer 94 containing the filler of an inorganic material and the second layer 96 containing no filler of an inorganic material (see FIG. 31B).

Next, the semiconductor substrate 10 is fixed to the chuck table 38 of the superprecision lathe 36 (see FIG. 28A) by vacuum absorption.

Figure 32A:
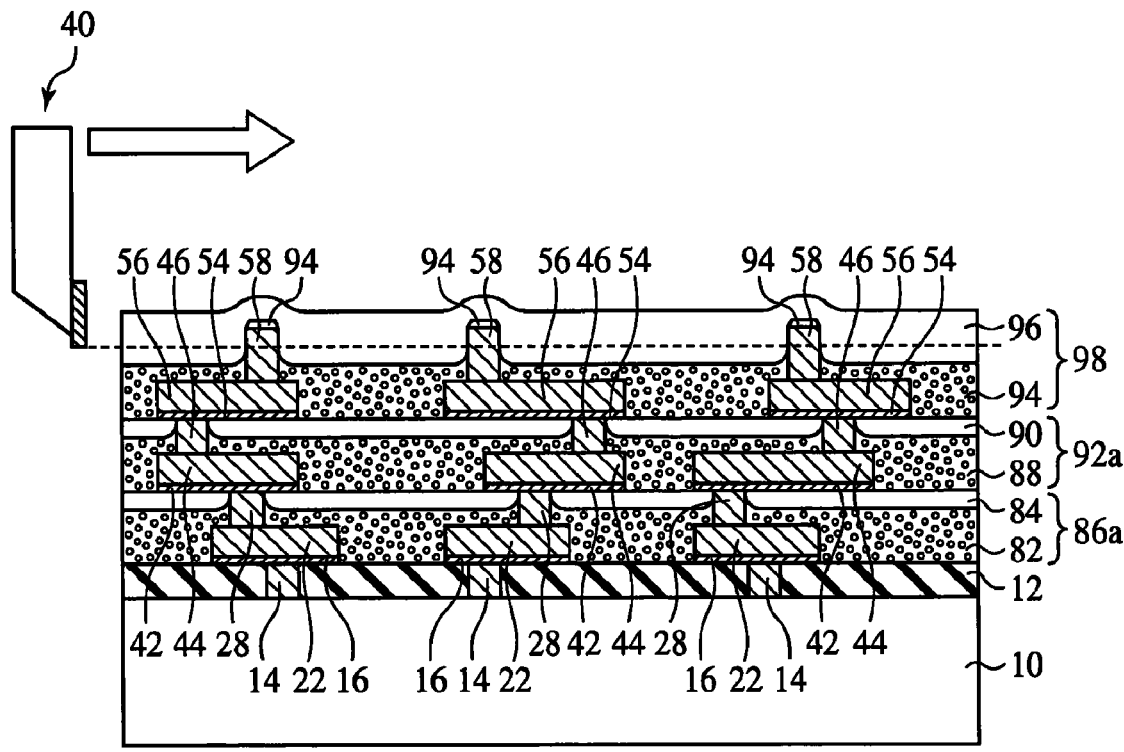
FIGS. 32A and 32B are views of the semiconductor device in the steps of the resin layer formation method and semiconductor device fabrication method according to the third embodiment of the present invention (Part 6).

Then, with the semiconductor substrate 10 set on rotation, the surface of the resin layer 98 and upper parts of the conductor plugs 58 are cut with the cutting tool 40 of diamond until the thickness of the resin layer 98 becomes, e.g., about 13 μm (see FIG. 32A).

The conditions for cutting the surface of the resin layer 98 are the same as those for cutting, e.g., the surface of the resin layer 86.

In the present embodiment, the first layer 94 containing the filler of an inorganic material is not cut, but the second layer 96 containing no filler of an inorganic material is cut to thereby planarize the surface of the resin layer 98, whereby the extreme abrasion, etc. of the cutting tool 40 by the filler of an inorganic material can be prevented.

Figure 32B:
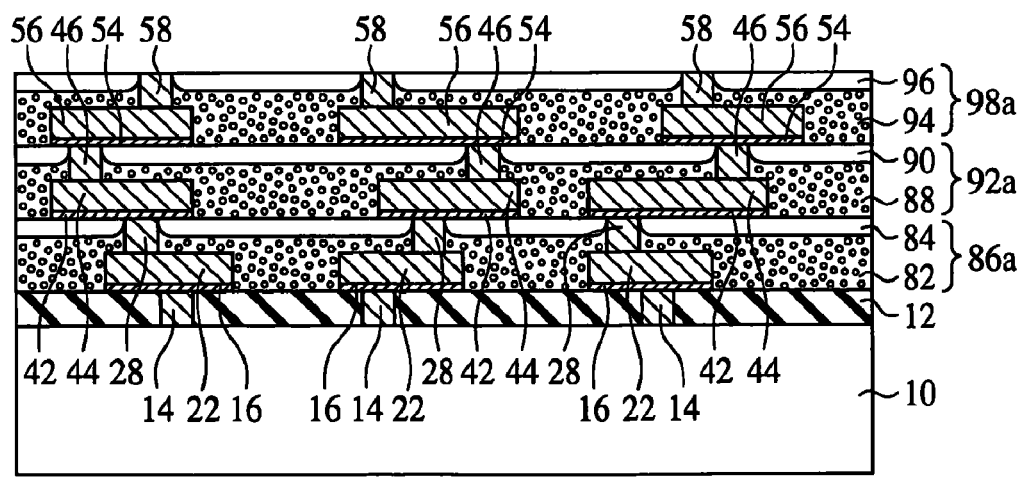

Thus, the surface of the resin layer 98a is planarized as illustrated in FIG. 32B. In this specification, the resin layer after cut is called the resin layer 98a to be discriminated from the resin layer 98 before cut.

Then, in the same as the semiconductor device fabrication method according to the first embodiment described above with reference to FIG. 12A, the interconnections 68 and the conductor plugs 70 are formed.

Then, on the entire surface, the first layer 100 is formed by, e.g., spin coating. The material of the first layer 100 is an epoxy resin solution containing the filler of, e.g., an inorganic material. The filler contained in the epoxy resin solution is, e.g., silica. The average particle diameter of the filler is, e.g., about 1 μm.

Then, thermal processing is made to semi-cure the first layer 100. The thermal processing conditions are, e.g., 80-150° C. and 30 minutes to 1 hour. The thickness of the first layer 100 after the thermal processing is, e.g., about 10 μm. Thus, the first layer 100 containing the filler by the content ratio of, e.g., about 60 wt %. The difference in the thermal expansion coefficient between the semiconductor substrate 10 and the first layer 100, which contains the filler of a relatively small thermal efficient, is relatively small. Thus, according to the present embodiment, the stresses, etc. exerted on the semiconductor substrate 10, etc. due to the difference in the thermal processing ratio between the semiconductor substrate 10 and the first layer 100 can be made relatively small.

Then, the second layer 102 is formed on the entire surface by, e.g., spin coating. The material of the second layer 102 is, e.g., an epoxy resin solution.

Then, thermal processing is made to semi-cure the second layer 102. The thermal processing conditions are, e.g., 80-150° C. and 30 minutes to 1 hour. The thickness of the second layer 102 after the thermal processing becomes, e.g., about 10 μm. The difference in the thermal expansion coefficient between the semiconductor substrate 10 and the resin layer 104 is relatively small, because the first layer 100 of the resin layer 104 contains the filler of a relatively small thermal expansion coefficient. Thus, according to the present embodiment, the stresses exerted on the semiconductor substrate 10, etc. due to the difference in the thermal expansion coefficient between the semiconductor substrate 10 and the resin layer 104 can be made relatively small.

Figure 33A:
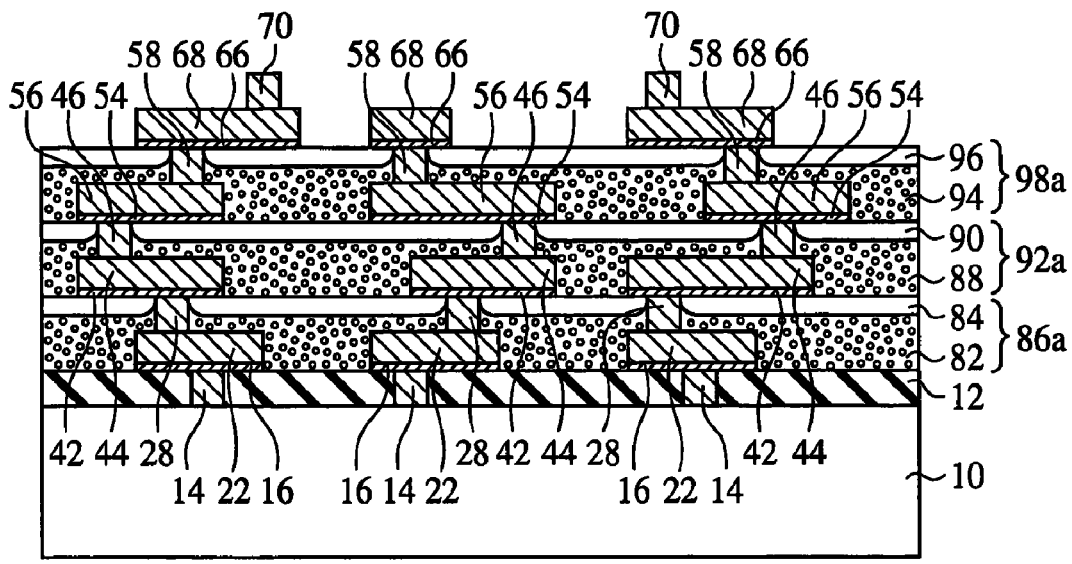
FIGS. 33A and 33B are views of the semiconductor device in the steps of the resin layer formation method and semiconductor device fabrication method according to the third embodiment of the present invention (Part 7).
Figure 33B:
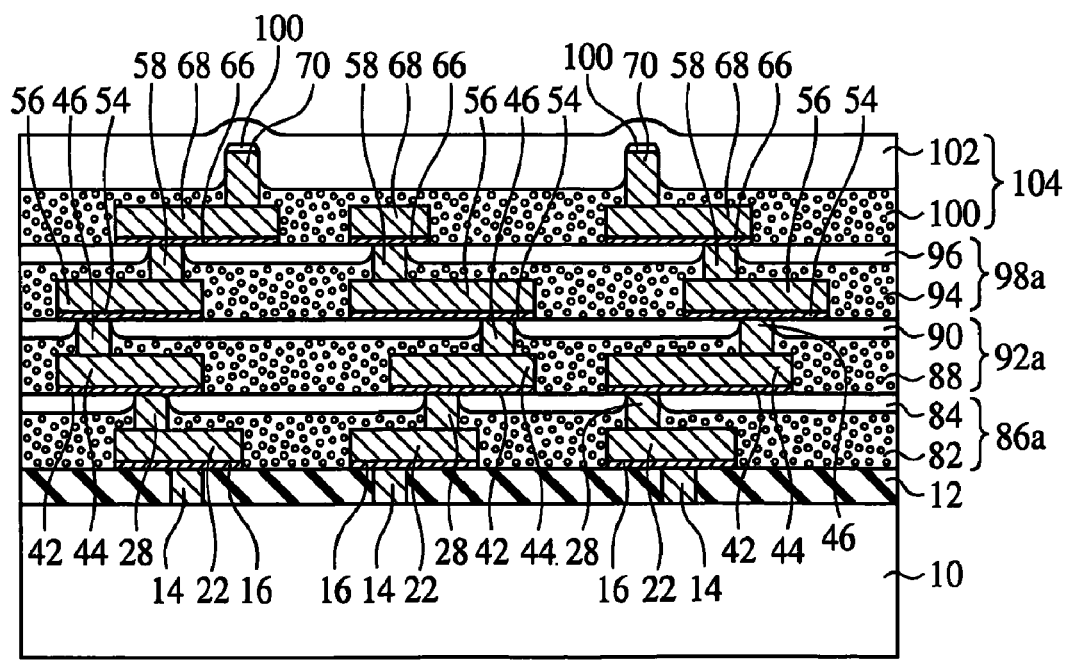

Thus, the resin layer 104 is formed of the first layer 100 containing the filler of an inorganic material and the second layer 102 containing no filler of an inorganic material (see FIG. 33B).

Next, the semiconductor substrate 10 is fixed to the chuck table 38 of the superprecision lathe 36 (see FIG. 28A) by vacuum absorption.

Figure 34A:
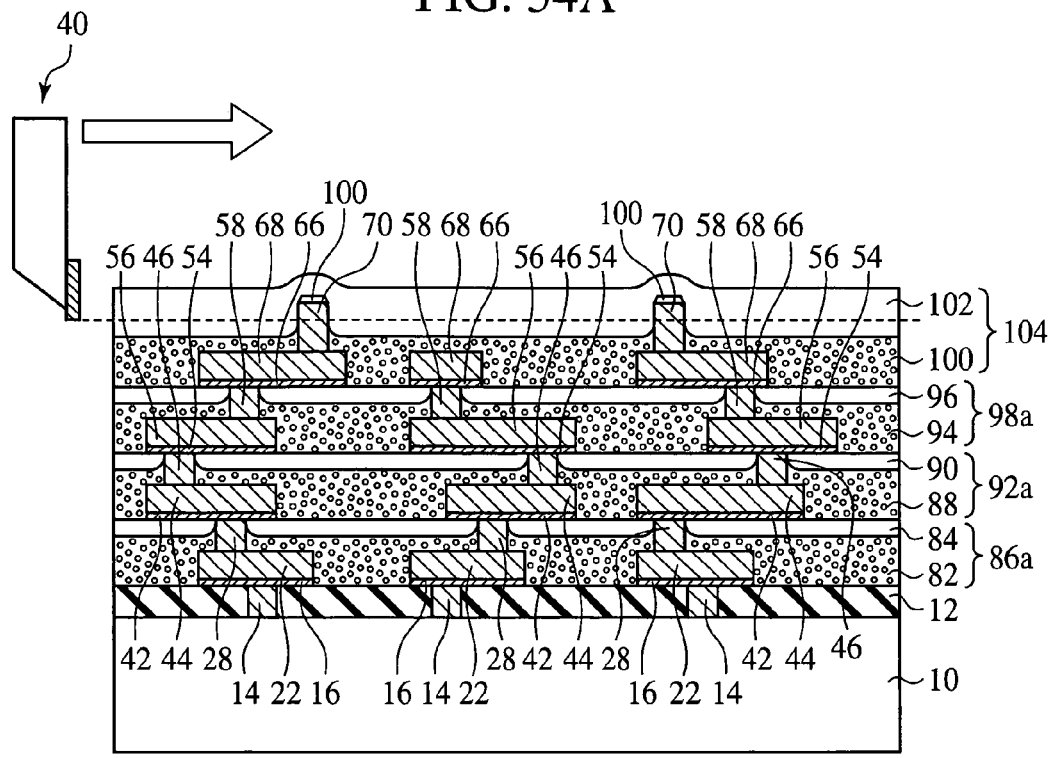
FIGS. 34A and 34B are views of the semiconductor device in the steps of the resin layer formation method and semiconductor device fabrication method according to the third embodiment of the present invention (Part 8).

Then, with the semiconductor substrate 10 set on rotation, the surface of the resin layer 104 and upper parts of the conductor plugs 70 are cut with the cutting tool 40 of diamond until the thickness of the resin layer 104 becomes, e.g., about 13 μm (see FIG. 34A).

The conditions for cutting the surface of the resin layer 104 are the same as those for cutting, e.g., the surface of the resin layer 86.

In the present embodiment, the first layer 100 containing the filler of an inorganic material is not cut, but the second layer 102 containing no filler of an inorganic material is cut to thereby planarize the surface of the resin layer 104, whereby the extreme abrasion, etc. of the cutting tool 40 by the filler of an inorganic material can be prevented.

Figure 34B:
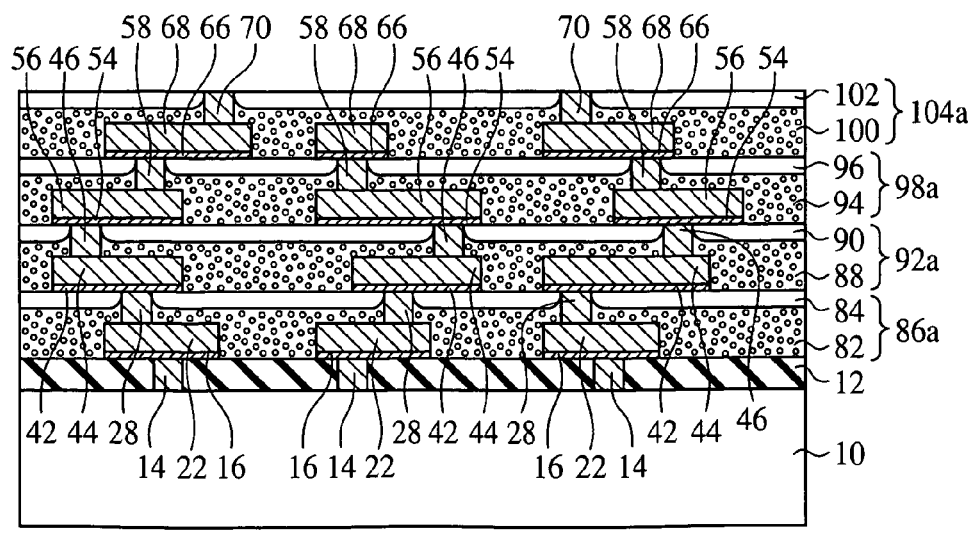

Thus, the surface of the resin layer 104a is planarized as illustrated in FIG. 34B. In this specification, the resin layer after cut is called the resin layer 104a to be discriminated from the resin layer 104 before cut.

Figure 35:
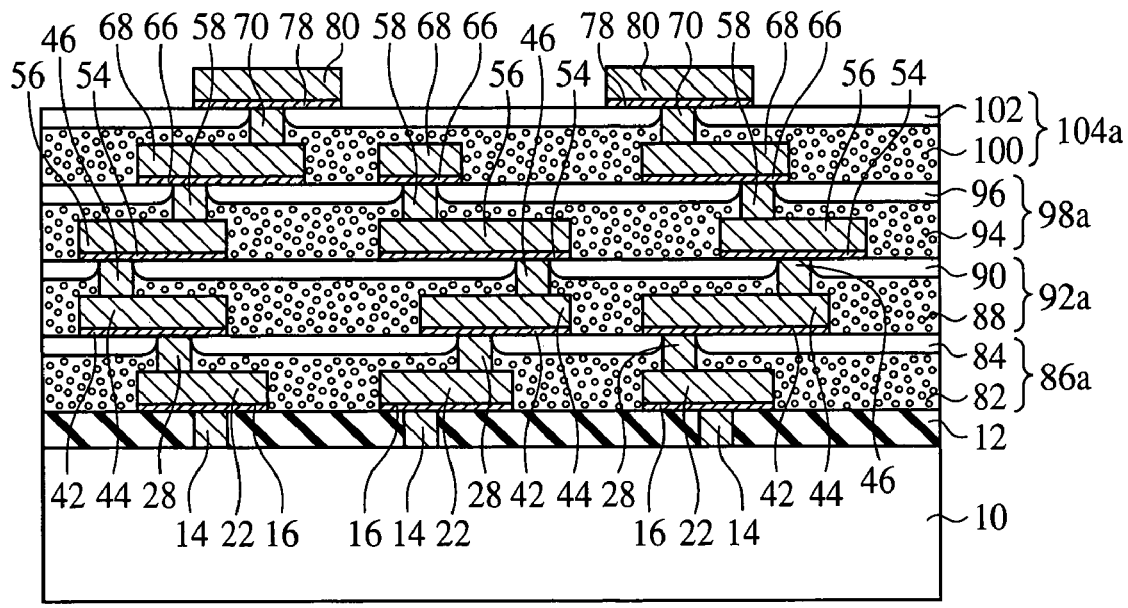
FIG. 35 is a view of the semiconductor device in the steps of the resin layer formation method and semiconductor device fabrication method according to the third embodiment of the present invention (Part 9).

Next, in the same way as in the semiconductor device fabrication method according to the first embodiment described above with reference to FIG. 14B, the electrodes 80 are formed (see FIG. 35).

Thus, the semiconductor device is fabricated by using the resin layer formation method according to the present embodiment.

As in the present embodiment, the first layers 82, 88, 94, 100 and the second layers 84, 90, 96, 102 forming the resin layers 86a, 92a, 98a, 104a may be formed by spin coating.

A Fourth Embodiment

Figure 36:
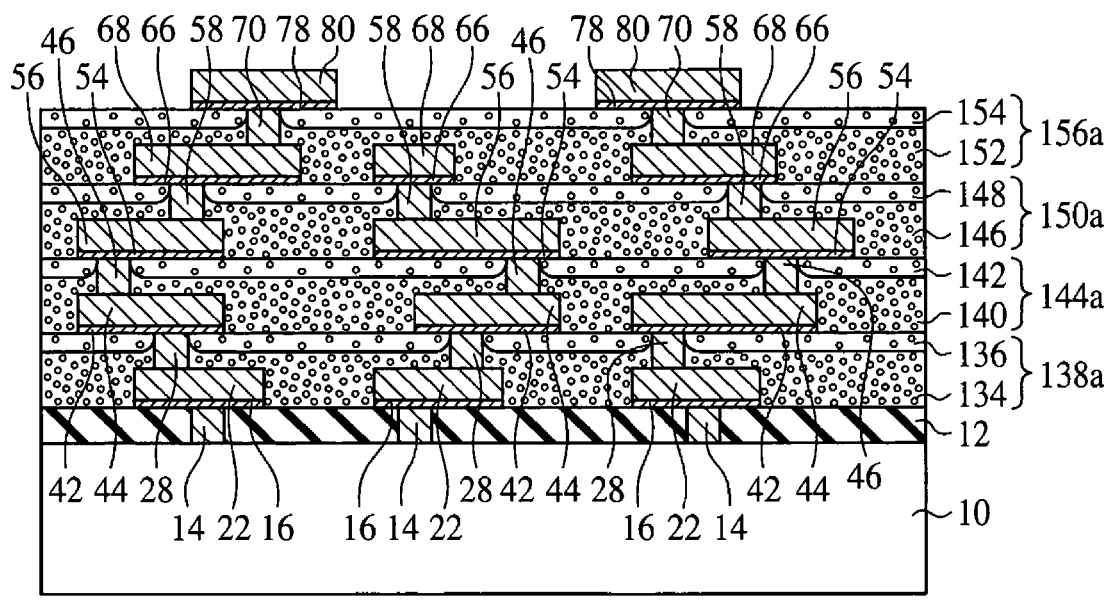
FIG. 36 is a sectional view of the semiconductor device according to a fourth embodiment of the present invention.

The resin layer formation method according to a fourth embodiment of the present invention, and semiconductor device using the resin layer formation method, and the semiconductor device fabrication method will be explained with reference to FIGS. 36 to 44. FIG. 36 is a sectional view of the semiconductor device according to the present embodiment. The same members of the present embodiment as those of the resin forming method, the semiconductor device and the semiconductor device fabrication method according to the first to the third embodiments illustrated in FIGS. 1 to 35 are represented by the same reference numbers not to repeat or to simplify the explanation.

The semiconductor device according to the present embodiment is characterized mainly in that first layers 134, 140, 146, 152 of resin layers 138a, 144a, 150a, 156a contain a filler of an inorganic material by a first content ratio, and second layers 136, 142, 148, 154 of the resin layers 138a, 144a, 150a, 156a contain the filler of an inorganic material by a second content ratio smaller than the first content ratio, and the first layers 134, 140, 146, 152 and the second layers 136, 142, 148, 154 are formed by spin coating.

As illustrated in FIG. 36, the resin layer (inter-layer insulation film) 138a is formed on an inter-layer insulation film 12, burying interconnections 22 and conductor plugs 28. The resin layer 138a is formed of the first layer 134 containing, by a first content ratio, a filler for decreasing the thermal expansion coefficient, and a second layer 136 formed on the first layer 134 and containing the filler by a second content ratio smaller than the first content ratio. In other words, the resin layer 138a having the filler for decreasing the thermal expansion coefficient localized in the side nearer to semiconductor substrate 10 is formed. The first layer 134 and the second layer 136 are formed by spin coating.

The base of the first layer 134 is, e.g., epoxy resin. The filler contained in the first layer 134 is an inorganic material, e.g., silica or others. The average particle diameter of the filler is, e.g., about 1 µm. The content ratio of the filler of the first layer 134 is about 60 wt %.

The base of the second layer 136 is, e.g., epoxy resin. The filler contained in the second layer 136 is an inorganic material, e.g. silica or others. The average particle diameter of the filler is, e.g. about 1 µm. The content ratio of the filler of the second layer 136 is, e.g., about 15 wt %.

The surface of the resin layer 138a and the surfaces of the conductor plugs 28 are cut with a cutting tool 40 of diamond or others (see FIG. 36), as will be described later. The surface of the conductor plugs 28 and the surface of the resin layer 138a, which have been cut with the cutting tool 40 of diamond or others, are flat.

On the resin layer 138a, the resin layer (inter-layer insulation film) 144a is formed, burying interconnections 44 and conductor plugs 46. The resin layer 144a is formed of the first layer 140 containing the filler of an inorganic material by the first content ratio and the second layer 142 formed on the first layer 140 and containing the filler of an inorganic material by the second content ratio smaller than the first content ratio. The first layer 140 and the second layer 142 are formed by spin coating.

The base of the first layer 140 is, e.g., epoxy resin. The filler contained in the first layer 140 is, e.g., silica. The average particle diameter of the filler is, e.g., about 1 µm. The content ratio of the filler of the first layer 140 is about 60 wt %.

The base of the second layer 142 is, e.g., epoxy resin. The filler contained in the second layer 142 is silica. The average particle diameter of the filler is, e.g. about 1 µm. The content ratio of the filler of the second layer 142 is, e.g., about 15 wt %.

The surface of the resin layer 144a and the surfaces of the conductor plugs 46 are cut with a cutting tool 40 of diamond or others (see FIG. 39A), as will be described later. The surfaces of, the conductor plugs 46 and the surface of the resin layer 144a, which have been cut with the cutting tool 40 of diamond or others, are flat.

On the resin layer 144a, the resin layer (inter-layer insulation film) 150a is formed, burying interconnections 56 and conductor plugs 58. The resin layer 150a is formed of the first layer 146 containing the filler of an inorganic material by the first content ratio and the second layer 148 formed on the first layer 146 and containing the filler of an inorganic material by the second content ratio smaller than the first content ratio. The first layer 146 and the second layer 148 are formed by spin coating.

The base of the first layer 146 is, e.g., epoxy resin. The filler contained in the first layer 146 is, e.g., silica. The average particle diameter of the filler is, e.g., about 1 µm. The content ratio of the filler of the first layer 146 is about 60 wt %.

The base of the second layer 148 is, e.g., epoxy resin. The filler contained in the second layer 148 is silica. The average particle diameter of the filler is, e.g. about 1 µm. The content ratio of the filler of the second layer 148 is, e.g., about 15 wt %.

The surface of the resin layer 150a and the surfaces of the conductor plugs 58 are cut with the cutting tool 40 of diamond or others (see FIG. 41A), as will be described later. The surfaces of the conductor plugs 58 and the surface of the resin layer 150a, which have been cut with, the cutting tool 40 of diamond or others, are flat.

On the resin layer 150a, the resin layer (inter-layer insulation film) 156a is formed, burying interconnections 68 and conductor plugs 70. The resin layer 156a is formed of the first layer 152 containing the filler of an inorganic material by the first content ratio and the second layer 154 formed on the first layer 152 and containing the filler of an inorganic material by the second content ratio smaller than the first content ratio. The first layer 152 and the second layer 154 are formed by spin coating.

The base of the first layer 152 is, e.g., epoxy resin. The filler contained in the first layer 152 is, e.g., silica. The average particle diameter of the filler is, e.g., about 1 µm. The content ratio of the filler of the first layer 152 is about 60 wt %.

The base of the second layer 154 is, e.g., epoxy resin. The filler contained in the second layer 154 is silica. The average particle diameter of the filler is, e.g. about 1 µm. The content ratio of the filler of the second layer 154 is, e.g., about 15 wt %.

The surface of the resin layer 156a and the surfaces of the conductor plugs 70 are cut with the cutting tool 40 of diamond or others (see FIG. 43A), as will be described later. The surfaces of the conductor plugs 70 and the surface of the resin layer 156a, which have been cut with the cutting tool 40 of diamond or others, are flat.

A plurality of electrodes 80 are formed on the planarized resin layer 156a. On the undersides of the electrodes 80, a seed layer 78 used in forming the interconnections 80 by electroplating remains. The interconnections 80 are electrically connected to the conductor plugs 70.

Thus, the semiconductor device having the multi-layer interconnection structure including a plurality of resin layer 138a, 144a, 150a, 156a and a plurality of interconnection layers 22, 44, 56, 68 is formed.

As in the present embodiment, the first layers 134, 140, 146, 152 and the second layers 136, 142, 148, 154 forming the resin layers 138a, 144a, 150a, 156a may be formed by spin coating.

(The Resin Layer Formation Method and the Semiconductor Device Fabrication Method)

Next, the resin layer formation method according to the present embodiment and the semiconductor device fabrication method using the resin layer formation method will be explained with reference to FIGS. 37A to 44. FIGS. 37A to 44 are sectional views of the semiconductor device in the steps of the resin layer formation method and the semiconductor device fabrication method according to the present embodiment, which illustrate the methods.

The step of preparing the semiconductor substrate 10 to the step of forming the conductor plugs 28 including the conductor plugs 28 forming step are the same as those of the semiconductor device fabrication method according to the first embodiment illustrated in FIGS. 2A to 4A, and their explanation will not be repeated (see FIG. 27A).

Figure 37A:
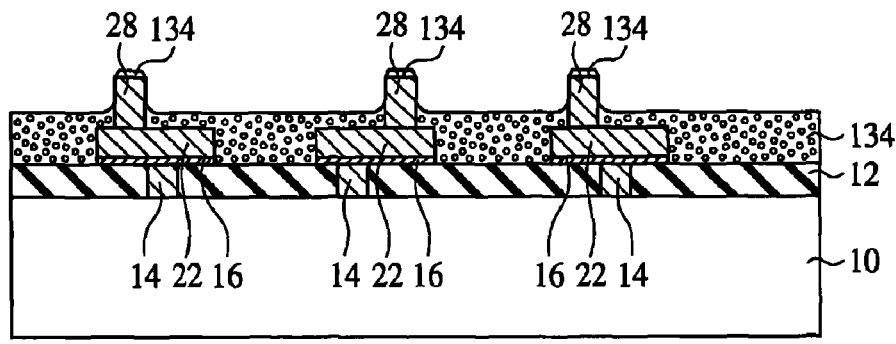
FIGS. 37A to 37C are sectional views of the semiconductor device in the steps of the resin layer formation method and semiconductor device fabrication method according to the fourth embodiment of the present invention (Part 1).
Figure 37B:
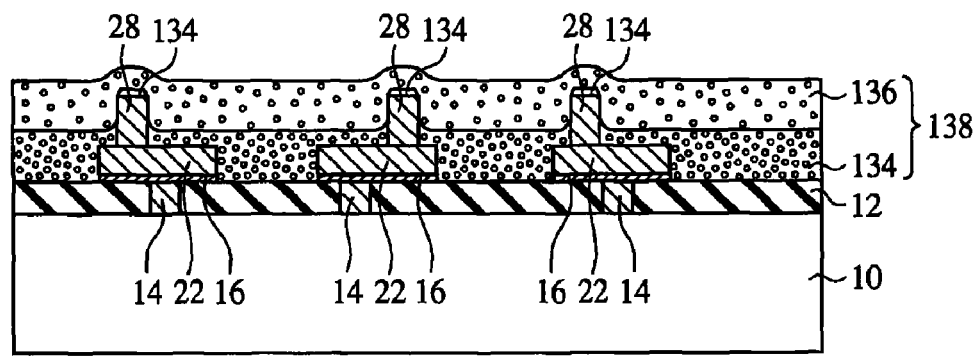

Then, as illustrated in FIG. 37A, the first layer 134 is formed on the entire surface by, e.g., spin coating. The material of the first layer 134 is, e.g., an epoxy resin solution containing, e.g., a filler for decreasing the thermal expansion coefficient. The filler contained in the epoxy resin solution is an inorganic material, e.g., silica or others. The average particle diameter of the filler is, e.g., 1 µm.

Next, thermal processing is made to semi-cure the first layer 134. The thermal processing conditions are, e.g., 80-150° C. and 30 minutes to 1 hour. The thickness of the first layer 134 after the thermal processing becomes, e.g., about 10

μm. Thus, the first layer 134 containing the filler by the content ratio of, e.g., about 60 wt % is formed. The difference in the thermal expansion coefficient between the semiconductor substrate 10 and the first layer 134, which contains the filler of a relatively small thermal expansion coefficient, is relatively small. Thus, according to the present embodiment, the stresses exerted on the semiconductor substrate 10, etc. due to the difference in the thermal expansion coefficient between the semiconductor substrate 10 and the first layer 134 can be made relatively small.

Next, on the entire surface, the second layer 136 is formed by, e.g., spin coating. The material of the second layer 136 is, e.g., an epoxy resin solution containing a filler, e.g., of a relatively small thermal expansion coefficient. The filler contained in the epoxy resin solution is an inorganic material, e.g., silica or others. The average particle diameter of the filler is, e.g., about 1 μm.

Next, thermal processing is made to semi-cure the second layer 136. The thermal processing conditions are, e.g., 80-150° C. and 30 minutes to 1 hour. The thickness of the second layer 136 after the thermal processing becomes, e.g., about 10 μm after the thermal processing. Thus, the second layer 136 containing the filler by the content ratio of, e.g., 15 wt % is formed. In the present embodiment, not only the first layer 134, but also the second layer 136 contains the filler of a relatively smaller thermal expansion coefficient, whereby the difference in the thermal expansion coefficient between the semiconductor substrate 10 and the resin layer 138 can be made small. Thus, according to the present embodiment, the stresses exerted to the semiconductor substrate 10, etc. due to the difference in the thermal expansion coefficient between the semiconductor substrate 10 and the resin layer 138 can be made smaller.

Figure 37C:
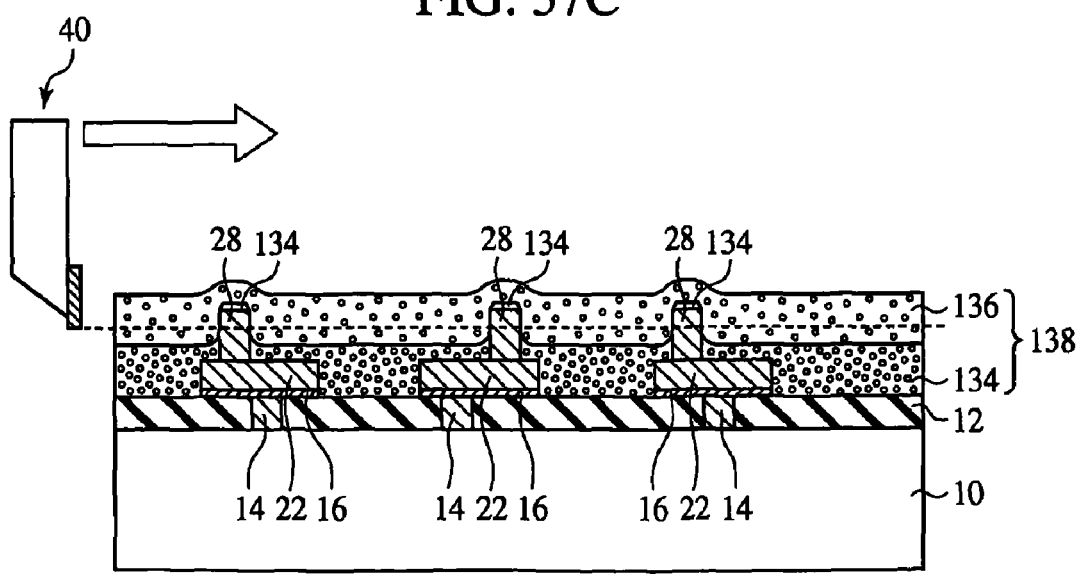

Thus, the resin layer 138 is formed of the first layer 134 containing the filler of an inorganic material by the first content ratio and the second layer 136 containing the filler of an inorganic material by the second content ratio smaller than the first content ratio (see FIG. 37C).

Next, the semiconductor substrate 10 is fixed to the chuck table 38 of the superprecision lathe 36 (see FIG. 28A) by vacuum absorption.

Then, with the semiconductor substrate 10 set on rotation, the surface of the resin layer 138 and upper parts of the conductor plugs 28 are cut with the cutting tool 40 of diamond until the thickness of the resin layer 138 becomes, e.g., about 13 μm (see FIG. 37C).

The conditions for cutting the surface of the resin layer 138 are the same as those for, e.g., cutting the surface of the resin layer 86. That is, the rake angle of the cutting tool 40 is 0 degree. The rotation number of the chuck table is, e.g., about 1000 rpm. When the surface of the resin layer 138 is cut, the surface of the resin layer 138 is cut by cutting, e.g., twice. The cut amount of the cutting tool 40 in the first cut is, e.g., about 4 μm. The cut amount of the cutting tool 40 in the second cut is, e.g., about 3 μm. The feed of the cutting tool 40 is, e.g., 20 μm/second.

In the present embodiment, although the second layer 136 containing the filler of an inorganic material is cut with the cutting tool 40, the content ratio of the filler of the second layer 136 is set relatively small, which prevent the extreme abrasion, etc. of the cutting tool 40 by the filler.

Figure 38A:
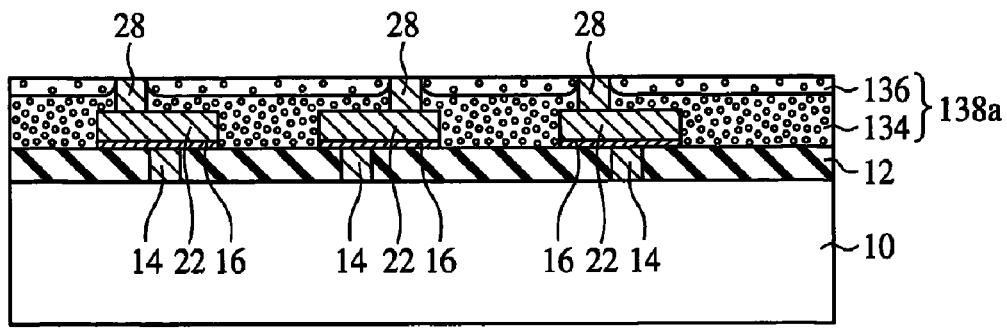
FIGS. 38A to 38C are sectional views of the semiconductor device in the steps of the resin layer formation method and semiconductor device fabrication method according to the fourth embodiment of the present invention (Part 2).

Thus, as illustrated in FIG. 38A, the surface of the resin layer 138a is planarized. In this specification, the resin layer after cut is called a resin layer 138a to be discriminated from the resin layer 138 before cut.

Figure 38B:
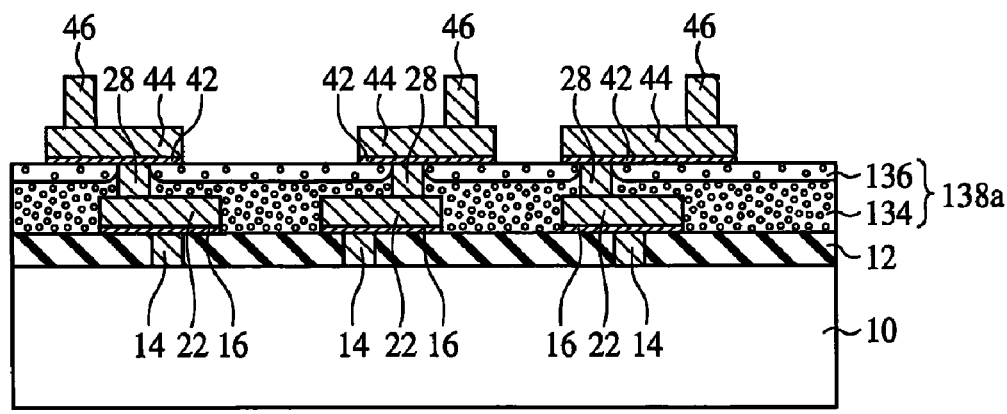

Next, in the same way as in the semiconductor device fabrication method according to the first embodiment described above with reference to FIG. 6B, the interconnections 44 and the conductor plugs 46 are formed (see FIG. 38B).

Then, on the entire surface, the first layer 140 is formed by, e.g., spin coating. The material of the first layer 140 is an epoxy resin solution containing the filler of, e.g., an inorganic material. The filler contained in the epoxy resin solution is, e.g., silica. The average particle diameter of the filler is, e.g., about 1 μm.

Then, thermal processing is made to semi-cure the first layer 140. The thermal processing conditions are, e.g., 80-150° C. and 30 minutes to 1 hour. The thickness of the first layer 140 after the thermal processing is, e.g., about 10 μm. Thus, the first layer 140 containing the filler by the ratio of, e.g., 60 wt % is formed. The difference in the thermal expansion coefficient between the semiconductor substrate 10 and the first layer 140, which contains the filler of a relatively small thermal expansion coefficient, is relatively small. Thus, according to the present embodiment, the stresses, etc. exerted on the semiconductor substrate 10, etc. due to the difference in the thermal expansion coefficient between the semiconductor substrate 10 and the first layer 140 can be made relatively small.

Then, the second layer 142 is formed on the entire surface by, e.g., spin coating. The material of the second layer 142 is an epoxy resin solution containing the filler of, e.g., an inorganic material. The filler contained in the epoxy resin solution is, e.g., silica. The average particle diameter of the filler is, e.g., about 1 μm.

Then, thermal processing is made to semi-cure the second layer 142. The thermal processing conditions are, e.g., 80-150° C. and 30 minutes to 1 hour. The thickness of the second layer 142 after the thermal processing is, e.g., about 10 μm. Thus, the second layer 142 containing the filler by the content ratio of, e.g., 15 wt % is formed. Because not only the first layer 140, but also the second layer 142 contains the filler of a relatively small thermal expansion coefficient, the difference in the thermal expansion coefficient between the semiconductor substrate 10 and the resin layer 144 is smaller. Thus, according to the present embodiment, the stresses exerted to the semiconductor substrate 10, etc. due to the difference in the thermal expansion coefficient between the semiconductor substrate 10 and the resin layer 144 can be made smaller.

Figure 38C:
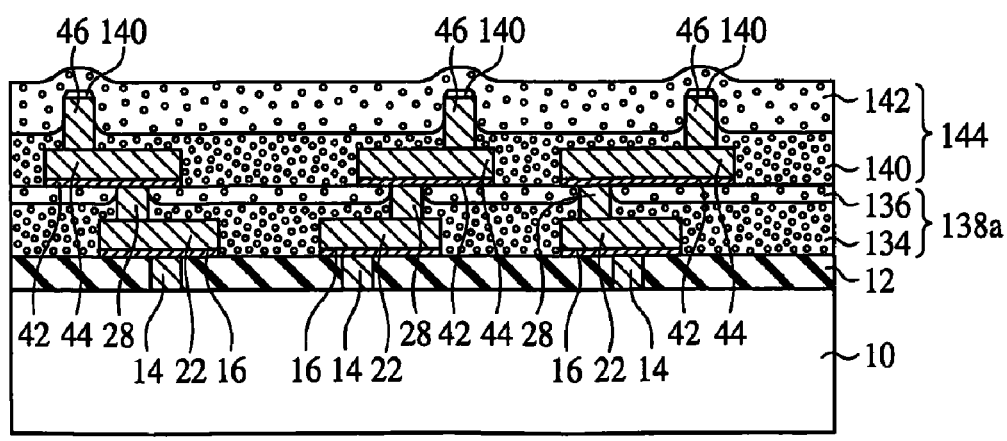

Thus, the resin layer 144 is formed of the first layer 140 containing the filler of an inorganic material by the first content ratio, and the second layer 142 containing the filler of an inorganic material by the second content ratio smaller than the first content ratio, which are laid the latter on the former (see FIG. 38C).

Next, the semiconductor substrate 10 is fixed to the chuck table 38 of the superprecision lathe 36 (see FIG. 28A) by vacuum absorption.

Then, with the semiconductor substrate 10 set on rotation, the surface of the resin layer 144 and upper parts of the conductor plugs 46 are cut with the cutting tool 40 of diamond until the thickness of the resin layer 144 becomes, e.g., about 13 μm (see FIG. 30A).

The conditions for cutting the surface of the resin layer 144 are the same as those for cutting, e.g., the surface of the resin layer 138.

In the present embodiment, although the second layer 142 containing the filler of an inorganic material is cut with the cutting tool 40, the content ratio of the filler of the second layer 142 is set relatively small, whereby the extreme abrasion, etc. of the cutting tool 40 by the filler is prevented.

Figure 39A:
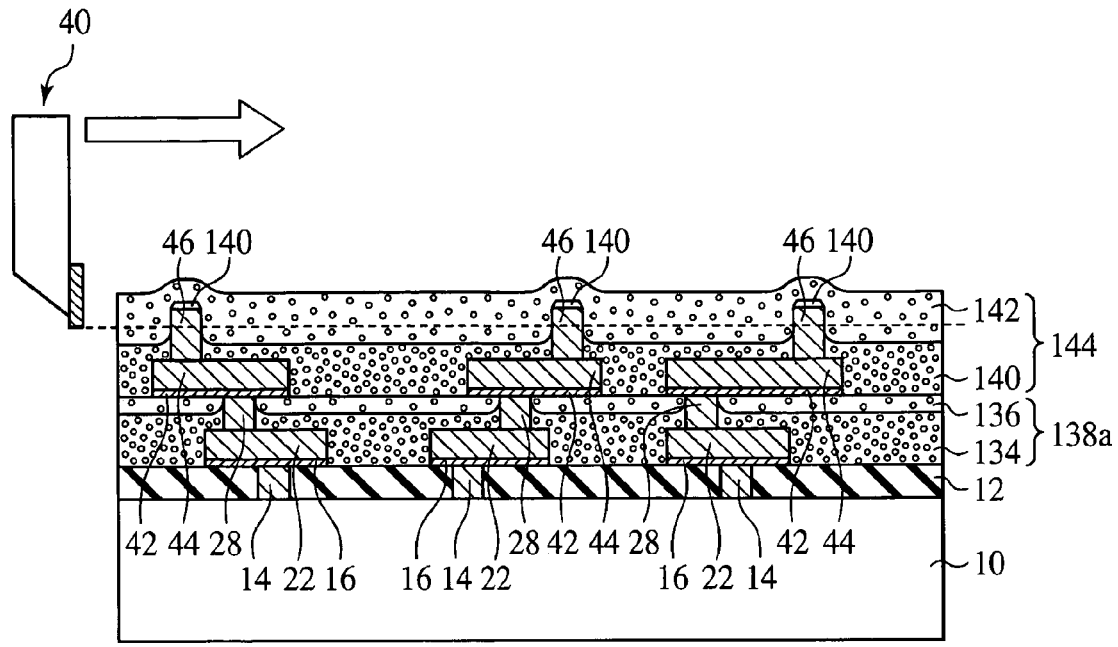
FIGS. 39A and 39B are sectional views of the semiconductor device in the steps of the resin layer formation method and semiconductor device fabrication method according to the fourth embodiment of the present invention (Part 3).
Figure 39B:
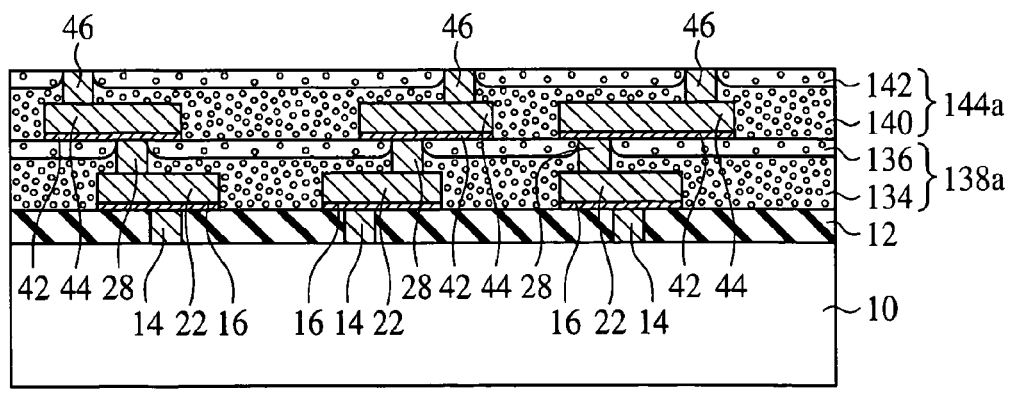

Thus, the surface of the resin layer 144a is planarized as illustrated in FIG. 39B. In this specification, the resin layer after cut is called the resin layer 144a to be discriminated from the resin layer 144 before cut.

Figure 40A:
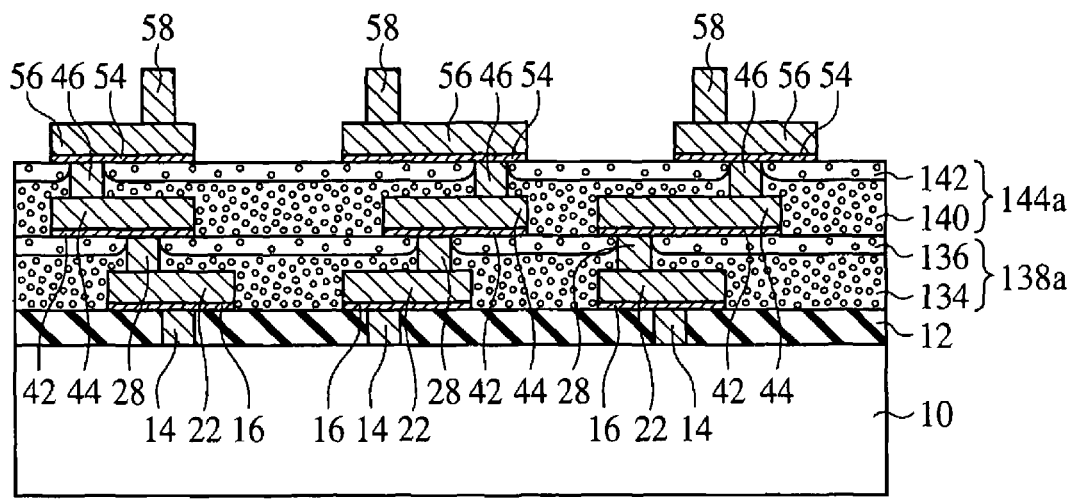
FIGS. 40A and 40B are sectional views of the semiconductor device in the steps of the resin layer formation method and semiconductor device fabrication method according to the fourth embodiment of the present invention (Part 4).

Next, in the same way as in the semiconductor device fabrication method according to the first embodiment described above with reference to FIG. 9B, the interconnections 56 and the conductor plugs 58 are formed (see FIG. 40A).

Then, on the entire surface, the first layer 146 is formed by, e.g., spin coating. The material of the first layer 146 is an epoxy resin solution containing the filler of, e.g., an inorganic material. The filler contained in the epoxy resin solution is, e.g., silica. The average particle diameter of the filler is, e.g., about 1 μm.

Then, thermal processing is made to semi-cure the first layer 146. The thermal processing conditions are, e.g., 80-150° C. and 30 minutes to 1 hour. The thickness of the first layer 146 after the thermal processing is, e.g., about 10 μm. Thus, the first layer 146 containing the filler by the content ration of, e.g., 60 wt % is formed. The difference in the thermal expansion coefficient between the semiconductor substrate 10 and the first layer 146, which contains the filler of a relatively small thermal expansion coefficient, is relatively small. Thus, according to the present embodiment, the stresses, etc. exerted on the semiconductor substrate 10, etc. due to the difference in the thermal expansion coefficient between the semiconductor substrate 10 and the first layer 146 can be made relatively small.

Then, the second layer 148 is formed on the entire surface by, e.g., spin coating. The material of the second layer 148 is an epoxy resin solution containing the filler of, e.g., an inorganic material. The filler contained in the epoxy resin solution is, e.g., silica. The average particle diameter of the filler is, e.g., about 1 μm.

Then, thermal processing is made to semi-cure the second layer 148. The thermal processing conditions are, e.g., 80-150° C. and 30 minutes to 1 hour. The thickness of the second layer 148 after the thermal processing is, e.g., about 10 μm. Thus, the second layer 148 containing the filler by the content ratio of, e.g., 15 wt % is formed. Because not only the first layer 146, but also the second layer 148 contains the filler of a relatively small thermal expansion coefficient, the difference in the thermal expansion coefficient between the semiconductor substrate 10 and the resin layer 150 is smaller. Thus, according to the present embodiment, the stresses exerted to the semiconductor substrate 10, etc. due to the difference in the thermal expansion coefficient between the semiconductor substrate 10 and the resin layer 150 can be made smaller.

Figure 40B:
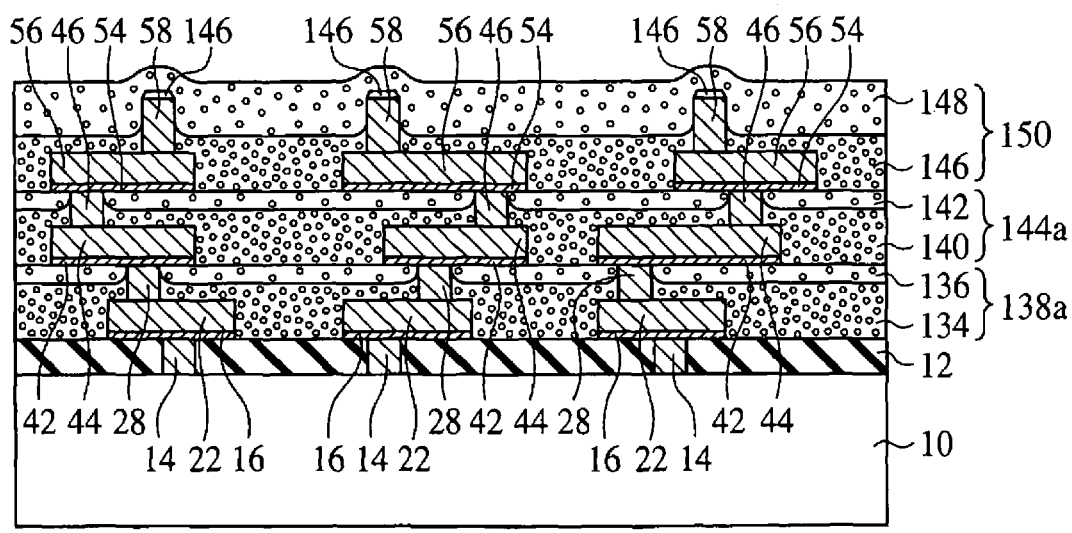

Thus, the resin layer 150 is formed of the first layer 146 containing the filler of an inorganic material by the first content ratio, and the second layer 148 containing the filler of an inorganic material by the second content ratio smaller than the first content ratio, which are laid the latter on the former (see FIG. 40B).

Next, the semiconductor substrate 10 is fixed to the chuck table 38 of the superprecision lathe 36 (see FIG. 28A) by vacuum absorption.

Figure 41A:
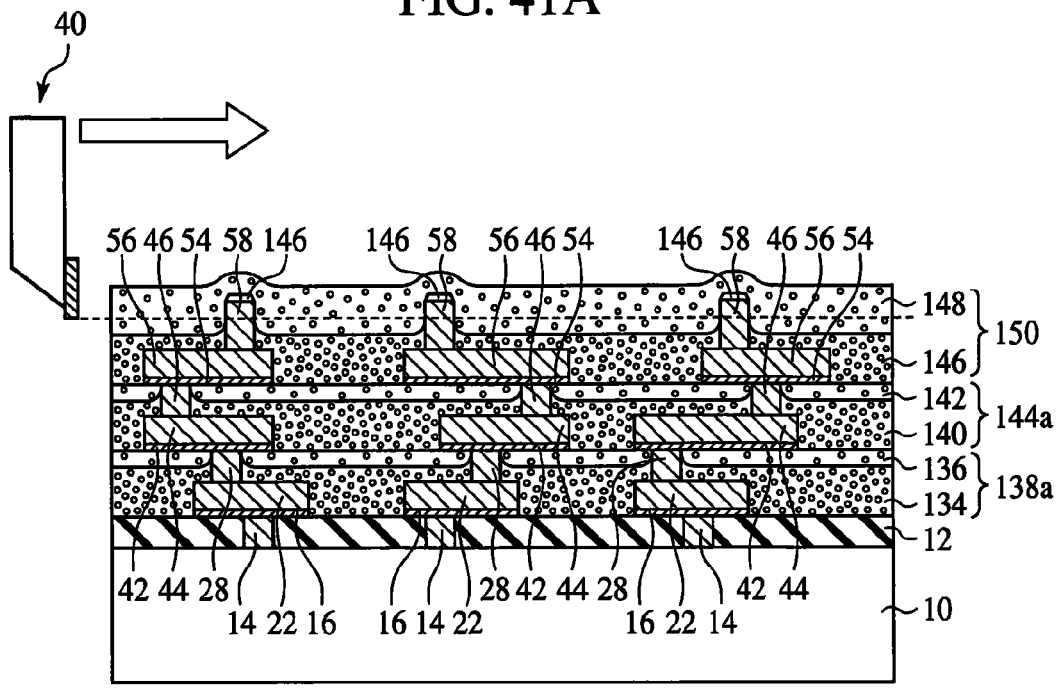
FIGS. 41A and 41B are sectional views of the semiconductor device in the steps of the resin layer formation method and semiconductor device fabrication method according to the fourth embodiment of the present invention (Part 5).

Then, with the semiconductor substrate 10 set on rotation, the surface of the resin layer 150 and upper parts of the conductor plugs 58 are cut with the cutting tool 40 of diamond until the thickness of the resin layer 150 becomes, e.g., about 13 μm (see FIG. 41A).

The conditions for cutting the surface of the resin layer 150 are the same as those for cutting, e.g., the surface of the resin layer 138.

In the present embodiment, although the second layer 148 containing the filler of an inorganic material is cut with the cutting tool 40, the content ratio of the filler of the second layer 148 is set relatively small, whereby the extreme abrasion, etc. of the cutting tool 40 by the filler is prevented.

Figure 41B:
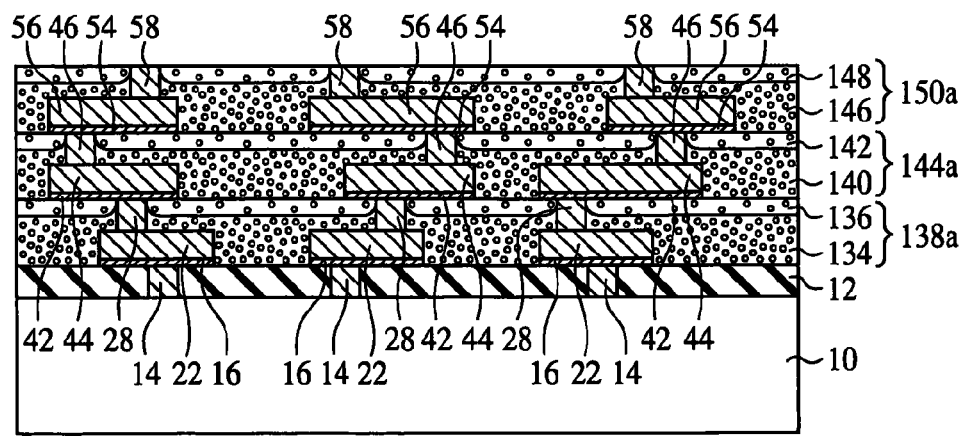

Thus, the surface of the resin layer 150a is planarized as illustrated in FIG. 41B. In this specification, the resin layer after cut is called the resin layer 150a to be discriminated from the resin layer 150 before cut.

Figure 42A:
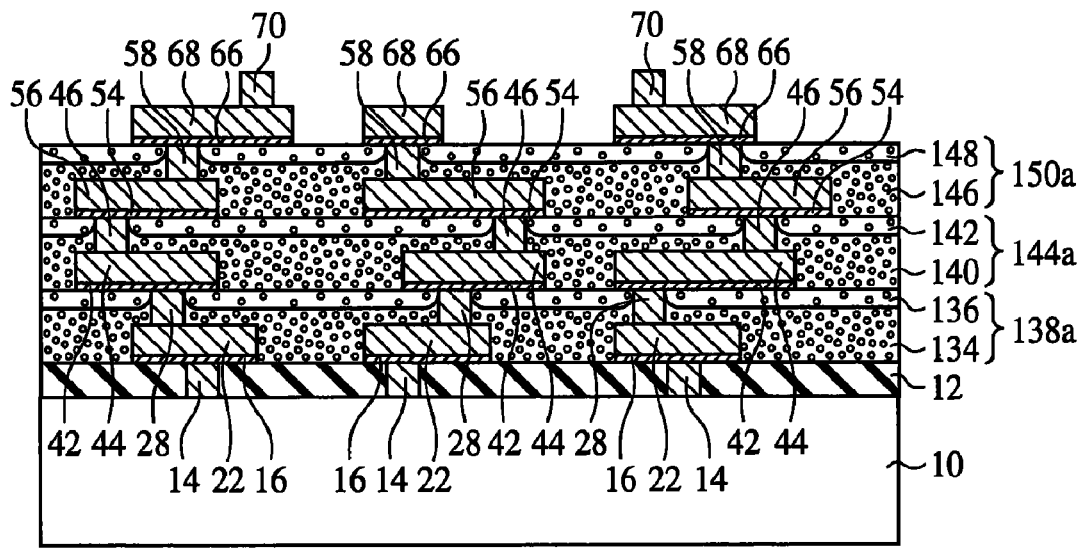
FIGS. 42A and 42B are sectional views of the semiconductor device in the steps of the resin layer formation method and semiconductor device fabrication method according to the fourth embodiment of the present invention (Part 6).

Next, in the same way as in the semiconductor device fabrication method according to the first embodiment described above with reference to FIG. 12A, the interconnections 68 and the conductor plugs 70 are formed (see FIG. 42A).

Then, on the entire surface, the first layer 152 is formed by, e.g., spin coating. The material of the first layer 152 is an epoxy resin solution containing the filler of, e.g., an inorganic material. The filler contained in the epoxy resin solution is, e.g., silica. The average particle diameter of the filler is, e.g., about 1 μm. The content ratio of the filler of the first layer 152 is, e.g., about 60 wt %.

Then, thermal processing is made to semi-cure the first layer 152. The thermal processing conditions are, e.g., 80-150° C. and 30 minutes to 1 hour. The thickness of the first layer 152 after the thermal processing is, e.g., about 10 μm. Thus the first layer 152 containing the filler by the content ratio of, e.g., 60 wt % is formed. The difference in the thermal expansion coefficient between the semiconductor substrate 10 and the first layer 152, which contains the filler of a relatively small thermal expansion coefficient, is relatively small. Thus, according to the present embodiment, the stresses, etc. exerted on the semiconductor substrate 10, etc. due to the difference in the thermal expansion coefficient between the semiconductor substrate 10 and the first layer 152 can be made relatively small.

Then, the second layer 154 is formed on the entire surface by, e.g., spin coating. The material of the second layer 154 is an epoxy resin solution containing the filler of, e.g., an inorganic material. The filler contained in the epoxy resin solution is, e.g., silica. The average particle diameter of the filler is, e.g., about 1 μm.

Then, thermal processing is made to semi-cure the second layer 154. The thermal processing conditions are, e.g., 80-150° C. and 30 minutes to 1 hour. The thickness of the second layer 154 after the thermal processing is, e.g., about 10 μm. Thus, the second layer 154 containing the filler by the content ratio of, e.g., 15 wt % is formed. Because not only the first layer 152, but also the second layer 154 contains the filler of a relatively small thermal expansion coefficient, the difference in the thermal expansion coefficient between the semiconductor substrate 10 and the resin layer 156 is smaller. Thus, according to the present embodiment, the stresses exerted to the semiconductor substrate 10, etc. due to the difference in the thermal expansion coefficient between the semiconductor substrate 10 and the resin layer 156 can be made smaller.

Figure 42B:
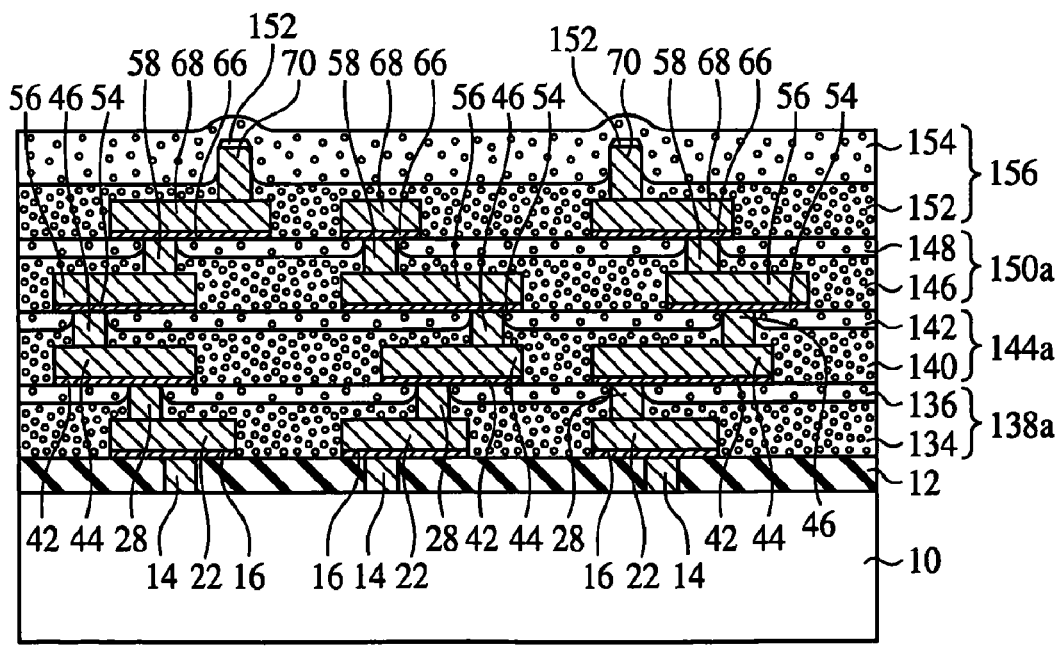

Thus, the resin layer 156 is formed of the first layer 152 containing the filler of an inorganic material by the first content ratio, and the second layer 154 containing the filler of an inorganic material by the second content ratio smaller than the first content ratio, which are laid the latter on the former (see FIG. 42B).

Next, the semiconductor substrate 10 is fixed to the chuck table 38 of the superprecision lathe 36 (see FIG. 28A) by vacuum absorption.

Figure 43A:
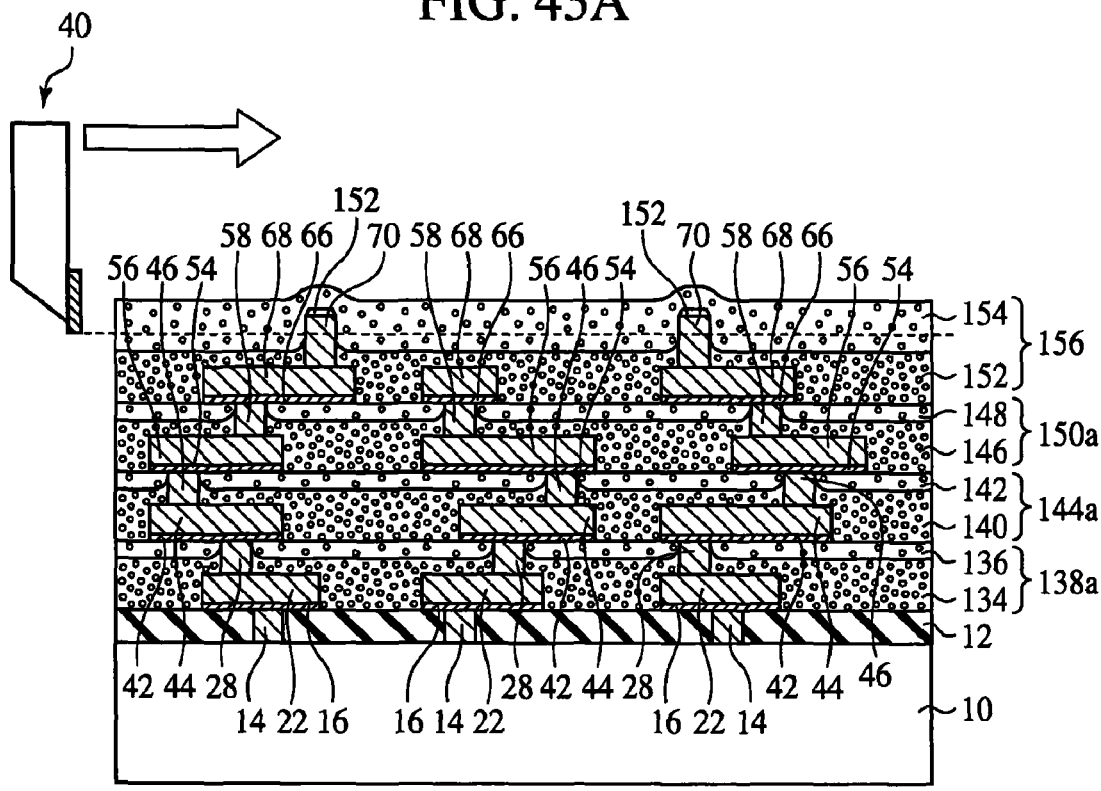
FIGS. 43A and 43B are sectional views of the semiconductor device in the steps of the resin layer formation method and semiconductor device fabrication method according to the fourth embodiment of the present invention (Part 7).

Then, with the semiconductor substrate 10 set on rotation, the surface of the resin layer 156 and upper parts of the conductor plugs 70 are cut with the cutting tool 40 of diamond until the thickness of the resin layer 156 becomes, e.g., about 13 μm (see FIG. 43A).

The conditions for cutting the surface of the resin layer 156 are the same as those for cutting, e.g., the surface of the resin layer 138.

In the present embodiment, although the second layer 154 containing the filler of an inorganic material is cut with the cutting tool 40, the content ratio of the filler of the second layer 154 is set relatively small, whereby the extreme abrasion, etc. of the cutting tool 40 by the filler is prevented.

Figure 43B:
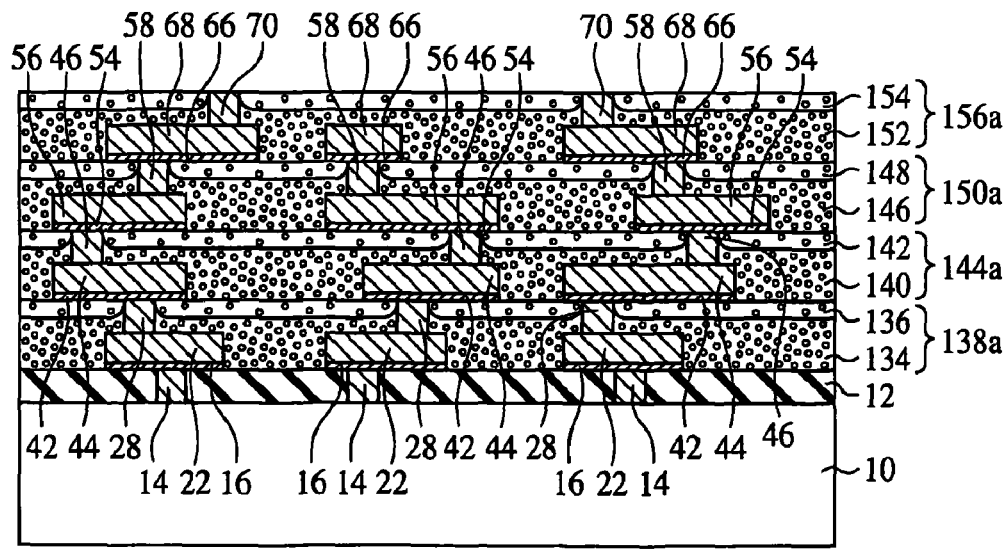

Thus, the surface of the resin layer 156*a* is planarized as illustrated in FIG. 43B. In this specification, the resin layer after cut is called the resin layer 156*a* to be discriminated from the resin layer 156 before cut.

Figure 44:
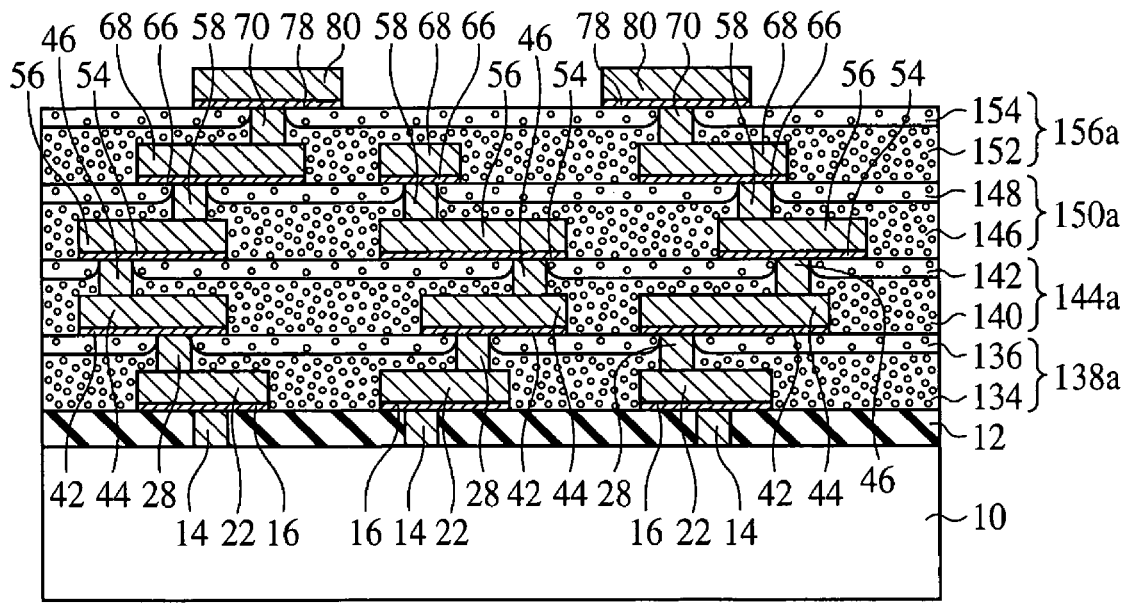
FIG. 44 is sectional views of the semiconductor device in the steps of the resin layer formation method and semiconductor device fabrication method according to the fourth embodiment of the present invention (Part 8).

Next, in the same way as in the semiconductor device fabrication method according to the first embodiment described above with reference to FIG. 14B, the electrodes 80 are formed (see FIG. 44).

Thus, the semiconductor device is fabricated by the resin layer formation method according to the present embodiment.

As in the present embodiment, the first layers 134, 140, 146, 152 and the second layers 126, 142, 148, 154 forming the resin layers 138*a*, 144*a*, 150*a*, 156*a* may be formed by spin coating.

Modified Embodiments

The present invention is not limited to the above-described embodiments and can cover other various modifications.

For example, in the above-described embodiments, the cutting tool 40 is advanced straight in one direction to cut while the semiconductor substrate 10 is being rotated. It is also possible to the wheel (not illustrated) with the cutting tool 40 mounted on is rotated to cut while the semiconductor substrate 10 is being advanced straight in one direction (not illustrated).

In the above-described embodiments, the base of the first layers 30, 48, 60, 72, 82, 88, 94, 100, 110, 116, 122, 128, 134, 140, 146, 152 is epoxy resin. However, the base of the first layer is not limited to epoxy resin and can be, e.g., polyimide resin, cyanate resin, bismaleimide-triazine resin, polyphenylene ether resin, phenol resin or others. The thermal expansion coefficient of polyimide resin is about 45-55 ppm/° C., the thermal expansion coefficient of polyphenylene ether resin is about 38-77 ppm/° C., and the thermal expansion coefficient of phenol resin is about 68 ppm/° C.

In the above-described embodiments, the base of the second layers 32, 50, 62, 74, 84, 90, 96, 102 is epoxy resin but is not limited to epoxy resin. The base of the second layers 32, 50, 62, 74, 84, 90, 96, 102 can be, e.g., polyimide resin, cyanate resin, bismaleimide-triazine resin, polyphenylene ether resin, phenol resin or others.

In the above-described embodiment, the second layer 112, 118, 124, 130, 136, 142, 148, 154 is epoxy resin but is not limited to epoxy resin. The base of the second layer can be, e.g., polyimide resin, cyanate resin, bismaleimide-triazine resin, polyphenylene ether resin, phenol resin or others.

In the above-described embodiments, the filler is silica but is not limited to silica. The filler can be an inorganic material other than silica, e.g., calcium carbonate, aluminum hydroxide, aluminum oxide, talc, magnesium hydroxide, zinc oxide, titanium oxide, calcium silicate or others.

In the above-described embodiments, the resin layers are cut with the cutting tool 40 of diamond. However, the material of the cutting tool 40 is not essentially diamond. The resin layers may be cut with the cutting tool of, e.g., tungsten carbide, cubic-boron nitride or others.

In the above-described embodiments, the resin layers as the inter-layer insulation films of the multi-layer interconnection structure are planarized. However, the principle of the present invention is not applicable essentially to the inter-layer insulation films of the multi-layer interconnection structure and is applicable to planarizing any other resin layer.

In the above-described embodiments, the semiconductor device is fabricated, but the principle of the present invention is not applicable essentially to fabricating the semiconductor device and is applicable to fabricating any other electronic device.

What is claimed is:

1. A resin layer formation method comprising:
    forming, over a substrate with a first electrode formed thereon, a first resin layer including a first substance for decreasing a thermal expansion coefficient so as to bury the first electrode, the first resin layer having the first substance localized in the side thereof nearer to the substrate, the first resin layer including a first layer and a second layer formed on the first layer, a content ratio of the first substance in the second layer being lower than that of the first layer;
    cutting both of the second layer and an upper part of the first electrode with a cutting edge of a cutting tool to planarize a surface of the first resin layer;
    forming an interconnection over the first resin layer;
    forming a second electrode over the interconnection;
    forming, over the first resin layer with the interconnection and the second electrode formed thereon, a second resin layer including a second substance for decreasing a thermal expansion coefficient so as to bury the interconnection and the second electrode, the second resin layer having the second substance localized in the side thereof nearer to the substrate, the second resin layer including a third layer and a fourth layer formed on the third layer, a content ratio of the second substance in the fourth layer being lower than that of the third layer;
    cutting both of the fourth layer and an upper part of the second electrode with a cutting edge of a cutting tool to planarize a surface of the second resin layer.

2. The resin layer formation method according to claim 1, wherein
    said substance is not present in the surface of the first resin layer.

3. The resin layer formation method according to claim 1, wherein
    forming the first resin layer includes adhering a resin film having said substance localized in the side thereof nearer to the substrate.

4. The resin layer formation method according to claim 1, wherein
    the first resin layer is formed by spin coating.

5. The resin layer formation method according to claim 1, wherein
    said substance is an inorganic material.

6. The resin layer formation method according to claim 5, wherein
    said substance is silicon oxide, calcium carbonate, aluminum hydroxide, aluminum oxide, talc, magnesium hydroxide, zinc oxide, titanium oxide or calcium silicate.

7. The resin layer formation method according to claim 1, wherein
a base of the first resin layer is epoxy resin, polyimide resin, cyanate resin, bismaleimide-triazine resin, polyphenylene ether resin or phenol resin.

8. A semiconductor device fabrication method comprising:
forming a first electrode over a substrate;
forming, over the substrate, a first resin layer including a first substance for decreasing a thermal expansion coefficient so as to bury the first electrode, the first resin layer having the first substance localized in the side thereof nearer to the substrate, the first resin layer including a first layer and a second layer formed on the first layer, a content ratio of the first substance in the second layer being lower than that of the first layer;
cutting both of the second layer and an upper part of the first electrode with a cutting edge of a cutting tool to planarize a surface of the first resin layer;
forming an interconnection over the first resin layer;
forming a second electrode over the interconnection;
forming, over the first resin layer with the interconnection and the second electrode formed thereon, a second resin layer including a second substance for decreasing a thermal expansion coefficient so as to bury the interconnection and the second electrode, the second resin layer having the second substance localized in the side thereof nearer to the substrate, the second resin layer including a third layer and a fourth layer formed on the third layer, a content ratio of the second substance in the fourth layer being lower than that of the third layer;
cutting both of the fourth layer and an upper part of the second electrode with a cutting edge of a cutting tool to planarize a surface of the second resin layer.

9. The semiconductor device fabrication method according to claim 8, wherein
the surface of the first resin layer does not include the substance.

10. The semiconductor device fabrication method according to claim 8, wherein
forming the first resin layer includes adhering a resin film having said substance localized in the side thereof nearer to the substrate to the substrate.

11. The semiconductor device fabrication method according to claim 8, wherein
the first resin layer is formed by spin coating.

12. The semiconductor device fabrication method according to claim 8, wherein
said substance is an inorganic material.

13. The resin layer formation method according to claim 1, wherein
the cutting tool is formed of diamond.

14. The semiconductor device fabrication method according to claim 8, wherein
the cutting tool is formed of diamond.

15. The resin layer formation method according to claim 1, wherein
a cut surface of the first resin layer by the cutting edge of the cutting tool is substantially parallel with a main surface of the substrate.

16. The semiconductor device fabrication method according to claim 8, wherein
a cut surface of the first resin layer by the cutting edge of the cutting tool is substantially parallel with a main surface of the substrate.

* * * * *